(12) United States Patent
Kanamori et al.

(10) Patent No.: US 11,563,028 B2
(45) Date of Patent: Jan. 24, 2023

(54) NONVOLATILE MEMORY DEVICE AND METHOD FOR FABRICATING THE SAME

(71) Applicant: SAMSUNG ELECTRONICS CO., LTD., Suwon-si (KR)

(72) Inventors: Kohji Kanamori, Seongnam-si (KR); Seo-Goo Kang, Seoul (KR); Hyo Joon Ryu, Hwaseong-si (KR); Sang Youn Jo, Suwon-si (KR); Jee Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 17/034,733

(22) Filed: Sep. 28, 2020

(65) Prior Publication Data
US 2021/0296358 A1 Sep. 23, 2021

(30) Foreign Application Priority Data
Mar. 19, 2020 (KR) .................. 10-2020-0033824

(51) Int. Cl.
| | |
|---|---|
| *H01L 27/11582* | (2017.01) |
| *H01L 25/18* | (2006.01) |
| *H01L 23/535* | (2006.01) |
| *H01L 25/065* | (2006.01) |

(Continued)

(52) U.S. Cl.
CPC ...... *H01L 27/11582* (2013.01); *H01L 23/535* (2013.01); *H01L 23/53223* (2013.01); *H01L 23/53261* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | | |
|---|---|---|---|---|
| 8,008,722 | B2 * | 8/2011 | Kim .................. | H01L 27/11551 438/596 |
| 8,309,405 | B2 * | 11/2012 | Yang .................. | H01L 27/11582 438/156 |
| 9,576,971 | B2 * | 2/2017 | Zhang ............... | H01L 27/11556 |

(Continued)

FOREIGN PATENT DOCUMENTS

| | | |
|---|---|---|
| CN | 107731839 | 2/2018 |
| CN | 109496355 | 3/2019 |

(Continued)

*Primary Examiner* — Telly D Green
(74) *Attorney, Agent, or Firm* — F. Chau & Associates, LLC

(57) ABSTRACT

Provided is a nonvolatile memory device. The nonvolatile memory device includes a conductive plate, a barrier conductive film extending along a surface of the conductive plate, a mold structure including a plurality of gate electrodes sequentially stacked on the barrier conductive film, a channel hole penetrating the mold structure to expose the barrier conductive film, an impurity pattern being in contact with the barrier conductive film, and formed in the channel hole, and a semiconductor pattern formed in the channel hole, extending from the impurity pattern along a side surface of the channel hole, and intersecting the plurality of gate electrodes.

26 Claims, 41 Drawing Sheets

(51) Int. Cl.
*H01L 23/00* (2006.01)
*H01L 23/532* (2006.01)

(56) References Cited

U.S. PATENT DOCUMENTS

| | | | |
|---|---|---|---|
| 10,147,732 B1 | 12/2018 | Hu et al. | |
| 10,403,634 B2 | 9/2019 | Hwang et al. | |
| 2010/0155810 A1* | 6/2010 | Kim .................... | H01L 29/792 |
| | | | 257/316 |
| 2010/0210075 A1* | 8/2010 | Hold ................. | H01L 27/10882 |
| | | | 257/E21.602 |
| 2012/0083077 A1* | 4/2012 | Yang ................ | H01L 27/11582 |
| | | | 438/479 |
| 2016/0163729 A1* | 6/2016 | Zhang .............. | H01L 27/11582 |
| | | | 257/324 |
| 2019/0295956 A1* | 9/2019 | Kawai .................. | H01L 23/528 |
| 2019/0296041 A1 | 9/2019 | Yamasaka et al. | |
| 2020/0388633 A1* | 12/2020 | Jung ................ | H01L 29/40117 |

FOREIGN PATENT DOCUMENTS

| | | |
|---|---|---|
| CN | 110310958 | 10/2019 |
| KR | 10-1040154 | 6/2011 |

\* cited by examiner

NONVOLATILE MEMORY DEVICE AND METHOD FOR FABRICATING THE SAME

CROSS-REFERENCE TO RELATED APPLICATIONS

This application claims priority under 35 U.S.C. § 119 to Korean Patent Application No. 10-2020-0033824, filed on Mar. 19, 2020, in the Korean Intellectual Property Office, the contents of which are herein incorporated by reference in their entirety.

TECHNICAL FIELD

The present invention relates to a nonvolatile memory device and a method for fabricating the same, and more specifically, relates to a nonvolatile memory device including an impurity region and a method for fabricating the same.

DISCUSSION OF RELATED ART

A semiconductor memory device may be broadly classified into a volatile memory device and a nonvolatile memory device. The nonvolatile memory device retains stored data when power is turned off, and is typically used for long-term, secondary storage.

Currently, various nonvolatile memory devices such as, NAND or NOR based flash memory devices have been widely used. Meanwhile, a degree of integration of the nonvolatile memory device has increased to satisfy high performance and low cost desired by consumers. Incidentally, in the case of a two-dimensional or planar memory device, the degree of integration is determined by an area occupied by unit memory cells, and may have reached its limit. Therefore, recently, a three-dimensional memory device in which the unit memory cells are vertically placed has been developed.

SUMMARY

Exemplary embodiments of the present invention provide a nonvolatile memory device having enhanced product reliability and performance.

The exemplary embodiments of the present invention also provide a method for fabricating a nonvolatile memory device capable of fabricating a nonvolatile memory device having enhanced product reliability and performance.

According to an exemplary embodiment of the present invention, there is provided a nonvolatile memory device including a conductive plate, a barrier conductive film extending along a surface of the conductive plate, a mold structure including a plurality of gate electrodes sequentially stacked on the barrier conductive film, a channel hole penetrating the mold structure to expose the barrier conductive film, an impurity pattern being in contact with the barrier conductive film, and formed in the channel hole, and a semiconductor pattern formed in the channel hole, extending from the impurity pattern along a side surface of the channel hole, and intersecting the plurality of gate electrodes.

According to an exemplary embodiment of the present invention, there is provided a nonvolatile memory device including a mold structure including a first surface and a second surface opposite to each other, the mold structure including a plurality of mold insulation films and a plurality of gate electrodes alternately stacked from the first surface toward the second surface, a first conductive plate extending along the first surface of the mold structure, and formed on the first surface of the mold structure, a first barrier conductive film extending along the first surface of the mold structure, and interposed between the mold structure and the first conductive plate, a channel hole extending from the second surface toward the first surface and penetrating the mold structure, a first impurity pattern being in contact with the first barrier conductive film, and formed in the channel hole, a semiconductor pattern extending from the first impurity pattern toward the second surface of the mold structure, and formed in the channel hole, and a bit line connected to the semiconductor pattern, and formed on the second surface of the mold structure.

According to an exemplary embodiment of the present invention, there is provided a nonvolatile memory device including a mold structure including a first surface and a second surface opposite to each other, the mold structure including a plurality of gate electrodes stacked sequentially from the first surface toward the second surface, a source structure extending along the first surface of the mold structure, and formed on the first surface of the mold structure, a channel hole extending from the second surface toward the first surface and penetrating the mold structure, an impurity pattern connected to the source structure, and formed in the channel hole, a semiconductor pattern extending from the impurity pattern toward the second surface of the mold structure, and formed in the channel hole, a bit line connected to the semiconductor pattern, and formed on the second surface of the mold structure, a first inter-wiring insulation film which covers the bit line, and is formed on the second surface of the mold structure, a substrate facing the second surface of the mold structure, a peripheral circuit elements formed on the substrate, and a second inter-wiring insulation film which covers the peripheral circuit element, and is interposed between the substrate and the first inter-wiring insulation film.

According to an exemplary embodiment of the present invention, there is provided a method for fabricating a nonvolatile memory device, the method including providing a first substrate, forming a mold structure which includes a first surface facing the first substrate and a second surface opposite to the first surface, the mold structure including a plurality of mold insulation films and a plurality of sacrificial films alternately stacked from the first surface toward the second surface, forming a channel hole which penetrates the mold structure and is recessed into a part of the first substrate, forming an information storage film extending along a profile of the channel hole, in the channel hole, forming an impurity pattern which fills a part of the channel hole, on the information storage film, forming a semiconductor pattern extending along a side surface of the information storage film, on the impurity pattern, removing at least a part of the first substrate to expose the impurity pattern and forming a source structure being in contact with the exposed impurity pattern, on the first surface of the mold structure.

BRIEF DESCRIPTION OF THE DRAWINGS

The above and other aspects and features of the present invention will become more apparent by describing in detail exemplary embodiments thereof with reference to the accompanying drawings, in which.

Figure 1:
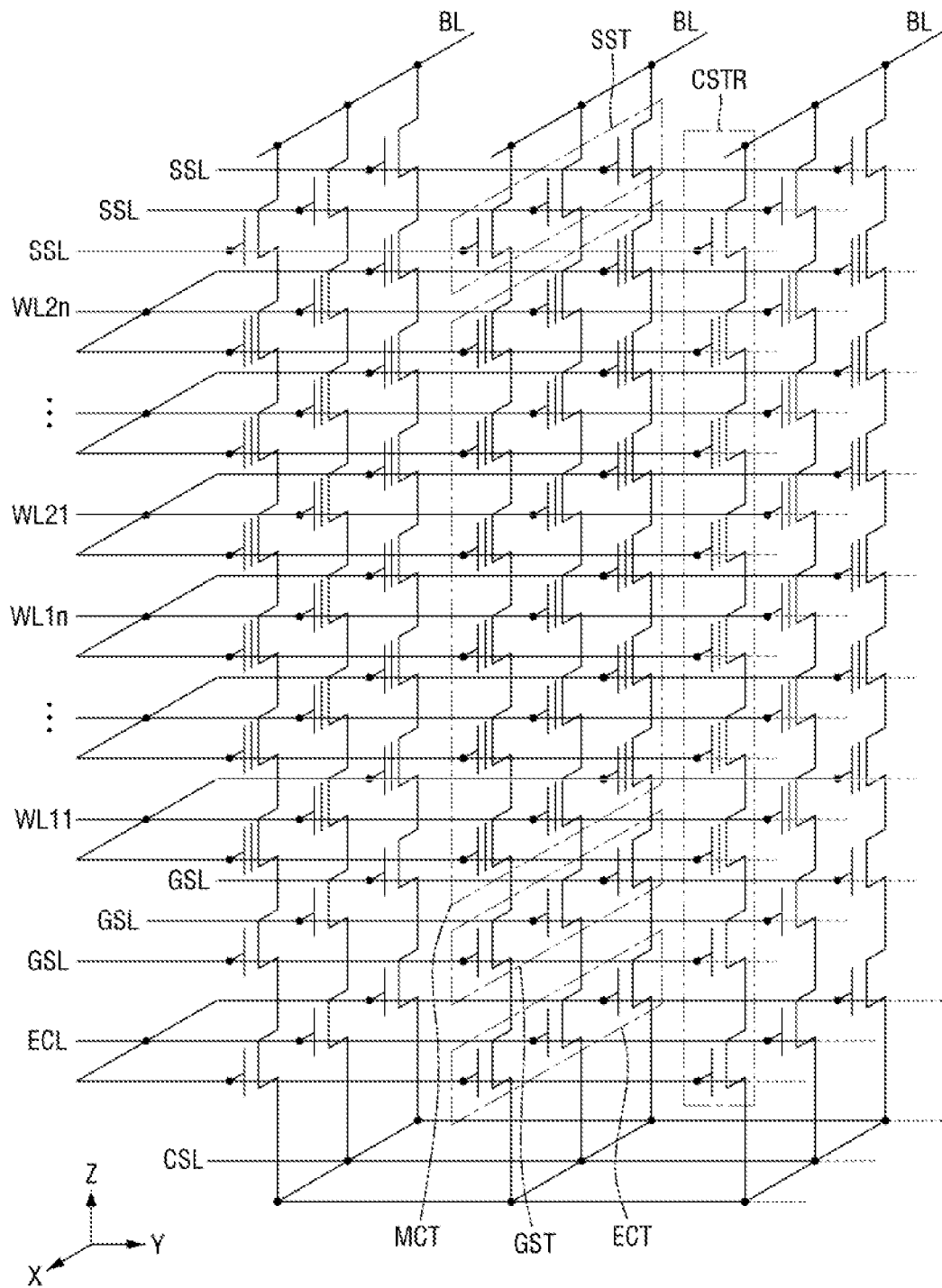
FIG. 1 is an exemplary circuit diagram for explaining a nonvolatile memory device according to an exemplary embodiment of the present invention.

Since the drawings in FIGS. 1-31 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a nonvolatile memory device according to exemplary embodiments of the present invention will be described with reference to FIGS. 1 to 14.

FIG. 1 is an exemplary circuit diagram for explaining a nonvolatile memory device according to an exemplary embodiment of the present invention. For example, in an exemplary embodiment of the present invention, FIG. 1 may illustrate an equivalent circuit diagram of a NAND flash memory device having a vertical structure.

A memory cell array of the nonvolatile memory device according to an exemplary embodiment of the present invention may include a common source line CSL, a plurality of bit lines BL, and a plurality of cell strings CSTR.

The plurality of bit lines BL may be arranged two-dimensionally. For example, the bit lines BL may be spaced apart from each other in a second direction Y and may extend in a first direction X. The plurality of cell strings CSTR may be connected in parallel to each bit line BL. Each of the plurality of cell strings CSTR may have a vertical structure extending in a third direction Z perpendicular to a plane (X-Y plane). The cell strings CSTR may be commonly connected to the common source line CSL. That is, the plurality of cell strings CSTR may be placed between the bit lines BL and the common source line CSL.

The common source line CSL may extend in the second direction Y intersecting the first direction X. In an exemplary embodiment of the present invention, a plurality of common source lines CSL may be arranged two-dimensionally. For example, the plurality of common source lines CSL may be spaced apart from each other in the first direction X and extend in the second direction Y. The same voltage may be electrically applied to the common source lines CSL or different voltages are applied to the common source lines CSL and each of the common source lines CSL may be controlled separately.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the memory cell transistor MCT, and the string selection transistor may be connected in series in the vertical direction (Z direction).

The common source line CSL may be commonly connected to the sources of the ground selection transistors GST. In addition, the ground selection line GSL, a plurality of word lines WL11 to WL1$n$ and WL21 to WL2$n$, and the string selection line SSL may be placed between the common source line CSL and the bit line BL. The ground selection line GSL may be used as a gate electrode of the ground selection transistor GST, the word lines WL11 to WL1$n$ and WL21 to WL2$n$ may be used as gate electrodes of the memory cell transistors MCT, the string selection line SSL may be used as a gate electrode of the string selection transistor SST. For example, in each of the cell string CSTR, the string selection transistor SST may be arranged between the bit line BL and the memory cell transistor MCT, and may control data transmission between the bit line BL and the memory cell transistor MCT by using the string selection line SSL as the gate of the string selection transistor SST. Also, in each of the cell string CSTR, the ground selection transistor GST may be arranged between the common source line CSL and the memory cell transistor MCT, and may control data transmission between the common source line CSL and the memory cell transistor MCT by using the ground selection line GSL as the gate of the ground selection transistor GST.

In an exemplary embodiment of the present invention, an erasing control transistor ECT may be placed between the common source line CSL and the ground selection transistor GST. The common source line CSL may be commonly connected to the sources of the erasing control transistors ECT. Further, an erasing control line ECL may be placed between the common source line CSL and the ground selection line GSL. The erasing control line ECL may be used as the gate electrode of the erasing control transistor ECT. The erasing control transistors ECT may generate a gate induced drain leak (GIDL) to perform an erasing operation of the memory cell array.

Figure 2:
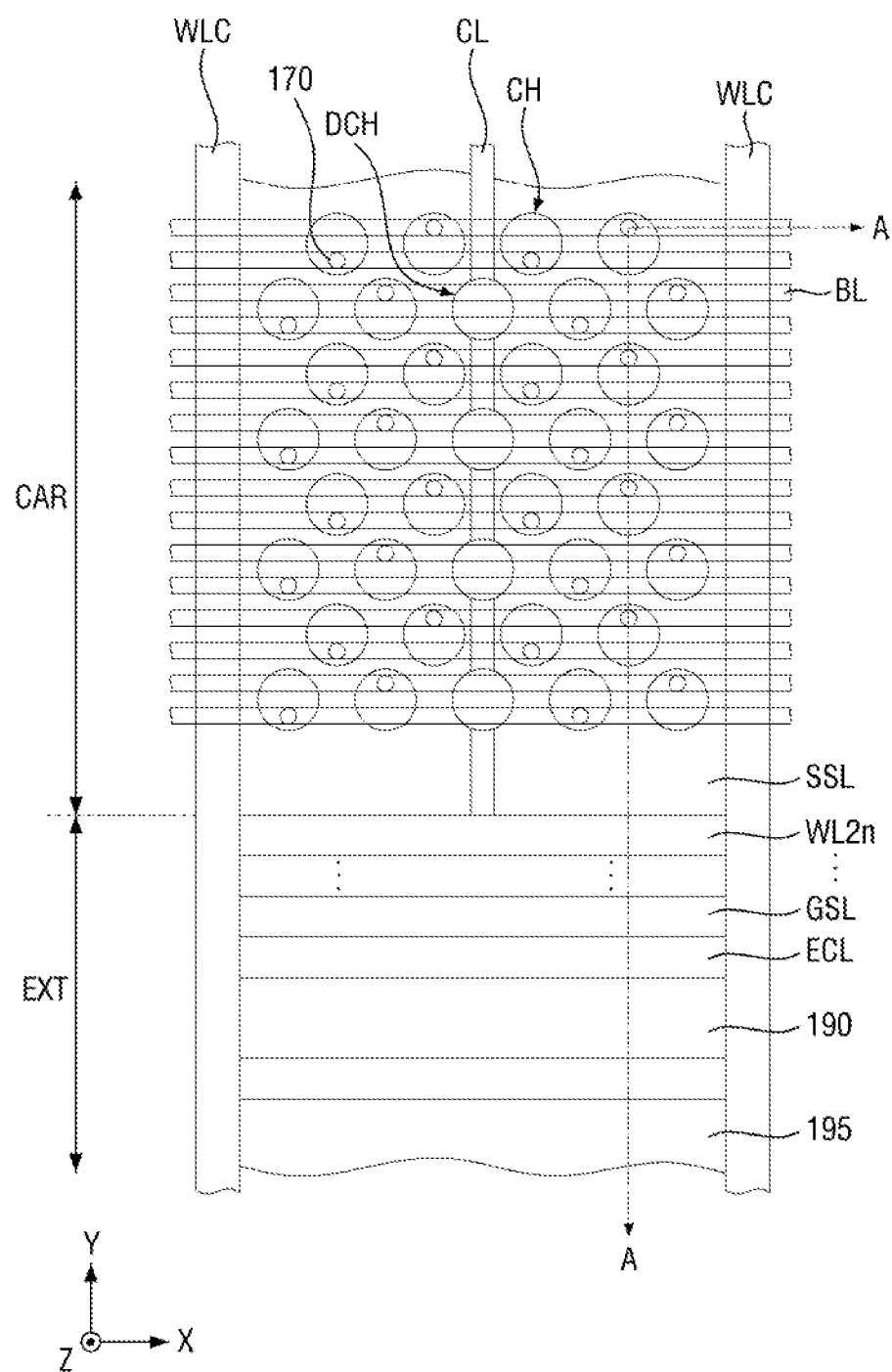
FIG. 2 is a layout diagram for explaining a nonvolatile memory device according to an exemplary embodiment of the present invention.
Figure 3:
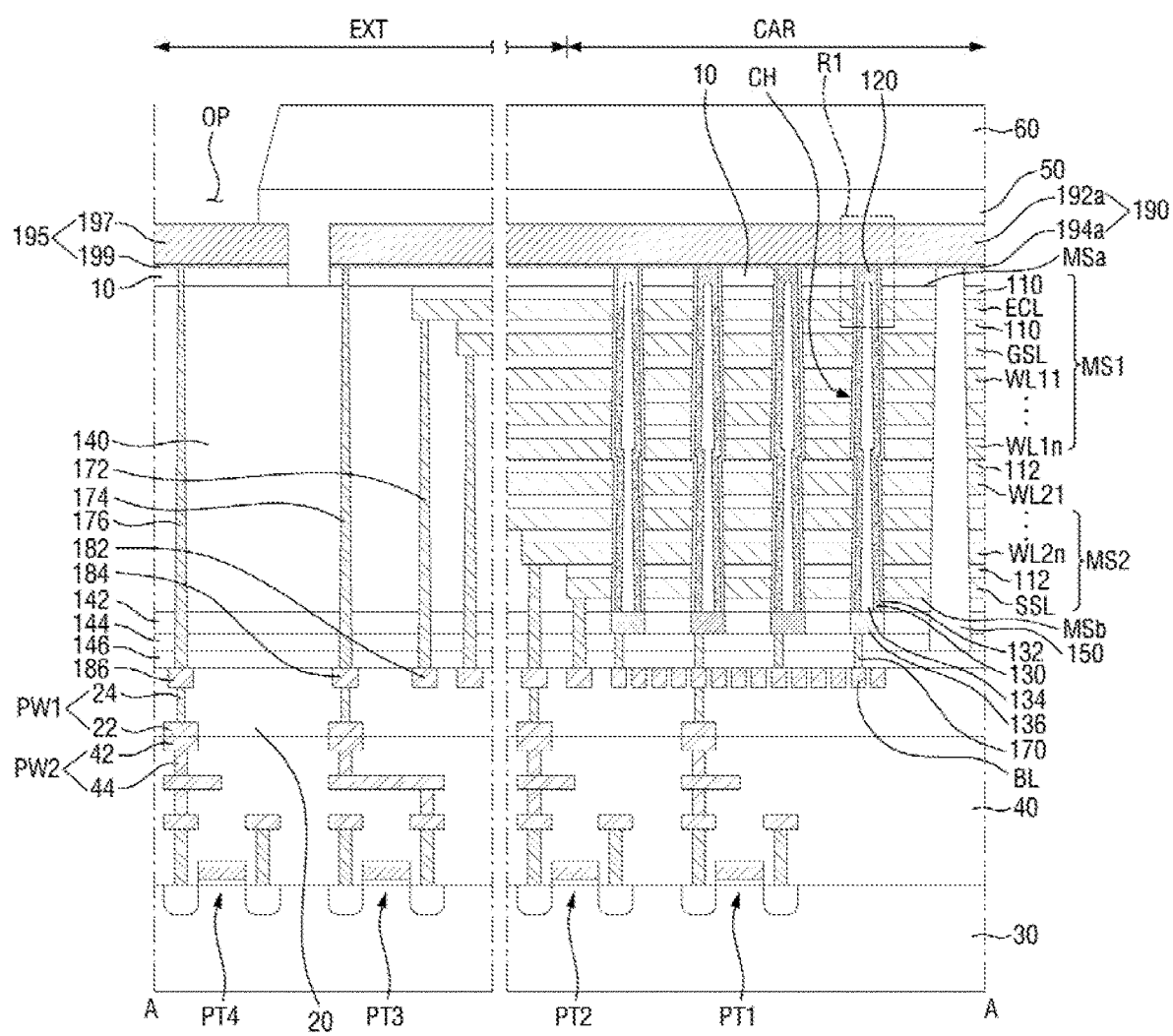
FIG. 3 is a cross-sectional view taken along line A-A of FIG. 2.
Figure 4A:
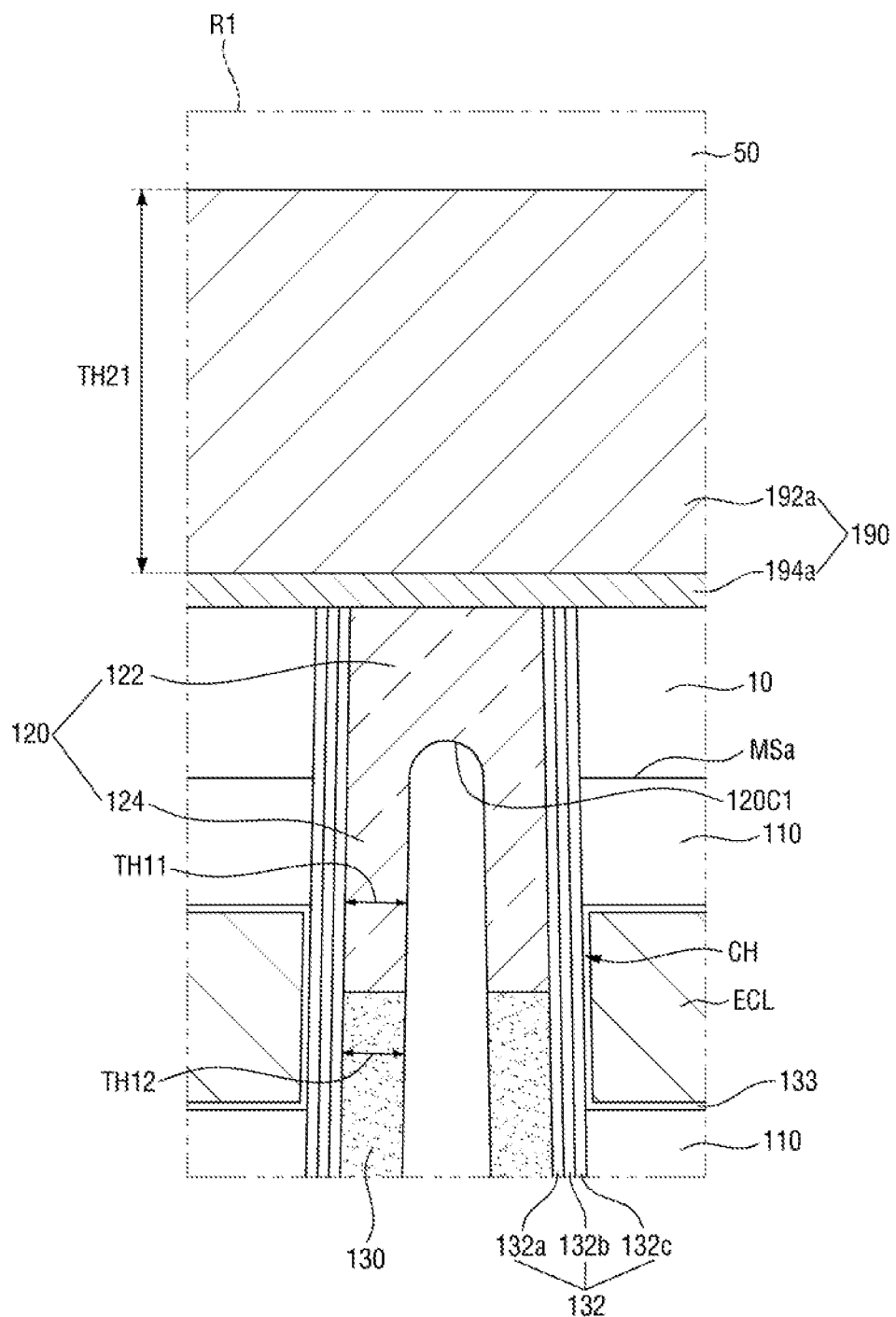
FIGS. 4A to 4E are various enlarged views of part R1 of FIG. 3.

FIG. 2 is a layout diagram for explaining a nonvolatile memory device according to an exemplary embodiment of the present invention. FIG. 3 is a cross-sectional view taken along line A-A of FIG. 2. FIGS. 4A to 4E are various enlarged views of part R1 of FIG. 3. FIGS. 5A and 5B are various partial perspective views for explaining a first semiconductor pattern and a first impurity region of FIG. 3.

Referring to FIGS. 2 to 5B, a nonvolatile memory device according to an exemplary embodiment of the present invention includes a first substrate 10, mold structures MS1 and MS2, a first source structure 190, a plurality of channel holes CH, a first impurity pattern 120, a first semiconductor pattern 130, a plurality of bit lines BL, a first wiring structure PW1, a second substrate 30, and a second wiring structure PW2.

The first substrate 10 may include, for example, a semiconductor substrate such as a silicon (Si) substrate, a germanium (Ge) substrate or a silicon-germanium (SiGe) substrate. Alternatively, the first substrate 10 may include a silicon-on-insulator (SOI) substrate, a germanium-on-insulator (GOI) substrate, or the like. The first substrate 10 may have a main surface extending in both the first direction X and the second direction Y (X-Y plane).

In an exemplary embodiment of the present invention, the first substrate 10 may include impurities. For example, the first substrate 10 may include n-type impurities (e.g., phosphorus (P), arsenic (As), etc.).

The first substrate 10 may include a cell array region CAR and an extension region EXT.

The cell array region CAR and the extension region EXT may be cut by the word line cutting region WLC to form a plurality of memory cell blocks. For example, as shown in FIG. 2, the word line cutting region WLC may extend in the second direction Y to cut the cell array region CAR and the extension region EXT. Each of the plurality of memory cell blocks may be formed between two adjacent word line cutting regions WLC.

A memory cell array including a plurality of memory cells may be formed in the cell array region CAR. The memory cell array may be formed with a plurality of memory cells, a plurality of channel holes CH electrically connected to the memory cells, a plurality of word lines WL11 to WL1$n$ and WL21 to WL2$n$, a plurality of bit lines BL and the like.

The extension region EXT may be placed around the cell array region CAR. A plurality of gate electrodes ECL, GSL, WL11 to WL1$n$, WL21 to WL2$n$ and SSL, which will be described later, may be stacked in the extension region EXT in a stepwise form. In an exemplary embodiment of the present invention, the stepwise form of the plurality of gate electrodes ECL, GSL, WL11 to WL1$n$, WL21 to WL2$n$ and SSL to be described may be arranged in an upside-down configuration. For example, the steps included in the plurality of gate electrodes ECL, GSL, WL11 to WL1$n$, WL21 to WL2$n$ and SSL to be described may have lengths extending in the second direction Y, and the lengths may gradually increase from a lowermost one toward an uppermost one thereof. However, the present invention is not limited thereto. For example, in an exemplary embodiment of the present invention, the steps included in the plurality of gate electrodes ECL, GSL, WL11 to WL1$n$, WL21 to WL2$n$ and SSL to be described may have lengths extending in the second direction Y, and the lengths may gradually decrease from the lowermost one toward the uppermost one thereof.

The mold structures MS1 and MS2 may be formed on the first substrate 10. The mold structures MS1 and MS2 may include a first surface MSa and a second surface MSb opposite to each other. For example, the first substrate 10 may be formed on the first surface MSa of the mold structures MS1 and MS2. The mold structures MS1 and MS2 may include a plurality of gate electrodes ECL, GSL, WL11 to WL1$n$, WL21 to WL2$n$ and SSL that are sequentially stacked from the first surface MSa toward the second surface MSb. In an exemplary embodiment of the present invention, the mold structures MS1 and MS2 may include a first mold structure MS1 and a second mold structure MS2 stacked on the first substrate 10. Although two mold structures are shown as an example, the present invention is not limited thereto. For example, in an exemplary embodiment of the present invention, three or mold structures may be stacked on the first substrate 10.

The first mold structure MS1 may be formed on the first substrate 10, and may include a plurality of first mold insulation films 110 and a plurality of first gate electrodes ECL, GSL and WL11 to WL1$n$ alternately stacked on the first substrate 10. For example, each of the first gate electrodes ECL, GSL and WL11 to WL1$n$ and each of the first mold insulation films 110 may be a layered structure extending in a first direction X and a second direction Y parallel to the upper surface of the first substrate 10. In addition, the first gate electrodes ECL, GSL and WL11 to WL1$n$ and the first mold insulation films 110 may be stacked alternately along a third direction Z intersecting (e.g., perpendicular to) the upper surface of the first substrate 10.

In an exemplary embodiment of the present invention, the first gate electrodes ECL, GSL and WL11 to WL1$n$ may include an erasing control line ECL, a ground selection line GSL, and a plurality of first word lines WL11 to WL1$n$ that are sequentially stacked on the first substrate 10. Unlike the shown case, in an exemplary embodiment of the present invention, the erasing control line ECL may be omitted. Also, in an exemplary embodiment of the present invention, the number of the ground selection transistors GST may be two.

The second mold structure MS2 may be formed on the first mold structure MS1, and may include a plurality of second mold insulation films 112 and a plurality of second gate electrodes WL21 to WL2$n$ and SSL that are alternately stacked on the first mold structure MS1. For example, each of the second gate electrodes WL21 to WL2$n$ and SSL and each of the second mold insulation films 112 may have a layered structure extending in the first direction X and the second direction Y. Further, the second gate electrodes WL21 to WL2$n$ and SSL and the second mold insulation films 112 may be alternately stacked along the third direction Z.

In an exemplary embodiment of the present invention, the plurality of second gate electrodes WL21 to WL2$n$ and SSL may include a plurality of second word lines WL21 to WL2$n$ and a string selection line SSL which are sequentially stacked on the first mold structure MS1. In an exemplary embodiment of the present invention, the number of the string selection transistors SST may be two.

The first gate electrodes ECL, GSL and WL11 to WL1$n$ and the second gate electrodes WL21 to WL2$n$ and SSL may each include a conductive material. For example, the first gate electrodes ECL, GSL and WL11 to WL1$n$ and the second gate electrodes WL21 to WL2$n$ and SSL may each include, but are not limited to, a metal such as, for example, tungsten (W), cobalt (Co) and/or nickel (Ni), or a semiconductor material such as, for example, silicon (Si). In an exemplary embodiment of the present invention, the first gate electrodes ECL, GSL and WL11 to WL1$n$ and the second gate electrodes WL21 to WL2$n$ and SSL may each further include a diffusion barrier, and the diffusion barrier may include, for example, tungsten nitride (WN), tantalum nitride (TaN), and/or titanium nitride (TiN).

The first mold insulation film 110 and the second mold insulation film 112 may include an insulating material. For example, the first mold insulation film 110 and the second mold insulation film 112 may each include, but are not limited to, silicon oxide ($SiO_2$).

In an exemplary embodiment of the present invention, a first interlayer insulation film 140 may be formed on the first substrate 10, and may cover the mold structures MS1 and MS2. For example, the first interlayer insulation film 140 may include, but are not limited to, silicon oxide ($SiO_2$).

The first source structure 190 may be formed on the first surface MSa of the mold structures MS1 and MS2. For example, the first substrate 10 may be interposed between the mold structures MS1 and MS2 and the first source structure 190. The first source structure 190 may extend along the first surface MSa of the mold structures MS1 and MS2, and may be provided to a common source line (e.g., CSL of FIG. 1).

In an exemplary embodiment of the present invention, the first source structure 190 may include a first conductive plate 192a and a first barrier conductive film 194a.

The first conductive plate 192a may be formed on the first surface MSa of the mold structures MS1 and MS2, and may be a plate-shaped conductive film that extends along the first surface MSa of the mold structures MS1 and MS2. The first conductive plate 192a may include, but is not limited to, for example, tungsten (W), aluminum (Al), copper (Cu), or a combination thereof. In an exemplary embodiment of the present invention, the first conductive plate 192a may include tungsten (W) and/or aluminum (Al).

In an exemplary embodiment of the present invention, a thickness TH21 of the first conductive plate 192a may be in a range from about 500 Å to about 3000 Å. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The first barrier conductive film 194a may be interposed between the mold structures MS1 and MS2 and the first conductive plate 192a, and may extend along the first surface MSa of the mold structures MS1 and MS2. For example, the first barrier conductive film 194a may extend along a surface of the first conductive plate 192a. For example, the mold structures MS1 and MS2 may include a plurality of gate electrodes ECL, GSL, WL11 to WL1$n$, WL21 to WL2$n$ and SSL sequentially stacked on first barrier conductive film 194a.

The first barrier conductive film 194a may prevent diffusion of elements contained in the first conductive plate 192a. For example, the first barrier conductive film 194a may include, but is not limited to, titanium (Ti), titanium nitride (TiN), tantalum (Ta), tantalum nitride (TaN), or a combination thereof. In an exemplary embodiment of the present invention, the first barrier conductive film 194a may include titanium nitride (TiN).

In an exemplary embodiment of the present invention, the first substrate 10 may be interposed between the mold structures MS1 and MS2 and the first barrier conductive film 194a. For example, a lower surface of the first substrate 10 may be in contact with the first mold insulation film 110, and an upper surface of the first substrate 10 may be in contact with the first barrier conductive film 194a.

In an exemplary embodiment of the present invention, an input/output pad 195 may be formed on the first interlayer insulation film 140. For example, the first substrate 10 may be interposed between the first interlayer insulation film 140 and the input/output pad 195. The input/output pad 195 may extend along the surface of the first interlayer insulation film 140.

In an exemplary embodiment of the present invention, the input/output pad 195 and the first source structure 190 may be formed at the same level. As used herein, the term "same level" means that both are formed by the same fabricating process. For example, the input/output pad 195 may include a second conductive plate 197 including a material the same as that of the first conductive plate 192a, and a second barrier conductive film 199 including a material the same as that of the first barrier conductive film 194a. For example, a lower surface of the first substrate 10 may be in contact with the first interlayer insulation film 140, and an upper surface of the first substrate 10 may be in contact with the second barrier conductive film 199.

In an exemplary embodiment of the present invention, a first inter-wiring insulation film 50 and a passivation film 60 may be formed on the first surface MSa of the mold structures MS1 and MS2. The first inter-wiring insulation film 50 and the passivation film 60 may be sequentially formed on the first source structure 190. In an exemplary embodiment of the present invention, the first inter-wiring insulation film 50 may completely cover the first source structure 190.

In an exemplary embodiment of the present invention, the first inter-wiring insulation film 50 and the passivation film 60 may expose at least a part of the input/output pad 195. For example, the first inter-wiring insulation film 50 and the passivation film 60 may include an opening OP that exposes at least a part of the input/output pad 195. The input/output pad 195 may be exposed to the outside by the opening OP to form an input/output circuit. For example, a rewiring structure 70 to be described may be connected to the input/output pad 195 through the opening OP.

The plurality of channel holes CH may extend from the second surface MSb toward the first surface MSa and may penetrate the mold structures MS1 and MS2. That is, the channel hole CH may extend in a direction (e.g., the third direction Z) intersecting the plurality of gate electrodes ECL, GSL, WL11 to WL1$n$, WL21 to WL2$n$ and SSL.

In an exemplary embodiment of the present invention, the plurality of channel holes CH may be arranged in a zigzag form. For example, as shown in FIG. 2, a plurality of channel holes CH may be arranged alternately next to each other in both the first direction X and the second direction Y. A plurality of channel holes CHs arranged in the zigzag form can further enhance the degree of integration of the non-volatile memory device.

In an exemplary embodiment of the present invention, a plurality of dummy channel holes DCH which penetrates the mold structures MS1 and MS2 may be formed. The plurality of dummy channel holes DCH may be arranged along the second direction Y. The plurality of dummy channel holes DCH may be formed at the same time with the plurality of channel holes CH formed in the memory cell array. The plurality of dummy channel holes DCH and the plurality of channel holes CH may have substantially the same structure. Since the dummy channel hole DCH may have a shape similar to that of the channel hole CH, detailed description thereof will not be provided below. In an exemplary embodiment of the present invention, the plurality of channel holes CH and the plurality of dummy channel holes DCH may be arranged to form a hexagonal array.

In an exemplary embodiment of the present invention, the width of the channel hole CH penetrating the first mold structure MS1 may decrease from the second surface MSb toward the first surface MSa. In addition, the width of the channel hole CH penetrating the second mold structure MS2 may decrease from the second surface MSb toward the first surface MSa. This may be due to the characteristics of the etching process for forming the channel holes CH.

In an exemplary embodiment of the present invention, a side surface of the channel hole CH may have a step between the first mold structure MS1 and the second mold structure MS2. This may be because the etching process of penetrating the first mold structure MS1 and the etching process of penetrating the second mold structure MS2 are performed separately. However, this is only an example, and the etching process of penetrating the first mold structure MS1 and the etching process of penetrating the second mold structure MS2 may, of course, be performed simultaneously. In this case, the side surface of the channel hole CH may not have a step between the first mold structure MS1 and the second mold structure MS2.

The channel hole CH may expose at least a part of the surface of the first source structure 190. For example, the channel hole CH may penetrate the mold structures MS1 and MS2 and the first substrate 10 to expose the first barrier conductive film 194a.

The first impurity pattern 120 may be formed in each channel hole CH, and may be connected to the first source structure 190. For example, the upper surface of the first impurity pattern 120 may be in contact with the lower surface of the first barrier conductive film 194a. For example, the first impurity pattern 120 may be formed in the upper portion of each channel hole CH.

The first impurity pattern 120 may be a semiconductor pattern containing impurities. The first impurity pattern 120 may include, for example, but is not limited to, a semiconductor material such as single crystal silicon (Si), polycrystalline silicon (Si), organic semiconductor substance, or carbon (C) nanostructure. In an exemplary embodiment of the present invention, the first impurity pattern 120 may include n-type impurities (e.g., phosphorus (P), arsenic (As), etc.). In an exemplary embodiment of the present invention, the impurity concentration of the first impurity pattern 120 may be higher than the impurity concentration of the first substrate 10.

In an exemplary embodiment of the present invention, the first impurity pattern 120 may fill a part of each channel hole CH. For example, as shown in FIGS. 4A and 5A, the first impurity pattern 120 may include a filling part 122 and a tube 124. The channel hole CH of FIG. 5A is an upside-down view of the channel hole CH of FIG. 4A. The filling part 122 may cover the first barrier conductive film 194a exposed by the channel hole CH. Here, the filling part 122 may cover the first barrier conductive film 194a from beneath. In many instances throughout the specification, the term "cover" or "on", may mean covering or on the subject from below. For example, the filling part 122 may have a pillar shape (e.g., a cylindrical shape) extending from the first barrier conductive film 194a in the third direction Z. The tube 124 may protrude from the filling part 122 toward the first semiconductor pattern 130. For example, the tube 124 may have a tubular shape (e.g., a circular tubular shape) extending from the filling part 122 in the third direction Z.

In an exemplary embodiment of the present invention, a part of the first impurity pattern 120 adjacent to the first semiconductor pattern 130 may be formed by diffusion of impurities contained in the first impurity pattern 120. For example, the impurities may diffuse from the filling part 122 through the tube 124 toward the first semiconductor pattern 130. Accordingly, the impurity concentration of the first impurity pattern 120 may increase as it goes away from the first semiconductor pattern 130. For example, the concentration of n-type impurities of the tube 124 may increase as it goes away from the first semiconductor pattern 130. For example, the portion of the first impurity pattern 120 farthest away from the first semiconductor pattern 130 has the highest concentration of n-type impurities.

In an exemplary embodiment of the present invention, the first impurity pattern 120 may include a concave first surface 120C1. The first surface 120C1 may be defined by the side surface of the tube 124 protruding from the filling part 122 in a tubular form. For example, the first surface 120C1 may be formed on the lower surface of the filling part 122 from which the tube 124 does not protrude. The first surface 120C1 may be attributed to, for example, characteristics of a trim process of forming the first semiconductor pattern 130. The trim process for forming the first semiconductor pattern 130 is to be described with reference to FIG. 21.

The first semiconductor pattern 130 may be formed in each channel hole CH, and may penetrate the mold structures MS1 and MS2 and extend in the third direction Z. Accordingly, the first semiconductor pattern 130 may intersect the plurality of gate electrodes ECL, GSL, WL11 to WL1n, WL21 to WL2n and SSL. Although the first semiconductor pattern 130 is shown as having a circular tube shape, this is only an example. For example, the first semiconductor pattern 130 may have a square tube shape or a solid pillar shape.

The first semiconductor pattern 130 may be in contact with the first impurity pattern 120. For example, the first semiconductor pattern 130 may extend from the first impurity pattern 120 along the side surface of the channel hole CH.

The plurality of gate electrodes ECL, GSL, WL11 to WL1n, WL21 to WL2n and SSL may include the erasing control line ECL adjacent to the first barrier conductive film 194a. In an exemplary embodiment of the present invention, an interface between the first impurity pattern 120 and the first semiconductor pattern 130 may overlap (e.g., overlap in a direction perpendicular to the extending direction of the channel hole) the erasing control line ECL. For example, as shown in FIG. 4A, the interface between the first impurity pattern 120 and the first semiconductor pattern 130 may be located to be lower than the upper surface of the erasing control line ECL and to be higher than the lower surface of the erasing control line ECL. Accordingly, the erasing control line ECL may overlap (e.g., overlap in a direction perpendicular to the extending direction of the channel hole) at least a part of the first impurity pattern 120, and the erasing operation through the gate induced drain leakage GIDL may be smoothly performed.

In an exemplary embodiment of the present invention, the first semiconductor pattern 130 may extend from the tube 124 of the first impurity pattern 120 along the side surface of the channel hole CH. In an exemplary embodiment of the present invention, a thickness TH11 of the tube 124 of the first impurity pattern 120 may be the same as a thickness TH12 of the first semiconductor pattern 130. Here, the "thickness" is measured in a direction parallel to the first surface MSa of the mold structures MS1 and MS2. In the present specification, the term "same" means not only the same thing but also a minute difference that may occur due to a process margin or the like.

The first semiconductor pattern 130 may include, for example, but is not limited to, a semiconductor material such as single crystal silicon (Si), polycrystalline silicon (Si), organic semiconductor substance, or carbon (C) nanostructure. In an exemplary embodiment of the present invention, the first semiconductor pattern 130 may include polysilicon (p-Si) not doped with impurities.

An information storage film 132 may extend along the side surfaces of each channel hole CH. For example, the information storage film 132 may be interposed between the mold structures MS1 and MS2 and the first semiconductor pattern 130, and between the mold structures MS1 and MS2 and the first impurity pattern 120. Accordingly, the information storage film 132 may be interposed between the first semiconductor pattern 130 and the respective gate electrodes ECL, GSL, WL11 to WL1*n*, WL21 to WL2*n* and SSL.

In an exemplary embodiment of the present invention, the information storage film 132 may be in contact with the first barrier conductive film 194*a*. For example, the first impurity pattern 120 may extend along a part of the side surface of the information storage film 132, and the first semiconductor pattern 130 may extend along another part of the side surface of the information storage film 132. In an exemplary embodiment of the present invention, a part of the information storage film 132 may be interposed between the first substrate 10 and the first impurity pattern 120.

The information storage film 132 may include, for example, at least one of silicon oxide ($SiO_2$), silicon nitride ($Si_3N_4$), silicon oxynitride (SiON), or a high dielectric constant material having a dielectric constant higher than that of silicon oxide ($SiO_2$). The high dielectric constant material may include, for example, at least one of aluminum oxide ($Al_2O_3$), hafnium oxide ($HfO_2$), lanthanum oxide ($La_2O_3$), tantalum oxide ($Ta_2O_5$), titanium oxide ($TiO_2$), lanthanum hafnium oxide (LaHfO), lanthanum aluminum oxide ($LaAlO_3$), dysprosium scandium oxide ($DyScO_3$), or a combination thereof.

In an exemplary embodiment of the present invention, the information storage film 132 may be formed as multiple films. For example, as shown in FIG. 4A, the information storage film 132 may include a tunnel insulation film 132*a*, a charge storage film 132*b*, and a blocking insulation film 132*c*, which are sequentially stacked on the first impurity pattern 120 and the first semiconductor pattern 130. The blocking insulation film 132*c* may be formed between the charge storage film 132*b* and the respective gate electrodes ECL, GSL, WL11 to WL1*n*, WL21 to WL2*n* and SSL.

The tunnel insulation film 132*a* may allow charges to tunnel to the charge storage film 132*b* through the process of Fowler-Nordheim (F-N) tunneling. The tunnel insulation film 132*a* may include, for example, silicon oxide ($SiO_2$) or a high dielectric constant material having a dielectric constant higher than that of silicon oxide ($SiO_2$) (e.g., aluminum oxide ($Al_2O_3$) and hafnium oxide ($HfO_2$)). The charge storage film 132*b* may include, for example, silicon nitride ($Si_3N_4$). The blocking insulation film 132*c* may include, for example, silicon oxide ($SiO_2$) or a high dielectric constant material having a dielectric constant higher than that of silicon oxide ($SiO_2$) (e.g., aluminum oxide ($Al_2O_3$) and hafnium oxide ($HfO_2$)). In an exemplary embodiment of the present invention, the blocking insulation film 132*c* may include a material having a dielectric constant higher than that of the tunnel insulation film 132*a*. However, the present invention is not limited thereto.

In an exemplary embodiment of the present invention, a gate insulation film 133 may be formed between each of the gate electrodes ECL, GSL, WL11 to WL1*n*, WL21 to WL2*n* and SSL and the information storage film 132. The gate insulation film 133 may extend along the lower surfaces, the side surfaces and the upper surfaces of each of the gate electrodes ECL, GSL, WL11 to WL1*n*, WL21 to WL2*n* and SSL. The gate insulation film 133 may include, for example, but is not limited to, aluminum oxide ($Al_2O_3$).

In an exemplary embodiment of the present invention, a filling insulation pattern 134 may be formed within each channel hole CH. The filling insulation pattern 134 may be formed to fill the inside of the tubular first semiconductor pattern 130 and the inside of the tube 124 of the first impurity pattern 120. Thus, the filling insulation pattern 134 may be surrounded by the first semiconductor pattern 130 and the first impurity pattern 120. The filling insulation pattern 134 may include, but is not limited to, for example, silicon oxide ($SiO_2$).

In an exemplary embodiment of the present invention, a second impurity pattern 136 may be formed on the second surface MSb of the mold structures MS1 and MS2, and may be formed to be connected to the first semiconductor pattern 130. For example, the second impurity pattern 136 may be formed in the second interlayer insulation film 142 that covers the first interlayer insulation film 140. The second impurity pattern 136 may include, for example, but is not limited to, polysilicon (p-Si) doped with impurities. In an exemplary embodiment of the present invention, the second impurity pattern 136 may include n-type impurities (e.g., phosphorus (P), arsenic (As), etc.).

A plurality of bit lines BL may be spaced apart from each other and extend side by side. For example, each bit line BL may extend in the first direction X. In an exemplary embodiment of the present invention, the bit lines BL may be formed on the second surface MSb of the mold structures MS1 and MS2. For example, the bit lines BL may be formed on the fourth interlayer insulation film 146 that covers the third interlayer insulation film 144.

Each bit line BL may be connected to a plurality of first semiconductor patterns 130. For example, as shown in FIGS. 2 and 3, the bit line BL may be connected to the plurality of first semiconductor patterns 130 through the first bit line contact 170. The first bit line contact 170 may penetrate, for example, the third interlayer insulation film 144 and the fourth interlayer insulation film 146 to electrically connect the bit line BL and the second impurity pattern 136. The first bit line contact 170 may not be connected to the first semiconductor pattern 130 in the dummy channel hole DCH.

The mold structures MS1 and MS2 may be cut by the cutting pattern 150. For example, the cutting pattern 150 may extend from the second surface MSb toward the first surface MSa to cut the mold structures MS1 and MS2. The cutting pattern 150 may extend in a direction intersecting the bit line BL. For example, the bit line BL may extend in the first direction X, and the cutting pattern 150 may extend in the second direction Y. The cutting pattern 150 may correspond to the word line cutting region WLC of FIG. 2. The cutting pattern 150 may include, but is not limited to, silicon oxide ($SiO_2$).

In an exemplary embodiment of the present invention, a cutting line CL may be formed in the string selection line SSL, and may cut the string selection line SSL. For example, as shown in FIG. 2, the cutting line CL may extend in the second direction Y to cut the string selection line SSL. The memory cell arrays spaced apart from each other by the cutting line CL may be selected separately and controlled through the string selection line SSL cut by the cutting line CL.

In an exemplary embodiment of the present invention, the cutting line CL may cross a plurality of dummy channel holes DCH arranged along the second direction Y. The first semiconductor pattern 130 in the dummy channel hole DCH may not be connected to the bit line BL.

Referring to FIG. 3 again, a gate contact 172 connected to respective gate electrodes ECL, GSL, WL11 to WL1n, WL21 to WL2n and SSL may be formed in the extension region EXT. For example, the gate contact 172 may penetrate the first to fourth interlayer insulation films 140, 142, 144 and 146 and may be connected to the respective gate electrodes ECL, GSL, WL11 to WL1n, WL21 to WL2n and SSL. In an exemplary embodiment of the present invention, the width of the gate contact 172 may decrease from the second surface MSb toward the first surface MSa.

In an exemplary embodiment of the present invention, a source contact 174 connected to the first source structure 190 may be formed in the extension region EXT. For example, the source contact 174 may penetrate the first to fourth interlayer insulation films 140, 142, 144 and 146 and may be connected to the first source structure 190. In an exemplary embodiment of the present invention, the width of the source contact 174 may decrease from the second surface MSb toward the first surface MSa.

In an exemplary embodiment of the present invention, an input/output contact 176 connected to the input/output pad 195 may be formed in the extension region EXT. For example, the input/output contact 176 may penetrate the first to fourth interlayer insulation films 140, 142, 144 and 146, and may be connected to the input/output pad 195. In an exemplary embodiment of the present invention, the width of the input/output contact 176 may decrease from the second surface MSb toward the first surface MSa. In an exemplary embodiment of the present invention, each of the gate contact 172, the source contact 174 and the input/output contact 176 may have a single-layer structure including a metal layer, a double-layer structure including a metal layer and a metal nitride layer, or a triple-layer structure including a metal layer, a metal nitride layer and a metal silicide layer.

The first wiring structure PW1 may be formed on the second surface MSb of the mold structures MS1 and MS2. The first wiring structure PW1 may include a first wiring 22 and a first via 24. For example, a second inter-wiring insulation film 20 that covers the bit line BL may be formed. The first wiring 22 and the first via 24 are formed in the second inter-wiring insulation film 20 and may be electrically connected to each other. In an exemplary embodiment of the present invention, at least a part of the first wiring structure PW1 may be exposed from the surface of the second inter-wiring insulation film 20. In an exemplary embodiment of the present invention, the first via 24 may include a metal material such as, for example, tungsten (W), aluminum (Al), or copper (Cu). The first wiring 22 may include a metal material such as, for example, copper (Cu). However, the present invention is not limited thereto.

The second substrate 30 may face the second surface MSb of the mold structures MS1 and MS2. The second substrate 30 may include, for example, a semiconductor substrate such as a silicon (Si) substrate, a germanium (Ge) substrate or a silicon-germanium (SiGe) substrate. Alternatively, the second substrate 30 may include a silicon-on-insulator (SOI) substrate, a germanium-on-insulator (GOI) substrate, or the like.

In an exemplary embodiment of the present invention, the first to fourth peripheral circuit elements PT1, PT2, PT3 and PT4 may be formed on the second substrate 30. The first to fourth peripheral circuit elements PT1, PT2, PT3 and PT4 may form peripheral circuits (e.g., a page buffer, a row decoder, control logic, etc.) that control the operation of each memory cell. For example, the first peripheral circuit element PT1 may form a page buffer, and the second peripheral circuit element PT2 may form a row decoder.

Each of the first to fourth peripheral circuit elements PT1, PT2, PT3 and PT4 may include, for example, but is not limited to, a transistor. For example, each of the first to fourth peripheral circuit elements PT1, PT2, PT3 and PT4 may include not only various active elements such as transistors, but also various passive elements such as, for example, a capacitor, a resistor, and an inductor.

The second wiring structure PW2 may be formed on the second substrate 30. The second wiring structure PW2 may include a second wiring 42 and a second via 44. For example, a third inter-wiring insulation film 40 that covers the first to fourth peripheral circuit elements PT1, PT2, PT3 and PT4 may be formed. The second wiring 42 and the second via 44 may be formed in the third inter-wiring insulation film 40 and may be electrically connected to each other. In an exemplary embodiment of the present invention, at least a part of the second wiring structure PW2 may be exposed from the surface of the third inter-wiring insulation film 40. In an exemplary embodiment of the present invention, the second via 44 may include a metal material such as, for example, tungsten (W), aluminum (Al), or copper (Cu). The second wiring 42 may include a metal material such as, for example, copper (Cu). However, the present invention is not limited thereto.

In an exemplary embodiment of the present invention, the third inter-wiring insulation film 40 may be attached to the second inter-wiring insulation film 20. For example, the third inter-wiring insulation film 40 may be interposed between the second inter-wiring insulation film 20 and the second substrate 30.

The first wiring 22 may be provided on the second wiring 42, and the second inter-wiring insulation film 20 may be provided on the third inter-wiring insulation film 40. By attaching the second inter-wiring insulation film 20 and the third inter-wiring insulation film 40, the first wiring structure PW1 and the second wiring structure PW2 may be electrically connected to each other. For example, the first wiring 22 exposed from the second inter-wiring insulation film 20 may come into contact with the second wiring 42 exposed from the third inter-wiring insulation film 40. The first wiring 22 and the second wiring 42 may be electrically connected to each other by, for example, but are not limited to, a copper-copper bonding (Cu to Cu bonding) process.

In an exemplary embodiment of the present invention, each bit line BL may be connected to the first peripheral circuit element PT1 formed on the second substrate 30. For example, the bit line BL may be connected to the first peripheral circuit element PT1 through the first wiring structure PW1 and the second wiring structure PW2.

In an exemplary embodiment of the present invention, each of the gate electrodes ECL, GSL, WL11 to WL1n, WL21 to WL2n and SSL may be connected to a second peripheral circuit element PT2 formed on the second substrate 30. For example, a third wiring 182 connected to the gate contact 172 may be formed in the second inter-wiring insulation film 20. The third wiring 182 may be connected to the second peripheral circuit element PT2 through the first wiring structure PW1 and the second wiring structure PW2.

In an exemplary embodiment of the present invention, the first source structure 190 may be connected to a third peripheral circuit element PT3 formed on the second substrate 30. For example, a fourth wiring 184 connected to the source contact 174 may be formed in the second inter-wiring insulation film 20. The fourth wiring 184 may be connected to the third peripheral circuit element PT3 through the first wiring structure PW1 and the second wiring structure PW2.

In an exemplary embodiment of the present invention, the input/output pad 195 may be connected to the fourth peripheral circuit element PT4 formed on the second substrate 30. For example, a fifth wiring 186 connected to the input/output pad 195 may be formed in the second inter-wiring insulation film 20. The fifth wiring 186 may be connected to the fourth peripheral circuit element PT4 through the first wiring structure PW1 and the second wiring structure PW2.

Figure 4B:
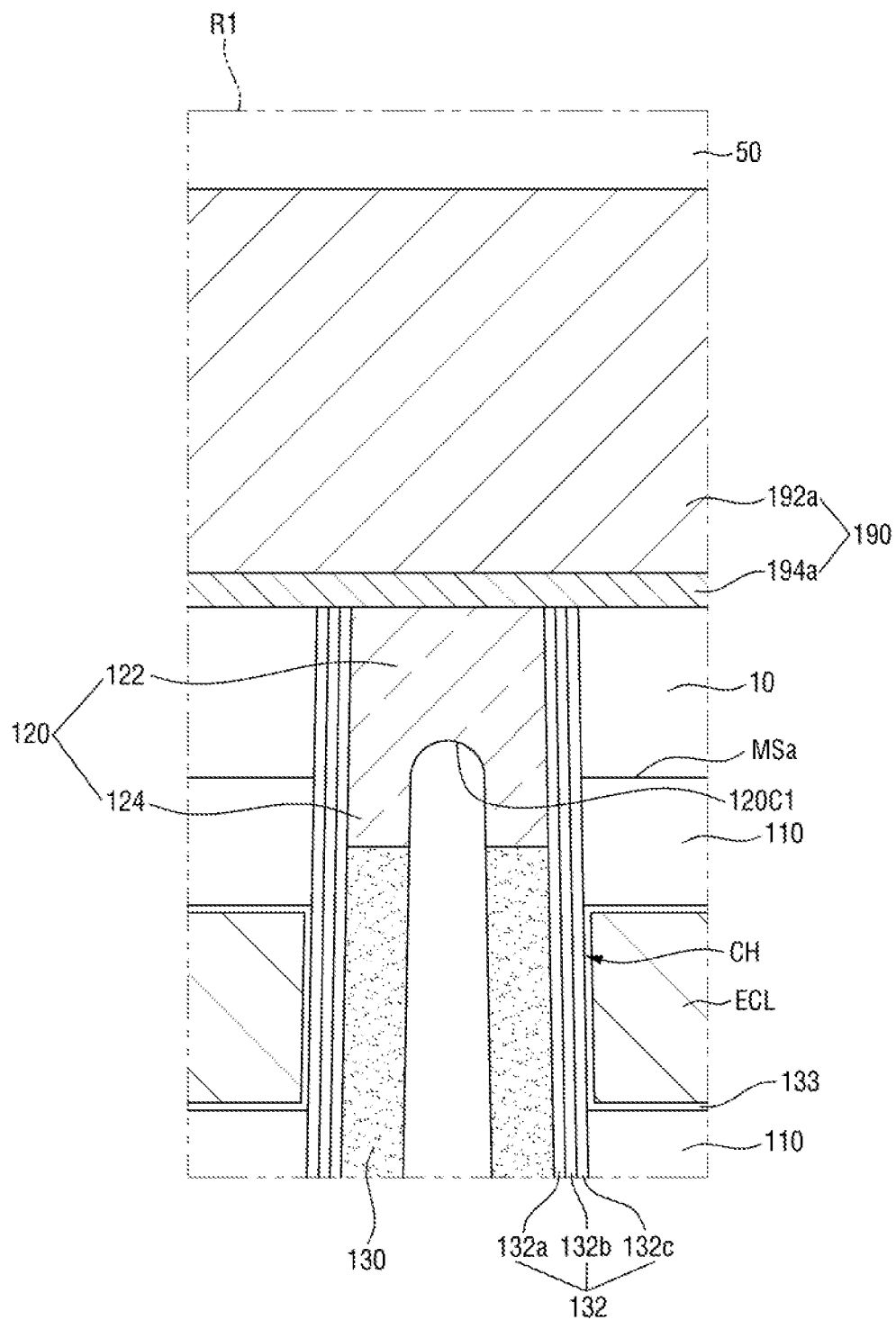
Figure 5A:
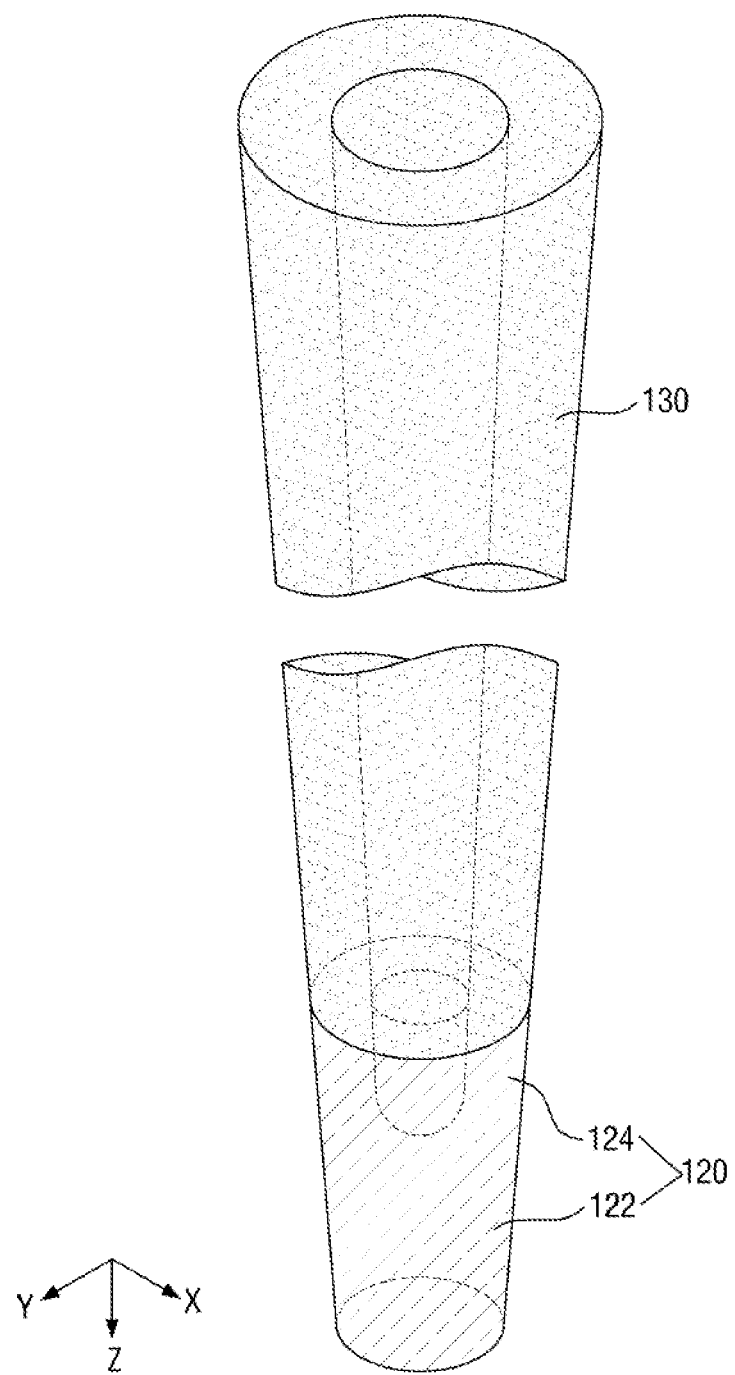
FIGS. 5A and 5B are various partial perspective views for explaining a first semiconductor pattern and a first impurity region of FIG. 3.
Figure 5B:
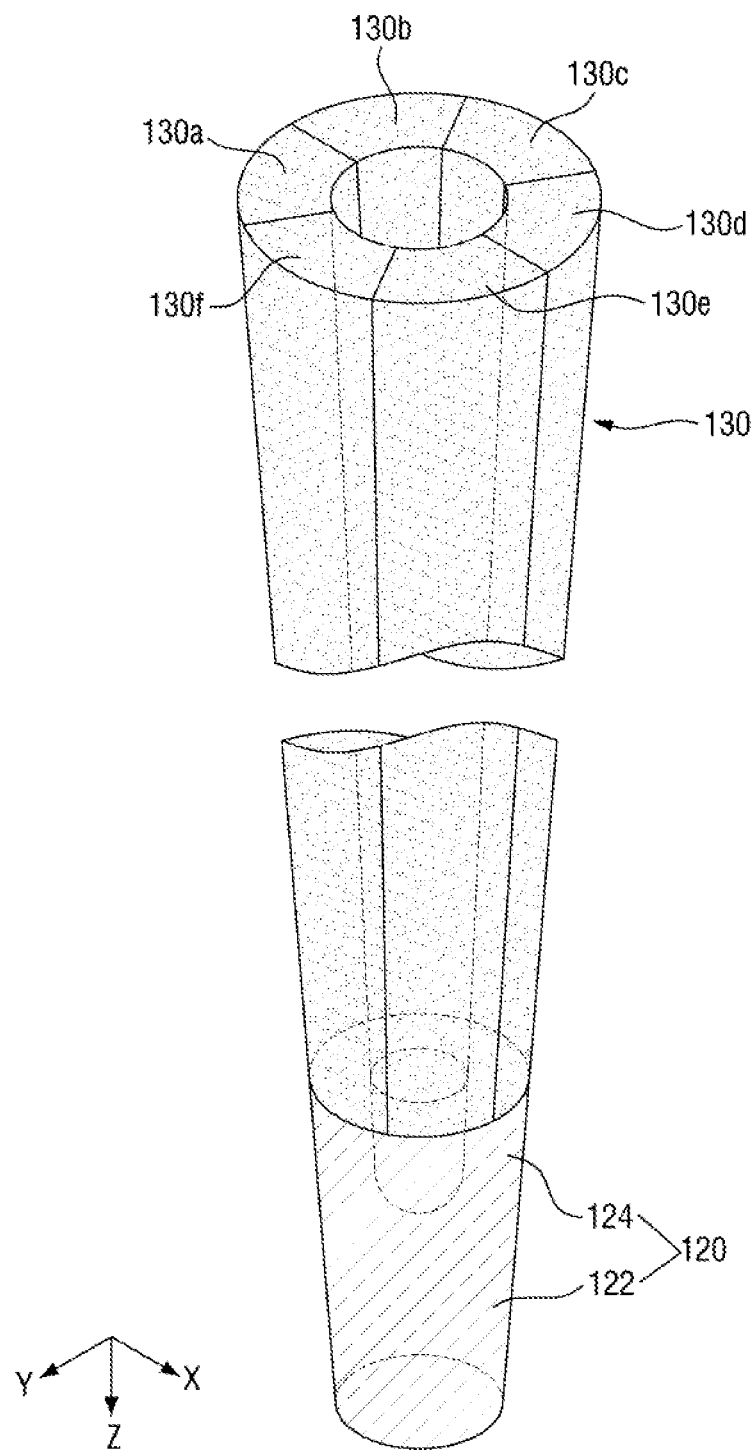

Referring to FIGS. 3 and 4B, in the nonvolatile memory device according to an exemplary embodiment of the present invention, the interface between the first impurity pattern 120 and the first semiconductor pattern 130 may be closer to the first source structure 190 than the erasing control line ECL.

The interface between the first impurity pattern 120 and the first semiconductor pattern 130 may be located at a level higher than that of the upper surface of the erasing control line ECL. Accordingly, the erasing control line ECL may be completely overlapped (e.g., overlap in a direction perpendicular to the extending direction of the channel hole) by the first semiconductor pattern 130.

In an exemplary embodiment of the present invention, the interface between the first impurity pattern 120 and the first semiconductor pattern 130 may overlap (e.g., overlap in a direction perpendicular to the extending direction of the channel hole) the first mold insulation film 110 that is closest to the first surface MSa of the mold structures MS1 and MS2.

Figure 4C:
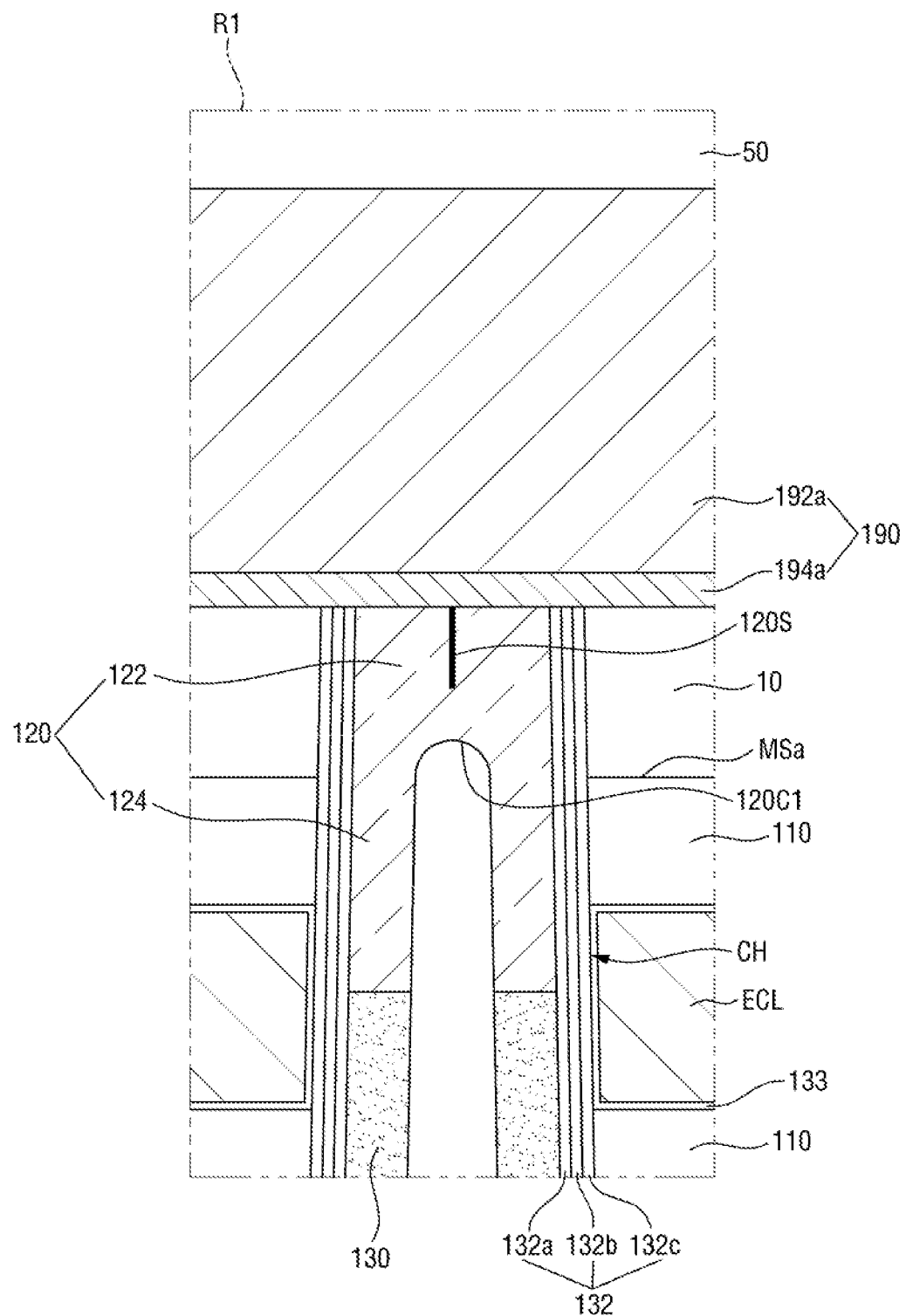

Referring to FIGS. 3 and 4C, in the nonvolatile memory device according to an exemplary embodiment of the present invention, the first impurity pattern 120 may include a seam 120S.

The seam 120S may extend in a direction intersecting the surface of the first source structure 190, and may be formed, for example, in the filling part 122 of the first impurity pattern 120. The seam 120S may be attributed to, for example, characteristics of a vapor deposition process of forming the first impurity pattern 120.

In an exemplary embodiment of the present invention, the seam 120S may be in contact with the first source structure 190. In an exemplary embodiment of the present invention, the seam 120S may be spaced apart from the first surface 120C1 of the first impurity pattern 120.

FIG. 4C shows that the interface between the first impurity pattern 120 and the first semiconductor pattern 130 overlaps (e.g., overlaps in a direction perpendicular to the extending direction of the channel hole) the erasing control line ECL. However, the present invention is not limited thereto. For example, in an exemplary embodiment of the present invention, the first impurity pattern 120 may include a seam 120S and the erasing control line ECL may be completely overlapped (e.g., overlap in a direction perpendicular to the extending direction of the channel hole) by the first semiconductor pattern 130.

Figure 4D:
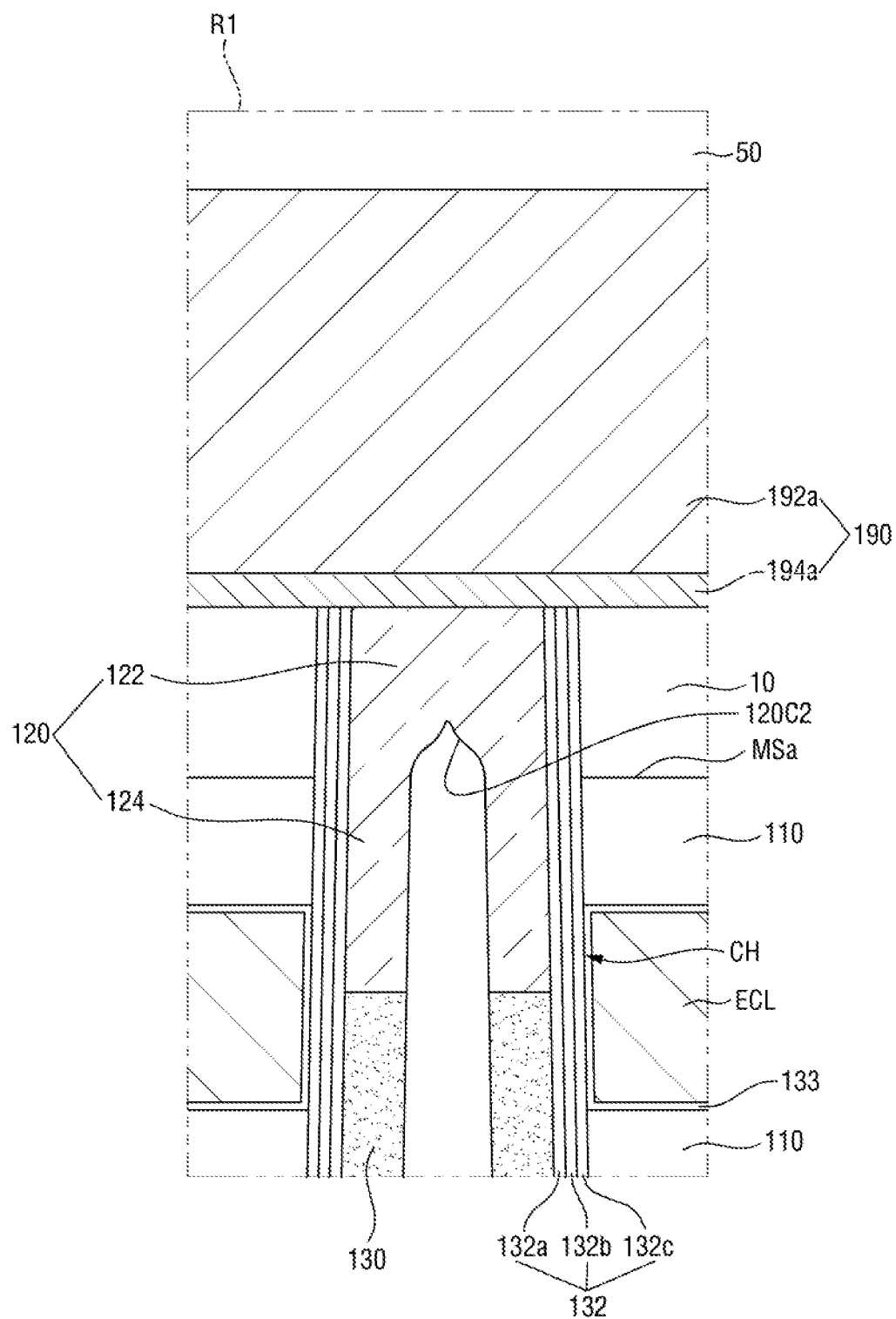

Referring to FIGS. 3 and 4D, in the nonvolatile memory device according to an exemplary embodiment of the present invention, the first impurity pattern 120 may include a convex second surface 120C2.

The second surface 120C2 may be defined by the side surface of the tube 124 protruding from the filling part 122 in a tubular shape. For example, the second surface 120C2 may be formed on the lower surface of the filling part 122 from which the tube 124 does not protrude. The second surface 120C2 may be attributed to, for example, the characteristics of a trim process of forming the first semiconductor pattern 130. The trim process for forming the first semiconductor pattern 130 is to be described with reference to FIG. 21.

FIG. 4D shows that the interface between the first impurity pattern 120 and the first semiconductor pattern 130 overlaps (e.g., overlaps in a direction perpendicular to the extending direction of the channel hole) the erasing control line ECL. However, the present invention is not limited thereto. For example, in an exemplary embodiment of the present invention, the first impurity pattern 120 may include a convex second surface 120C2 and the erasing control line ECL may be completely overlapped (e.g., overlap in a direction perpendicular to the extending direction of the channel hole) by the first semiconductor pattern 130.

Figure 4E:
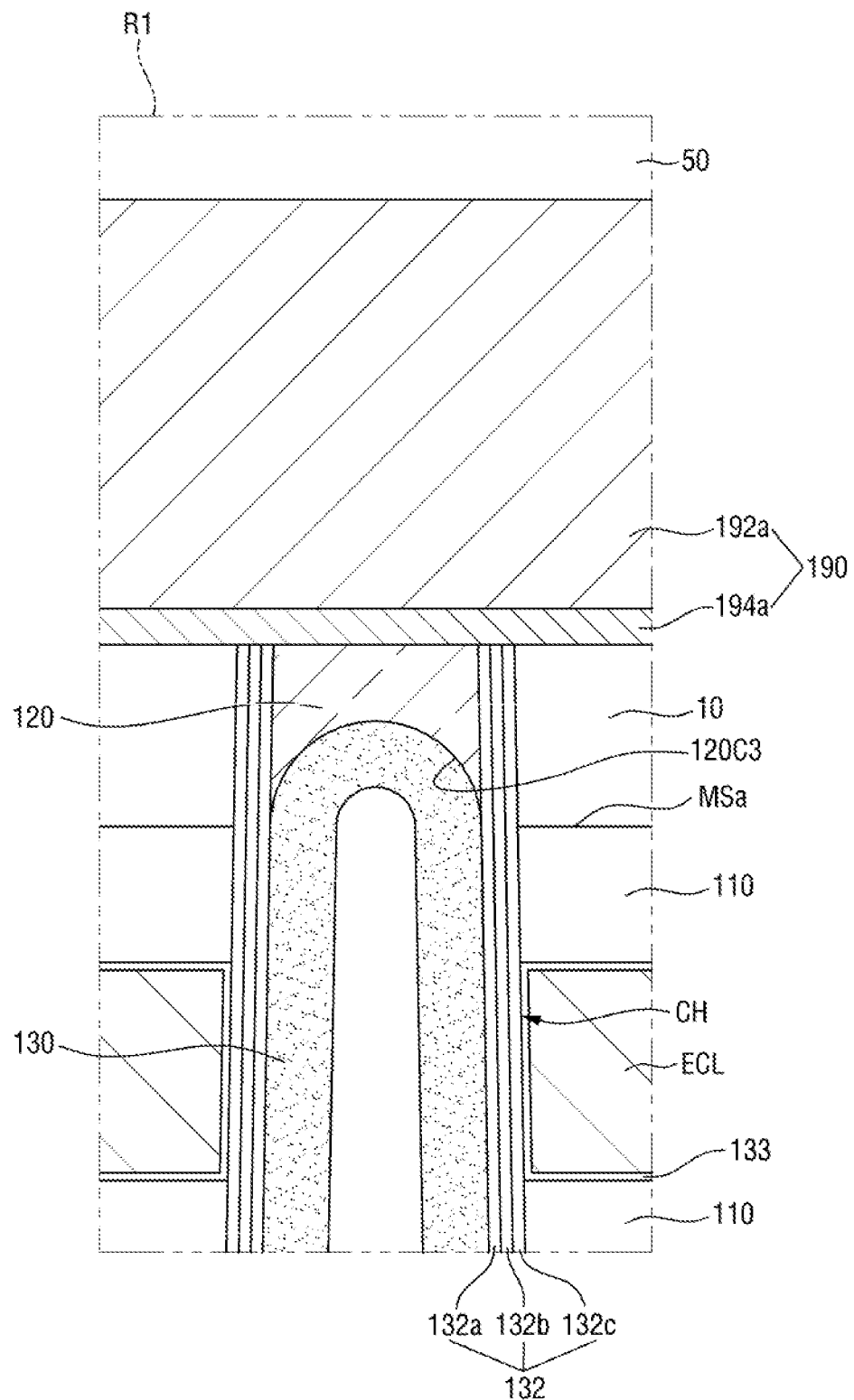

Referring to FIGS. 3 and 4E, in the nonvolatile memory device according to an exemplary embodiment of the present invention, the first semiconductor pattern 130 may extend along a profile of the first impurity pattern 120.

The first impurity pattern 120 may include a third surface 120C3 facing the first semiconductor pattern 130. For example, the third surface 120C3 may be formed at an interface between the first impurity pattern 120 and the first semiconductor pattern 130. The first semiconductor pattern 130 may extend along the profile of the third surface 120C3.

In an exemplary embodiment of the present invention, the third surface 120C3 of the first impurity pattern 120 may be concave.

Referring to FIGS. 3 and 5B, in the nonvolatile memory device according to an exemplary embodiment of the present invention, the first semiconductor pattern 130 may be vertically crystallized. FIG. 5B is an upside-down view of a portion of the channel hole CH of FIG. 3.

The first semiconductor pattern 130 may include a plurality of crystal regions 130a to 130f arranged along a plane including the first direction X and the second direction Y. Each of the crystal regions 130a to 130f may be crystallized vertically. That is, the interfaces of the crystal regions 130a to 130f may extend along the third direction Z. Although only the six crystal regions 130a to 130f are shown in FIG. 5B, this is merely an example, and the present invention is not limited thereto. For example, the crystal regions formed may be more than six or less than six.

In an exemplary embodiment of the present invention, the crystal regions 130a to 130f of the first semiconductor pattern 130 may be formed by a MIC (Metal Induced Crystallization) process or a MILC (Metal Induced Lateral Crystallization) process.

Figure 6:
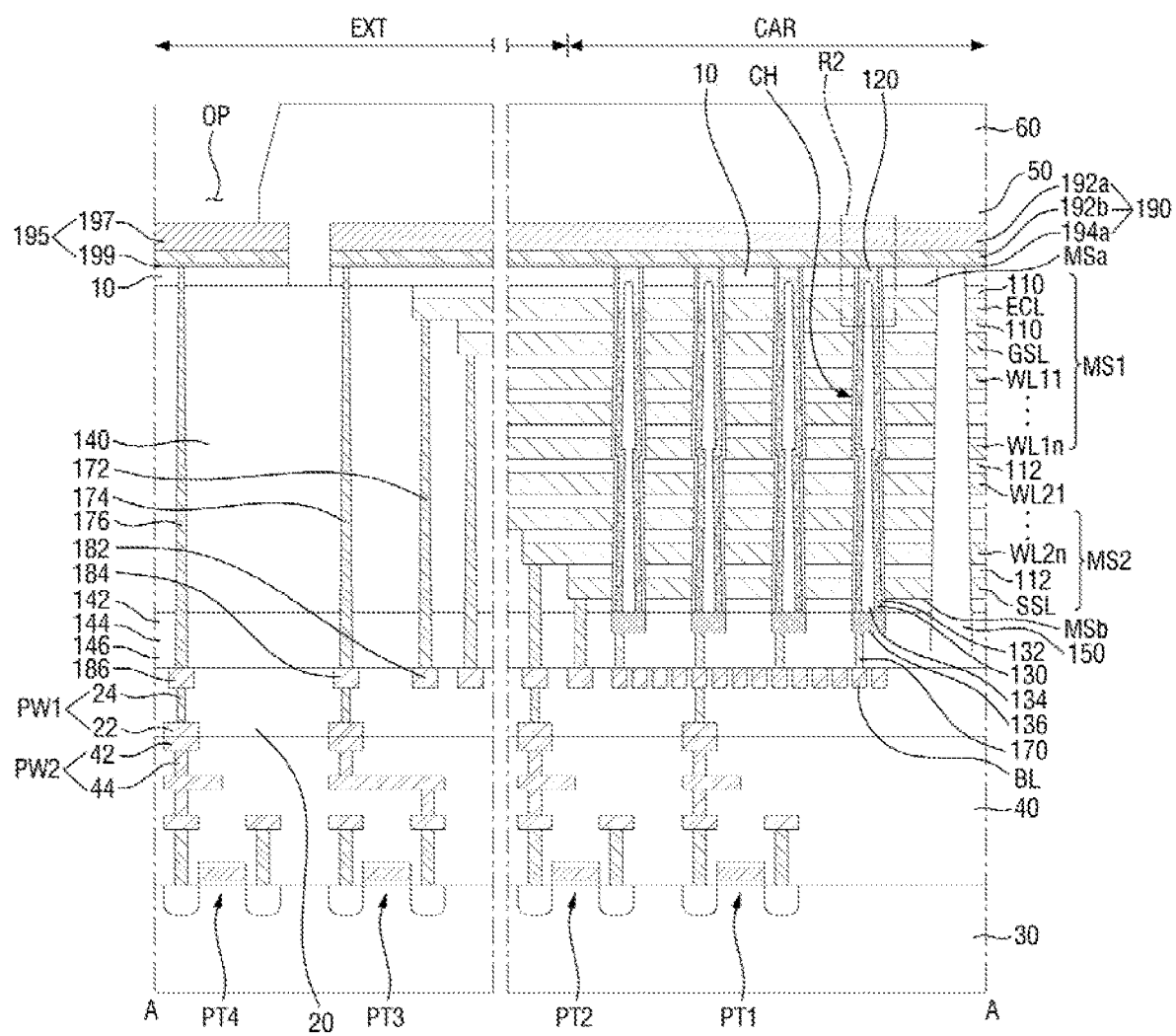
FIG. 6 is a cross-sectional view for explaining a nonvolatile memory device according to an exemplary embodiment of the present invention.
Figure 7A:
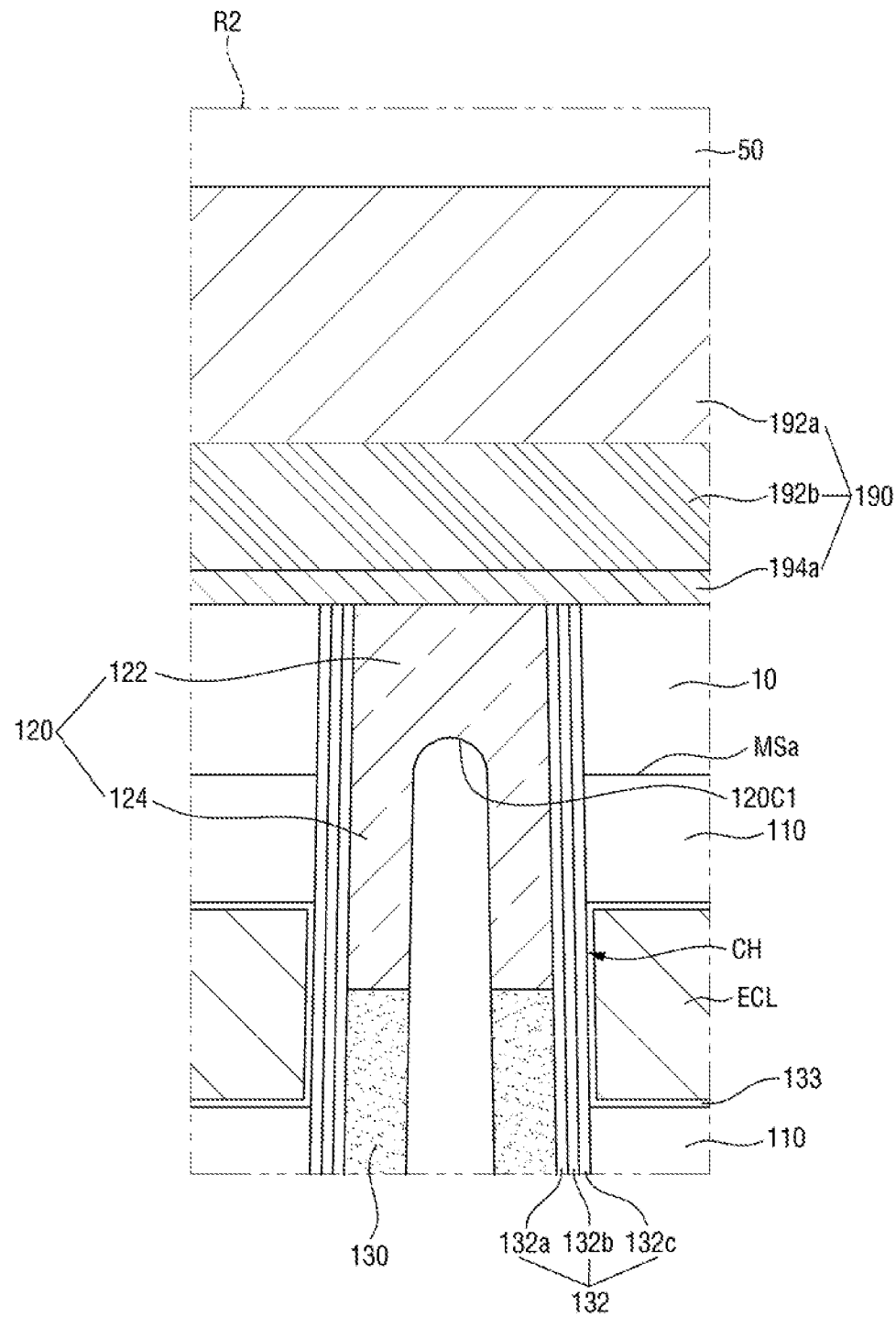
FIGS. 7A and 7B are various enlarged views of region R2 of FIG. 6.
Figure 7B:
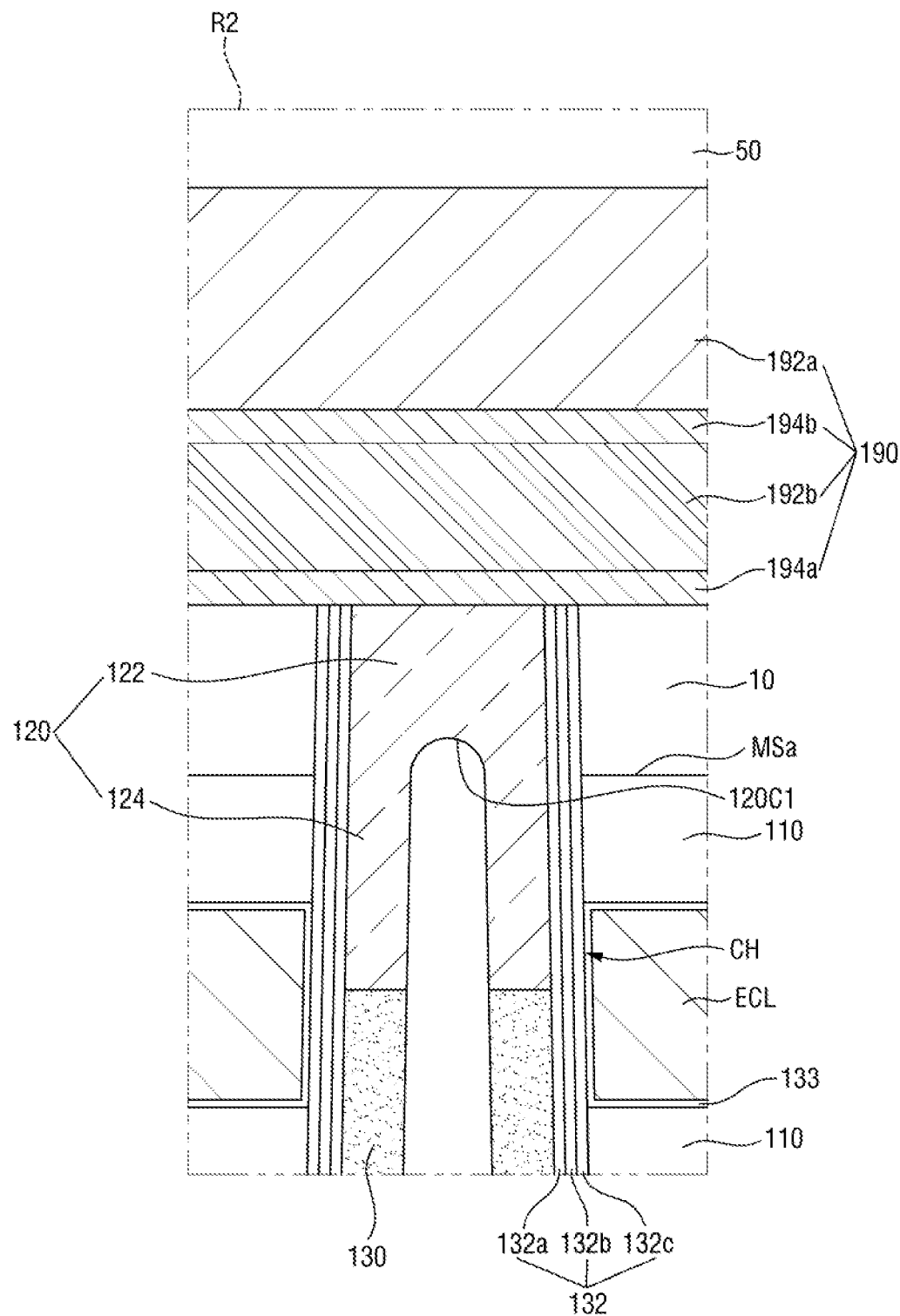

FIG. 6 is a cross-sectional view for explaining a nonvolatile memory device according to an exemplary embodiment of the present invention. FIGS. 7A and 7B are various enlarged views of region R2 of FIG. 6. For the sake of convenience of description, repeated parts of contents explained with reference to FIGS. 1 to 5B will be briefly described or omitted.

Referring to FIGS. 6 and 7A, in the nonvolatile memory device according to an exemplary embodiment of the present invention, the first source structure 190 further includes a third conductive plate 192b.

The third conductive plate 192b may be interposed between the first conductive plate 192a and the first barrier conductive film 194a. The third conductive plate 192b may be a plate-shaped conductive film that extends along the first surface MSa of the mold structures MS1 and MS2, and may include, for example, but is not limited to, tungsten (W), aluminum (Al), copper (Cu), or a combination thereof.

The third conductive plate 192b may include a material different from that of the first conductive plate 192a. In an exemplary embodiment of the present invention, the first conductive plate 192*a* may include aluminum (Al), and the third conductive plate 192*b* may include tungsten (W). In an exemplary embodiment of the present invention, the thickness of the first conductive plate 192*a* may be greater than the thickness of the third conductive plate 192*b*.

Referring to FIGS. 6 and 7B, in the nonvolatile memory device according to an exemplary embodiment of the present invention, the first source structure 190 further includes a third barrier conductive film 194*b*.

The third barrier conductive film 194*b* may be interposed between the first conductive plate 192*a* and the third conductive plate 192*b*, and may extend along the first surface MSa of the mold structures MS1 and MS2.

The third barrier conductive film 194*b* may prevent diffusion of elements contained in the first conductive plate 192*a* and/or the third conductive plate 192*b*. For example, the third barrier conductive film 194*b* may include, but is not limited to, titanium (Ti), titanium nitride (TiN), tantalum (Ta), tantalum nitride (TaN), or a combination thereof. In an exemplary embodiment of the present invention, the third barrier conductive film 194*b* may include titanium nitride (TiN). In an exemplary embodiment of the present invention, the first barrier conductive film 194*a* and the third barrier conductive film 194*b* may be formed of the same material and have about the same thickness. However, the present invention is not limited thereto. For example, the first barrier conductive film 194*a* and the third barrier conductive film 194*b* may be formed of different materials and/or have different thicknesses.

Figure 8:
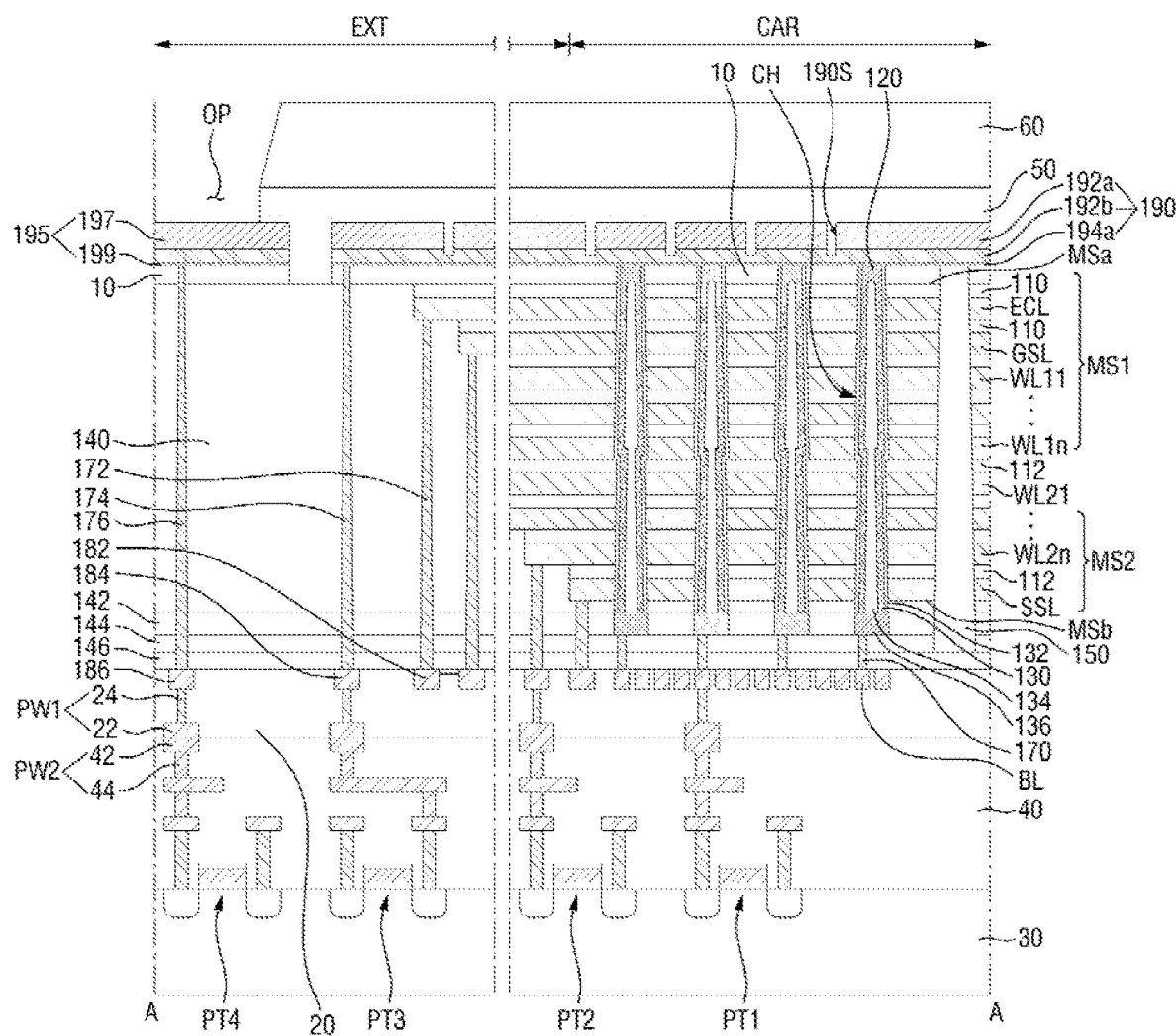
FIG. 8 is a cross-sectional view for explaining a nonvolatile memory device according to an exemplary embodiment of the present invention.
Figure 9:
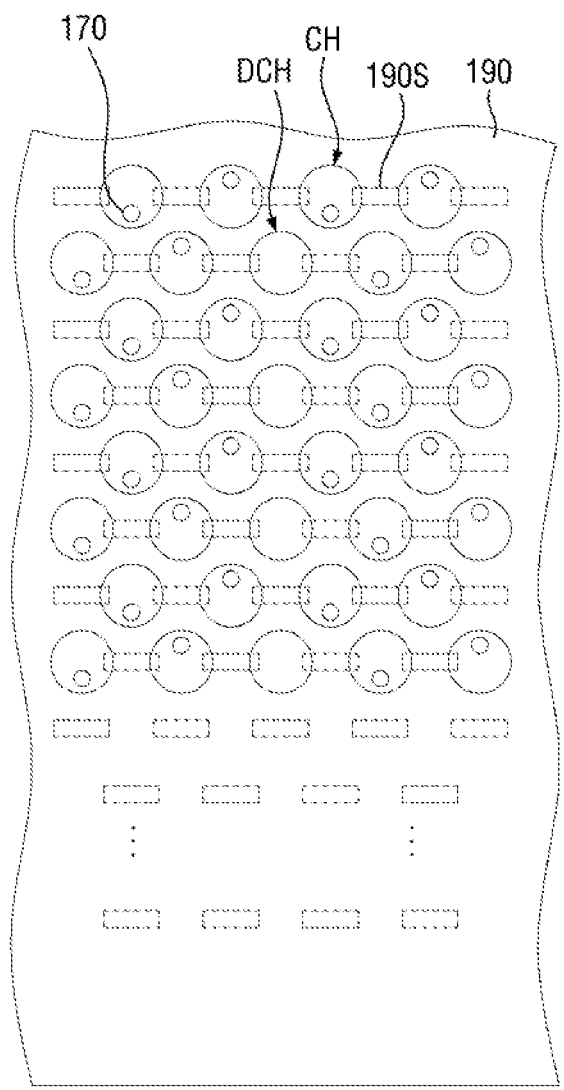
FIG. 9 is a schematic layout diagram for explaining the slits of FIG. 8.

FIG. 8 is a cross-sectional view for explaining a nonvolatile memory device according to an exemplary embodiment of the present invention. FIG. 9 is a schematic layout diagram for explaining the slits of FIG. 8. For convenience of explanation, repeated parts of contents explained with reference to FIGS. 1 to 7B will be briefly described or omitted.

Referring to FIGS. 8 and 9, in the nonvolatile memory device according to an exemplary embodiment of the present invention, the first source structure 190 includes a slit 190S.

The slit 190S may be formed in the first conductive plate 192*a*. The slit 190S may cut a part of the first conductive plate 192*a*, and the slit 190S may expose a part of the third conductive plate 192*b*. For example, the slit 190S may stop at a top surface of the third conductive plate 192*b* or may penetrate a top portion of the third conductive plate 192*b*. A plurality of slits 190S may be formed. The slits 190S may prevent an electromigration phenomenon that may occur in the first conductive plate 192*a*, by cutting a part of the first conductive plate 192*a*.

In an exemplary embodiment of the present invention, each of the plurality of slits 190S may extend in the first direction X. In an exemplary embodiment of the present invention, each slit 190S may be disposed between channel holes CH arranged along the second direction Y.

Figure 10:
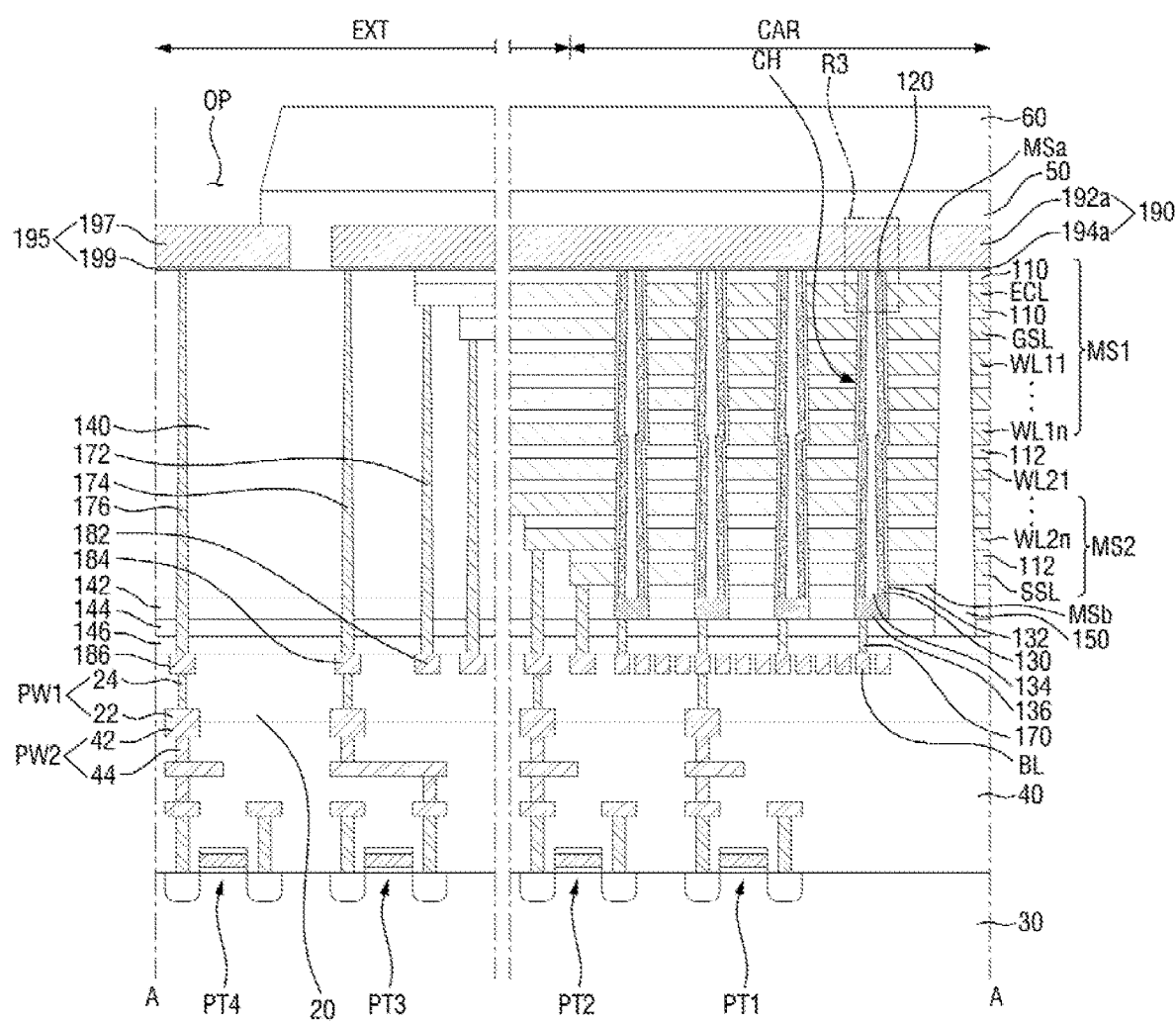
FIG. 10 is a cross-sectional view for explaining a nonvolatile memory device according to an exemplary embodiment of the present invention.
Figure 11A:
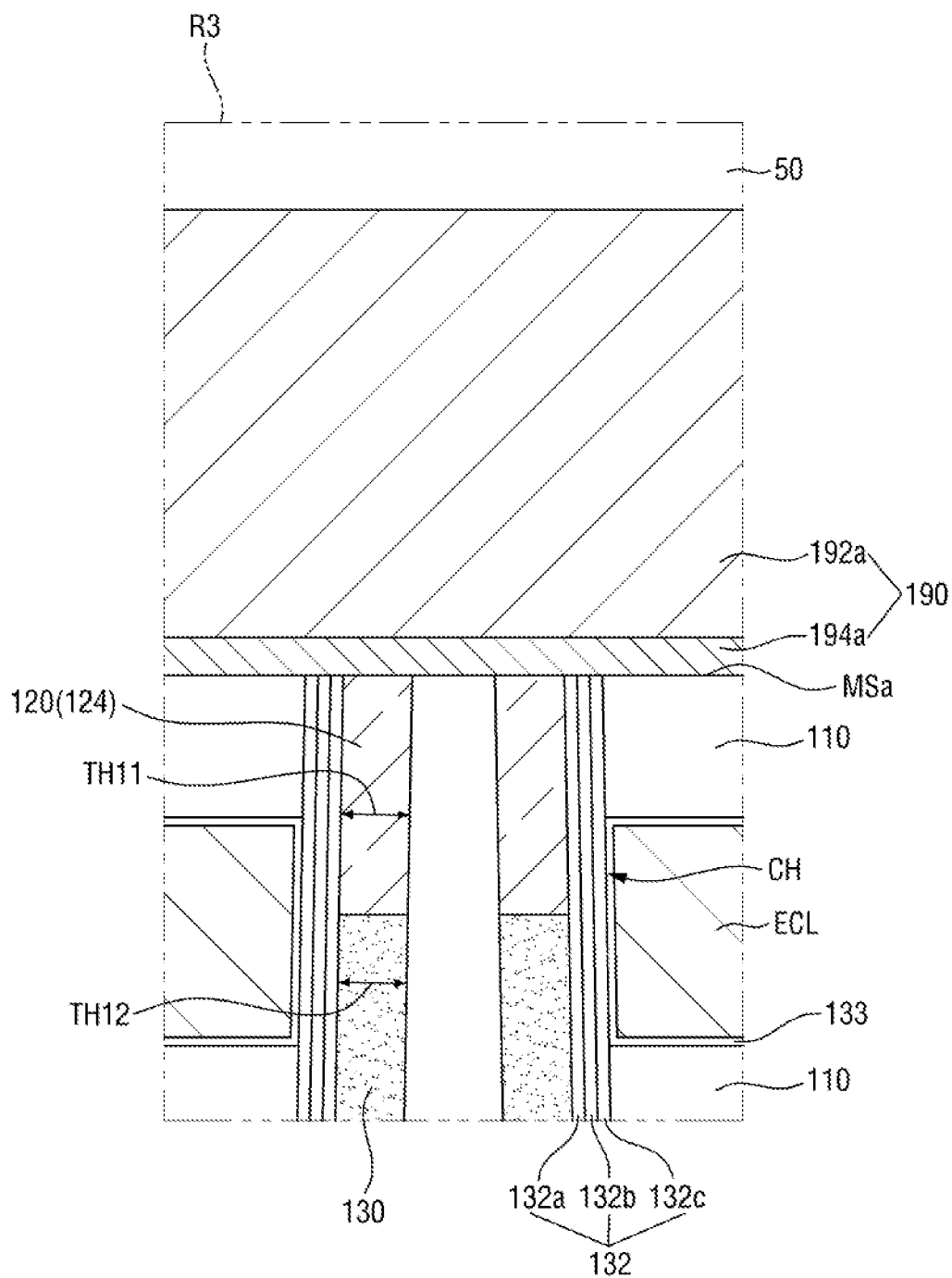
FIGS. 11A and 11B are various enlarged views of region R3 of FIG. 10.
Figure 11B:
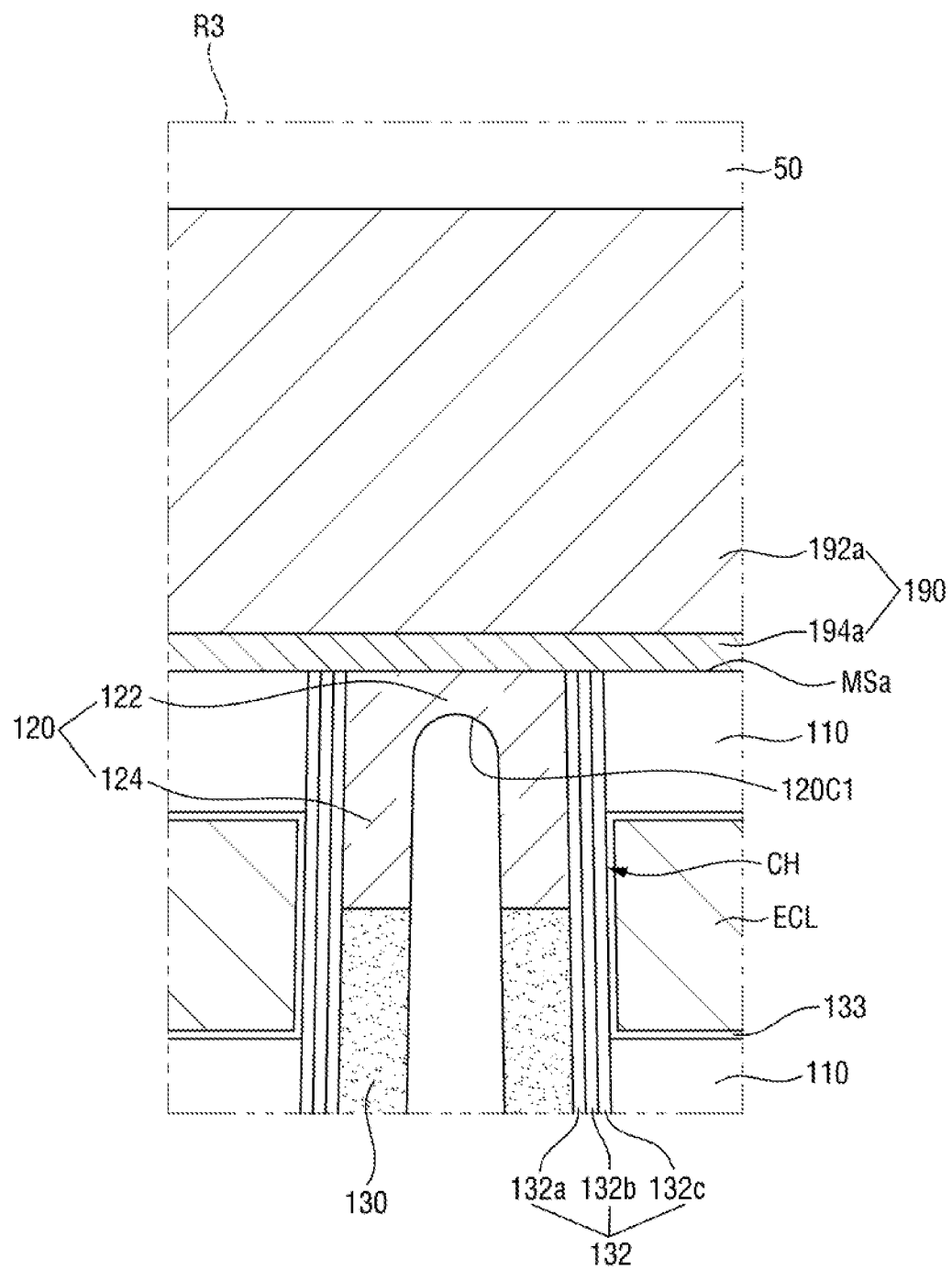

FIG. 10 is a cross-sectional view for explaining a nonvolatile memory device according to an exemplary embodiment of the present invention. FIGS. 11A and 11B are various enlarged views of region R3 of FIG. 10. For the sake of convenience of description, repeated parts of contents explained with reference to FIGS. 1 to 5B will be briefly described or omitted.

Referring to FIGS. 10 and 11A, in the nonvolatile memory device according to an exemplary embodiment of the present invention, the first surface MSa of the mold structures MS1 and MS2 is in contact with the first source structure 190.

The first mold insulation film 110 closest to the first surface MSa of the mold structures MS1 and MS2 may be in contact with the first barrier conductive film 194*a*. For example, the first substrate 10 may not be interposed between the first mold insulation film 110 and the first barrier conductive film 194*a*.

In an exemplary embodiment of the present invention, the first impurity pattern 120 may have a tubular shape extending in the third direction Z. For example, the first impurity pattern 120 may not completely cover the first barrier conductive film 194*a* exposed by the channel hole CH. In an exemplary embodiment of the present invention, the filling insulation pattern 134 may penetrate the first impurity pattern 120 and be in contact with the first barrier conductive film 194*a*.

In an exemplary embodiment of the present invention, the thickness TH11 of the first impurity pattern 120 may be the same as the thickness TH12 of the first semiconductor pattern 130.

Referring to FIGS. 10 and 11B, in the nonvolatile memory device according to an exemplary embodiment of the present invention, the first impurity pattern 120 covers the first barrier conductive film 194*a* exposed by the channel hole CH.

The first impurity pattern 120 may include a filling part 122 that completely covers the first barrier conductive film 194*a* exposed by the channel hole CH. In an exemplary embodiment of the present invention, the filling insulation pattern 134 may be spaced apart from the first barrier conductive film 194*a*.

Each of FIG. 11A and FIG. 11B shows that the interface between the first impurity pattern 120 and the first semiconductor pattern 130 overlaps (e.g., overlaps in a direction perpendicular to the extending direction of the channel hole) the erasing control line ECL. However, the present invention is not limited thereto. For example, in an exemplary embodiment of the present invention, the first surface MSa of the mold structures MS1 and MS2 is in contact with the first source structure 190, and the erasing control line ECL may be completely overlapped (e.g., overlap in a direction perpendicular to the extending direction of the channel hole) by the first semiconductor pattern 130.

Figure 12:
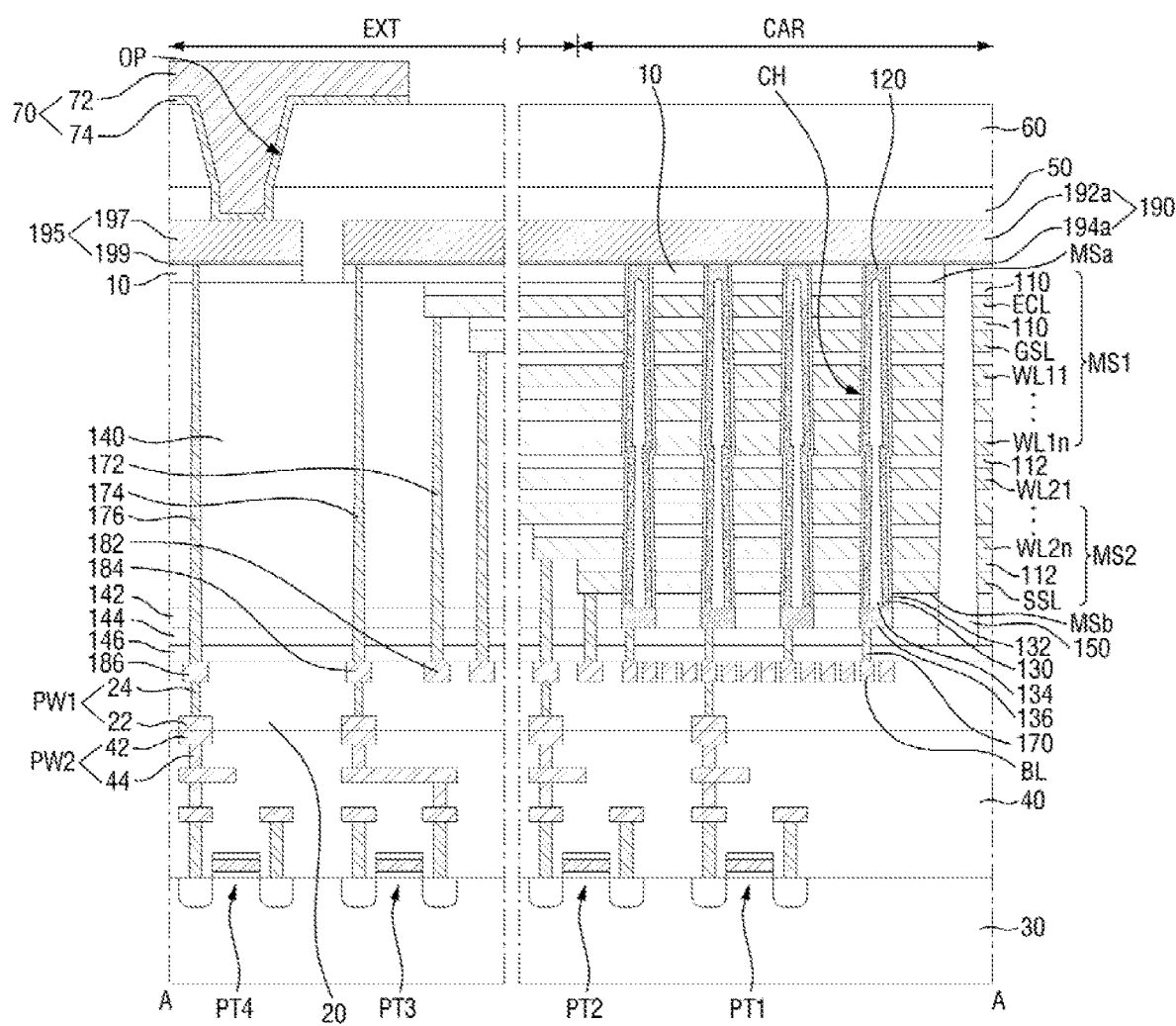
FIGS. 12 to 14 are various cross-sectional views for explaining a nonvolatile memory device according to an exemplary embodiment of the present invention.
Figure 13:
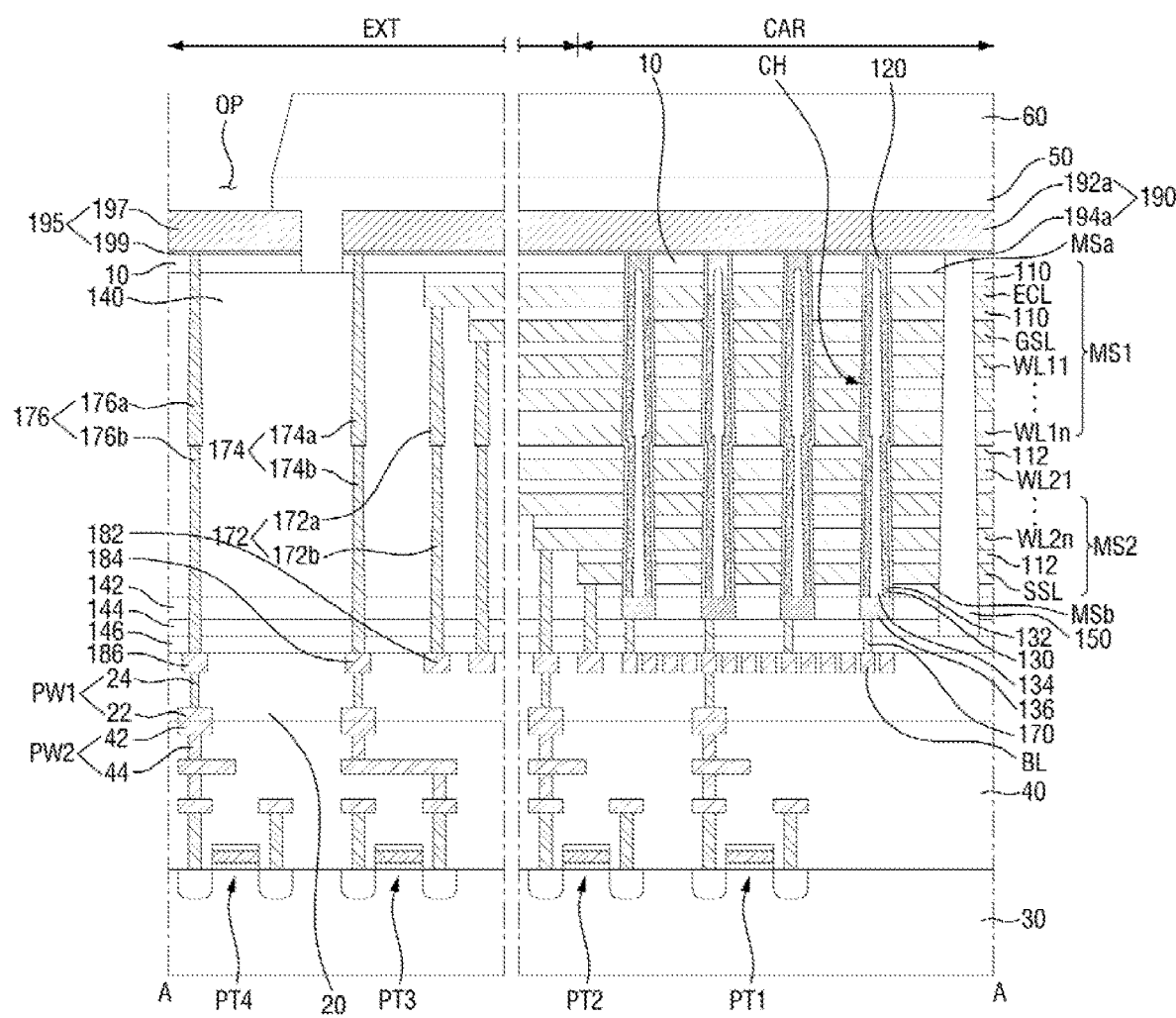
Figure 14:
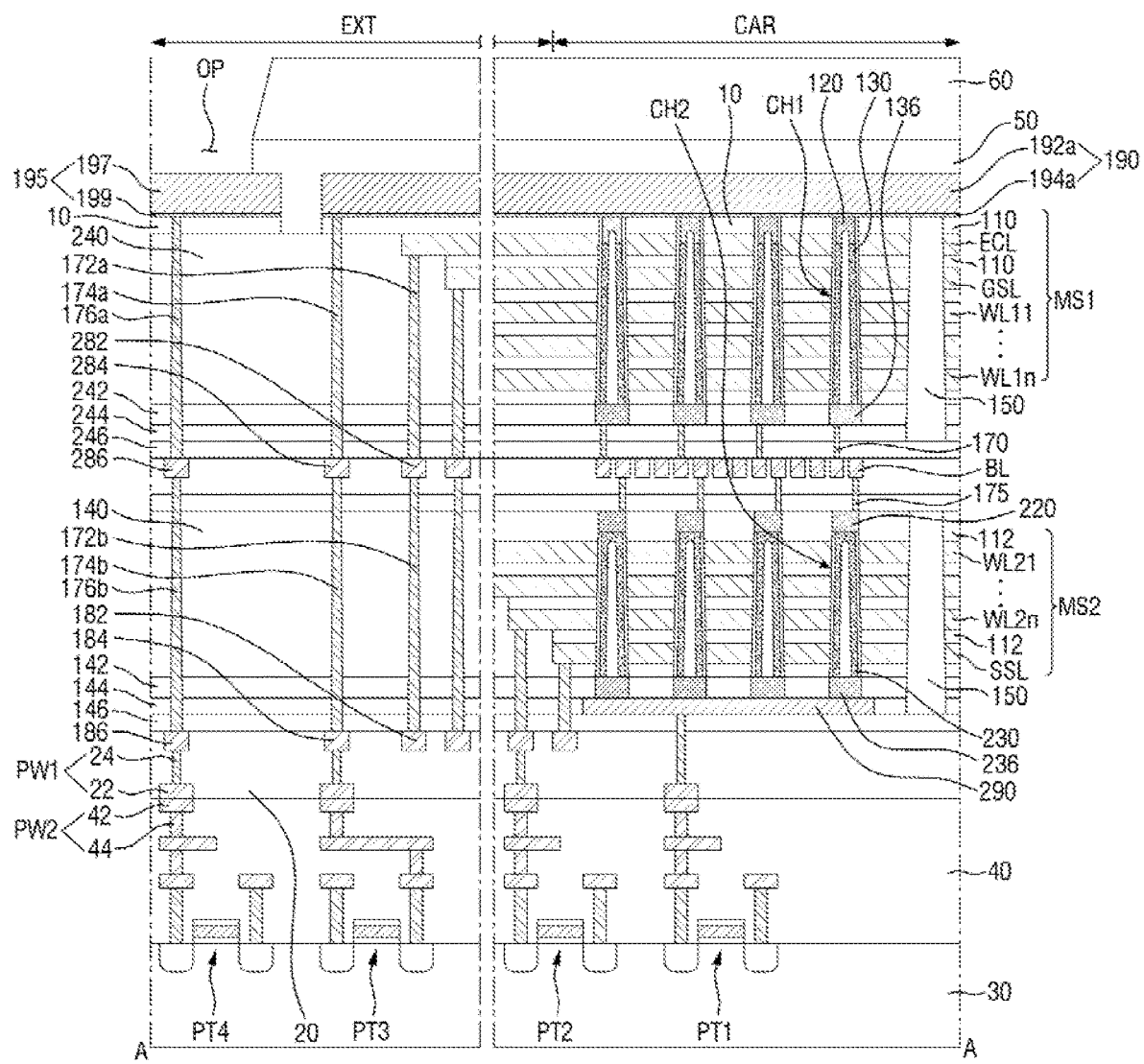

FIGS. 12 to 14 are various cross-sectional views for explaining a nonvolatile memory device each according to an exemplary embodiment of the present invention. For the sake of convenience of description, repeated parts of contents explained with reference to FIGS. 1 to 5B will be briefly described or omitted.

Referring to FIG. 12, the nonvolatile memory device according to an exemplary embodiment of the present invention further includes a rewiring structure 70.

The rewiring structure 70 may be formed on the first inter-wiring insulation film 50 and the passivation film 60. The rewiring structure 70 may be connected to the input/output pad 195 through the opening OP.

In an exemplary embodiment of the present invention, the rewiring structure 70 may include a rewiring barrier conductive film 74 and a rewiring 72.

The rewiring barrier conductive film 74 may extend along the upper surface of the passivation film 60 and the profile of the opening OP, and may be connected to the input/output pad 195. The rewiring barrier conductive film 74 may prevent the diffusion of elements contained in the rewiring 72. For example, the rewiring barrier conductive film 74 may include, but is not limited to, titanium (Ti), titanium nitride (TiN), tantalum (Ta), tantalum nitride (TaN), or a combination thereof.

The rewiring 72 may be formed on the rewiring barrier conductive film 74. The rewiring 72 may include, for example, but is not limited to, tungsten (W), aluminum (Al), copper (Cu), or a combination thereof.

Referring to FIG. 13, in the nonvolatile memory device according to an exemplary embodiment of the present invention, the gate contact 172 has a step between the first mold structure MS1 and the second mold structure MS2.

The gate contact 172 may include a first gate contact 172a and a second gate contact 172b. The first gate contact 172a may be connected to each of the first gate electrodes ECL, GSL and WL11 to WL1n, and the second gate contact 172b may be connected to each of the second gate electrodes WL21 to WL2n and SSL. Each of the second gate electrodes WL21 to WL2n and SSL may also be connected to the third wiring 182. At this time, the width of the first gate contact 172a may be greater than the width of the second gate contact 172b at the interface between the first gate contact 172a and the second gate contact 172b.

In an exemplary embodiment of the present invention, the source contact 174 may have a step in the first interlayer insulation film 140. For example, the source contact 174 may include a first source contact 174a and a second source contact 174b. The first source contact 174a may be in contact with the first source structure 190, and the second source contact 174b may be in contact with the fourth wiring 184. At this time, the width of the first source contact 174a may be greater than the width of the second source contact 174b at the interface between the first source contact 174a and the second source contact 174b.

In an exemplary embodiment of the present invention, the input/output contact 176 may have a step in the first interlayer insulation film 140. For example, the input/output contact 176 may include a first input/output contact 176a and a second input/output contact 176b. The first input/output contact 176a may be in contact with the input/output pad 195, and the second input/output contact 176b may be in contact with the fifth wiring 186. At this time, the width of the first input/output contact 176a may be greater than the width of the second input/output contact 176b at the interface between the first input/output contact 176a and the second input/output contact 176b.

Referring to FIG. 14, in a nonvolatile memory device according to an exemplary embodiment of the present invention, a bit line BL is interposed between the first mold structure MS1 and the second mold structure MS2.

The fifth to eighth interlayer insulation films 240, 242, 244 and 246 sequentially stacked from the first mold structure MS1 may be formed between the first mold structure MS1 and the second mold structure MS2. The bit line BL may be formed on the eighth interlayer insulation film 246.

In an exemplary embodiment of the present invention, a first channel hole CH1 penetrating the first mold structure MS1, and a second channel hole CH2 penetrating the second mold structure MS2 may be formed. In an exemplary embodiment of the present invention, the first impurity pattern 120 and the first semiconductor pattern 130 may be formed in the first channel hole CH1. In an exemplary embodiment of the present invention, the third impurity pattern 220 and the second semiconductor pattern 230 may be formed in the second channel hole CH2.

In an exemplary embodiment of the present invention, the first bit line contact 170 may penetrate the seventh and eighth interlayer insulation films 244 and 246, and may be connected to the first semiconductor pattern 130. For example, the first bit line contact 170 may be connected to the first semiconductor pattern 130 through the second impurity pattern 136. For example, the bit line BL may be connected to the first semiconductor pattern 130 through the first bit line contact 170.

In an exemplary embodiment of the present invention, the bit line BL may be connected to the second semiconductor pattern 230. For example, the bit line BL may be connected to the second semiconductor pattern 230 through the second bit line contact 175. For example, the second bit line contact 175 may be connected to the second semiconductor pattern 230 through the third impurity pattern 220.

In an exemplary embodiment of the present invention, the second source structure 290 may be formed on the second surface MSb of the mold structures MS1 and MS2. The second source structure 290 may extend along the second surface MSb of the mold structures MS1 and MS2. For example, the second source structure 290 may be formed in the third interlayer insulation film 144.

The second source structure 290 may be connected to the second semiconductor pattern 230. For example, a fourth impurity pattern 236 connected to the second semiconductor pattern 230 may be formed on the second surface MSb of the mold structures MS1 and MS2. The second source structure 290 may be in contact with the fourth impurity pattern 236, and may be connected to the second semiconductor pattern 230. For example, the fourth impurity pattern 236 may be interposed between the second source structure 290 and the second semiconductor pattern 230.

The first source structure 190 may be provided as the common source line of the first mold structure MS1, and the second source structure 290 may be provided as the common source line of the second mold structure MS2.

In an exemplary embodiment of the present invention, sixth to eighth wirings 282, 284 and 286 may be formed between the first mold structure MS1 and the second mold structure MS2. The sixth wiring 282 may connect the first gate contact 172a and the second gate contact 172b. The seventh wiring 284 may connect the first source contact 174a and the second source contact 174b. The eighth wiring 286 may connect the first input/output contact 176a and the second input/output contact 176b.

Hereinafter, a method for fabricating a nonvolatile memory device according to an exemplary embodiment of the present invention will be described with reference to FIGS. 15 to 31.

FIGS. 15 to 30 are intermediate stage diagrams for explaining a method for fabricating a nonvolatile memory device according to an exemplary embodiment of the present invention. For convenience of description, repeated parts of contents explained with reference to FIGS. 1 to 14 will be briefly described or omitted.

Figure 15:
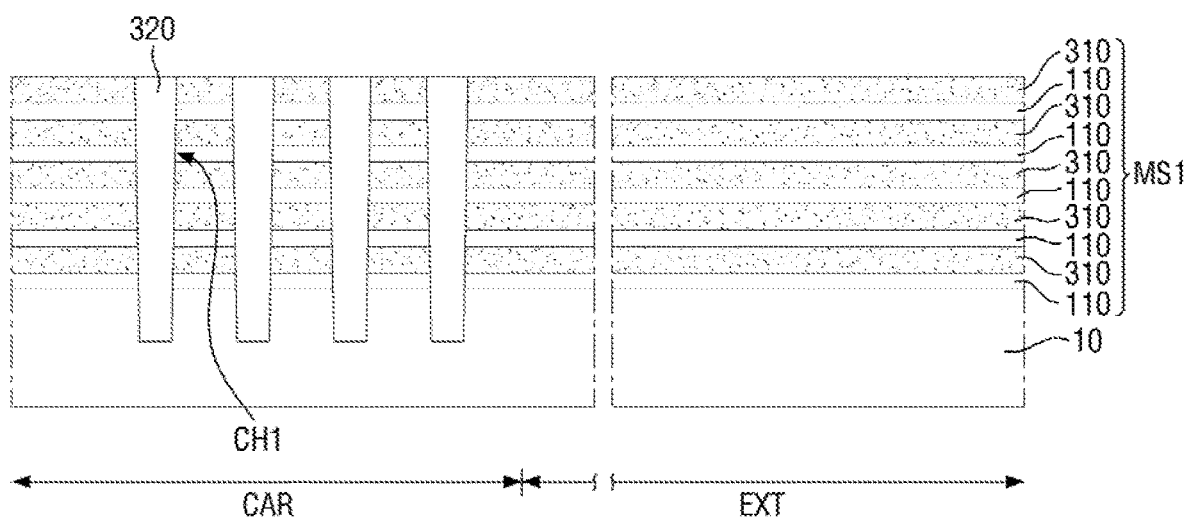
FIGS. 15 to 30 are intermediate stage diagrams for explaining a method for fabricating a nonvolatile memory device according to an exemplary embodiment of the present invention.

Referring to FIG. 15, the first mold structure MS1 is formed on the first substrate 10.

First, a first substrate 10 may be provided. The first substrate 10 may include a cell array region CAR and an extension region EXT. In an exemplary embodiment of the present invention, the first substrate 10 may include impurities. For example, the first substrate 10 may include n-type impurities (e.g., phosphorus (P), arsenic (As), etc.).

Next, a first mold structure MS1 may be formed on the first substrate 10. The first mold structure MS1 may include a plurality of first mold insulation films 110 and a plurality of first sacrificial films 310 alternately stacked on the first substrate 10. The first mold insulation film 110 and the first sacrificial film 310 may have an etching selectivity to each other. For example, a good etching electivity of the first mold insulation film 110 over the first sacrificial film 310 may be obtained by using one etchant under one etching condition, while a good etching electivity of the first sacrificial film 310 over the first mold insulation film 110 may be obtained by using another different etchant under another different etching condition. For example, although the first mold insulation film 110 may include silicon oxide ($SiO_2$), and the first sacrificial film 310 may include silicon nitride ($Si_3N_4$), the present invention is not limited thereto.

The first mold structure MS1 may include a first channel hole CH1. The first channel hole CH1 may penetrate the first mold structure MS1. In an exemplary embodiment of the present invention, the first channel hole CH1 may be recessed into a part of the first substrate 10. For example, a part (e.g. a top portion) of the first substrate 10 may be etched away in the forming of the first channel hole CH1. For example, a lower surface of the first channel hole CH1 may be lower than an uppermost surface of the first substrate 10.

In an exemplary embodiment of the present invention, a first sacrificial pattern 320 that fills the first channel hole CH1 may be formed. The first sacrificial pattern 320 may have an etching selectivity with respect to the first mold insulation film 110 and the first sacrificial film 310. Accordingly, the first sacrificial pattern 320 may be selectively etched away without significant film loss of the first mold insulation film 110 and the first sacrificial film 310. For example, the first sacrificial pattern 320 may include, but is not limited to, polysilicon (p-Si).

Figure 16:
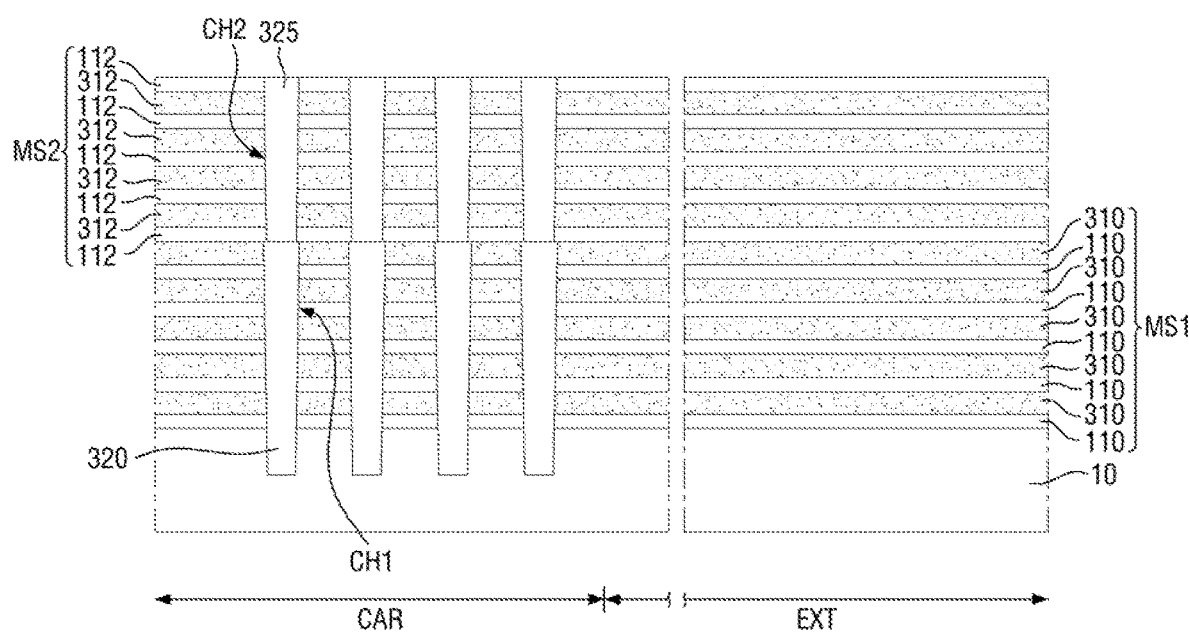

Referring to FIG. 16, a second mold structure MS2 is formed on the first mold structure MS1.

The second mold structure MS2 may include a plurality of second mold insulation films 112 and a plurality of second sacrificial films 312 alternately stacked on the first mold structure MS1. The second mold insulation film 112 and the second sacrificial film 312 may have an etching selectivity to each other. For example, a good etching electivity of the second mold insulation film 112 over the second sacrificial film 312 may be obtained by using one etchant under one etching condition, while a good etching electivity of the second sacrificial film 312 over the second mold insulation film 112 may be obtained by using another different etchant under another different etching condition. For example, although the second mold insulation film 112 may include silicon oxide ($SiO_2$) and the second sacrificial film 312 may include silicon nitride ($Si_3N_4$), the present invention is not limited thereto.

The second mold structure MS2 may include a second channel hole CH2. The second channel hole CH2 may penetrate the second mold structure MS2. In an exemplary embodiment of the present invention, the second channel hole CH2 may expose the first sacrificial pattern 320.

In an exemplary embodiment of the present invention, a second sacrificial pattern 325 that fills the second channel hole CH2 may be formed. The second sacrificial pattern 325 may have an etching selectivity with respect to the second mold insulation film 112 and the second sacrificial film 312. Accordingly, the second sacrificial pattern 325 may be selectively etched away without significant film loss of the second mold insulation film 112 and the second sacrificial film 312. For example, the second sacrificial pattern 325 may include, but is not limited to, polysilicon (p-Si).

Figure 17:
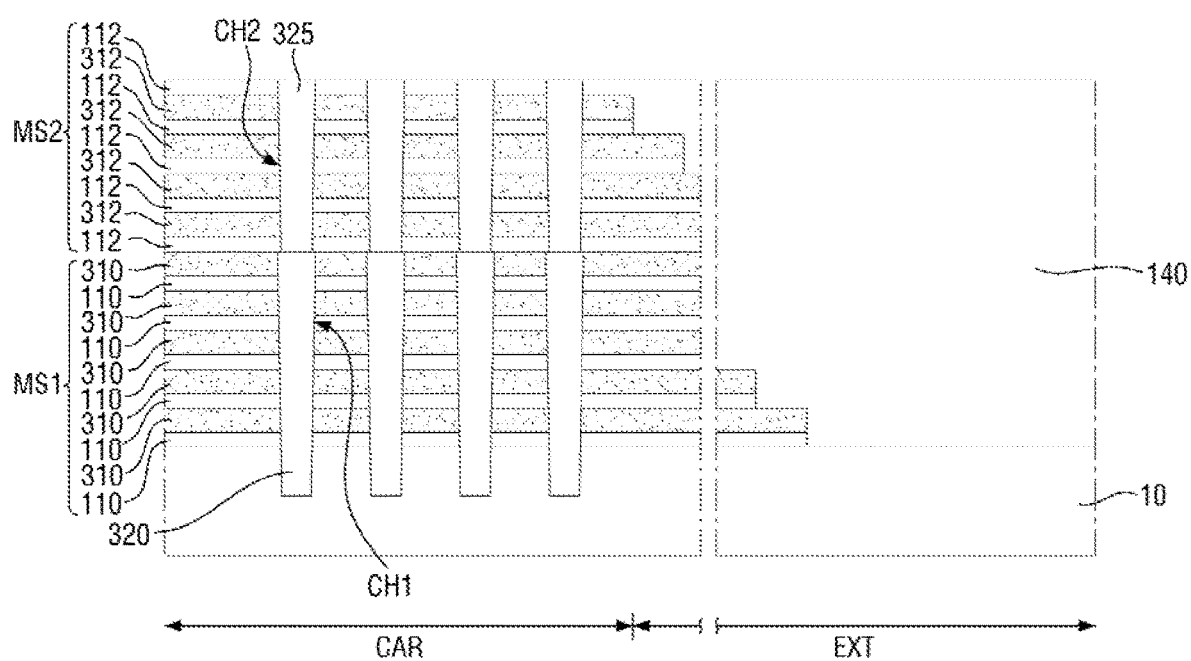

Referring to FIG. 17, the first mold structure MS1 and the second mold structure MS2 of the extension region EXT are patterned.

The first mold structure MS1 and the second mold structure MS2 of the extension region EXT may be patterned in a step shape. For example, the first mold insulation film 110 and the first sacrificial film 310 may be stacked in a stepwise form, and the second mold insulation film 112 and the second sacrificial film 312 may be stacked in a stepwise form. For example, the steps included in the first mold insulation film 110 and the first sacrificial film 310 may have lengths extending in the second direction Y, and the lengths may gradually decrease from the lowermost one toward the uppermost one thereof. Also, the steps included in the second mold insulation film 112 and the second sacrificial film 312 may have lengths extending in the second direction Y, and the lengths may gradually decrease from the lowermost one toward the uppermost one thereof.

Next, a first interlayer insulation film 140 that covers the first mold structure MS1 and the second mold structure MS2 may be formed.

Figure 18:
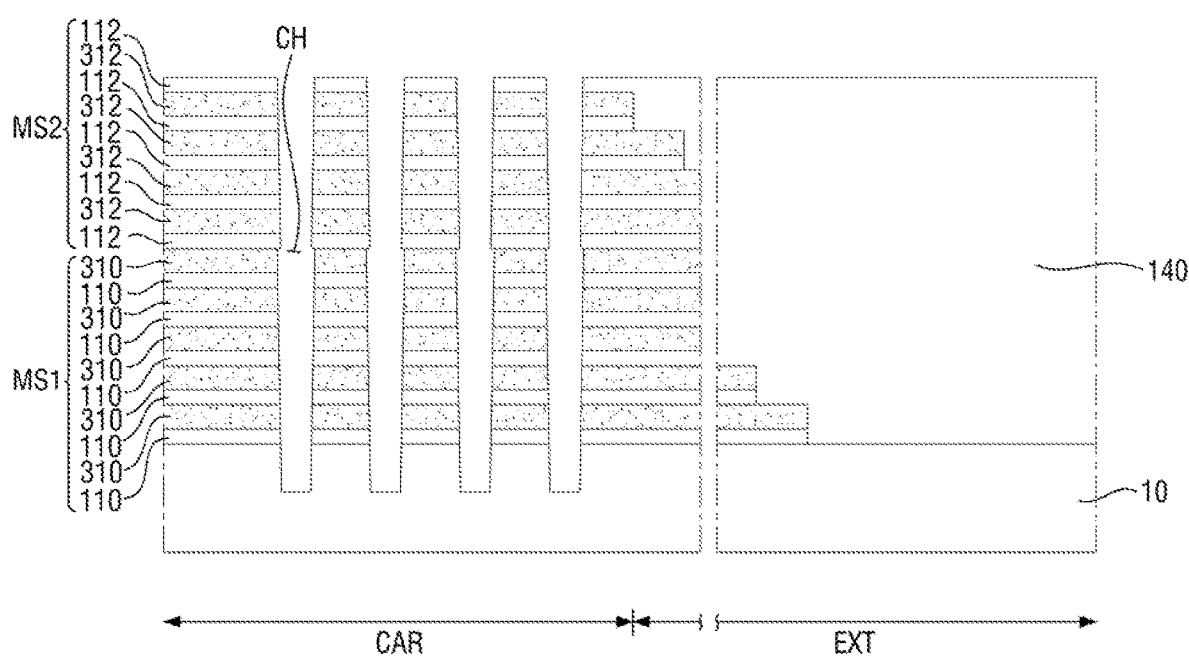

Referring to FIG. 18, a channel hole CH which penetrates the first mold structure MS1 and the second mold structure MS2 is formed.

The first sacrificial pattern 320 and the second sacrificial pattern 325 may be removed. This allows the first channel hole CH1 and the second channel hole CH2 to communicate with each other to form a channel hole CH.

Figure 19:
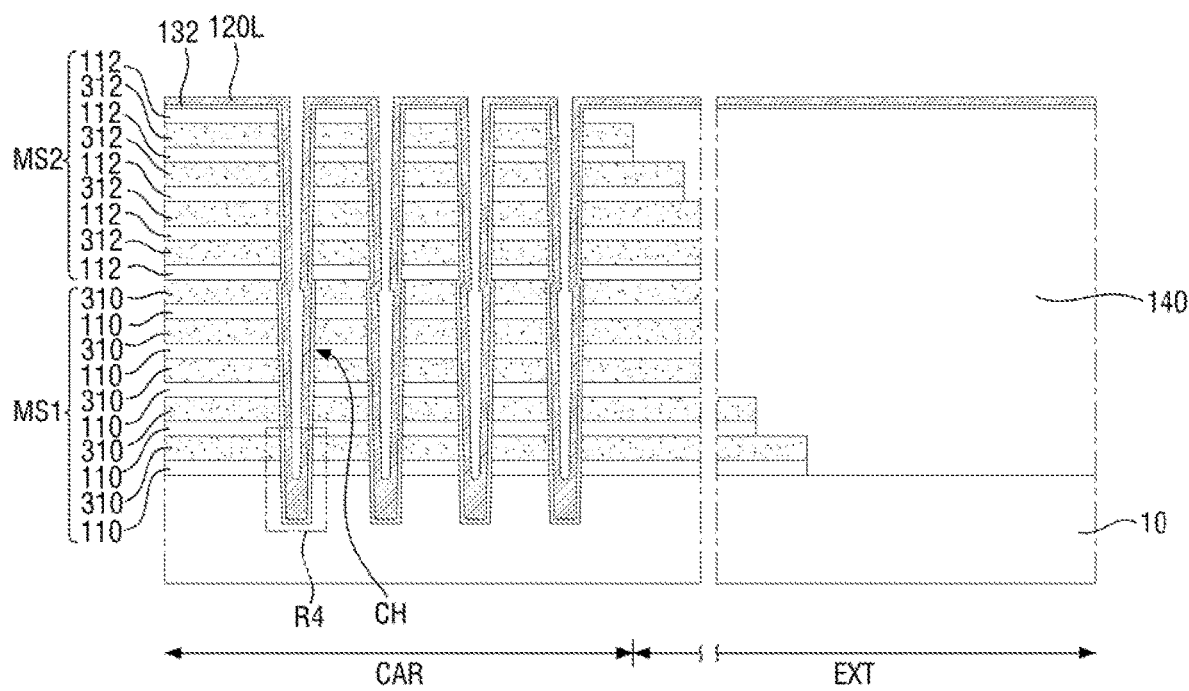
Figure 20A:
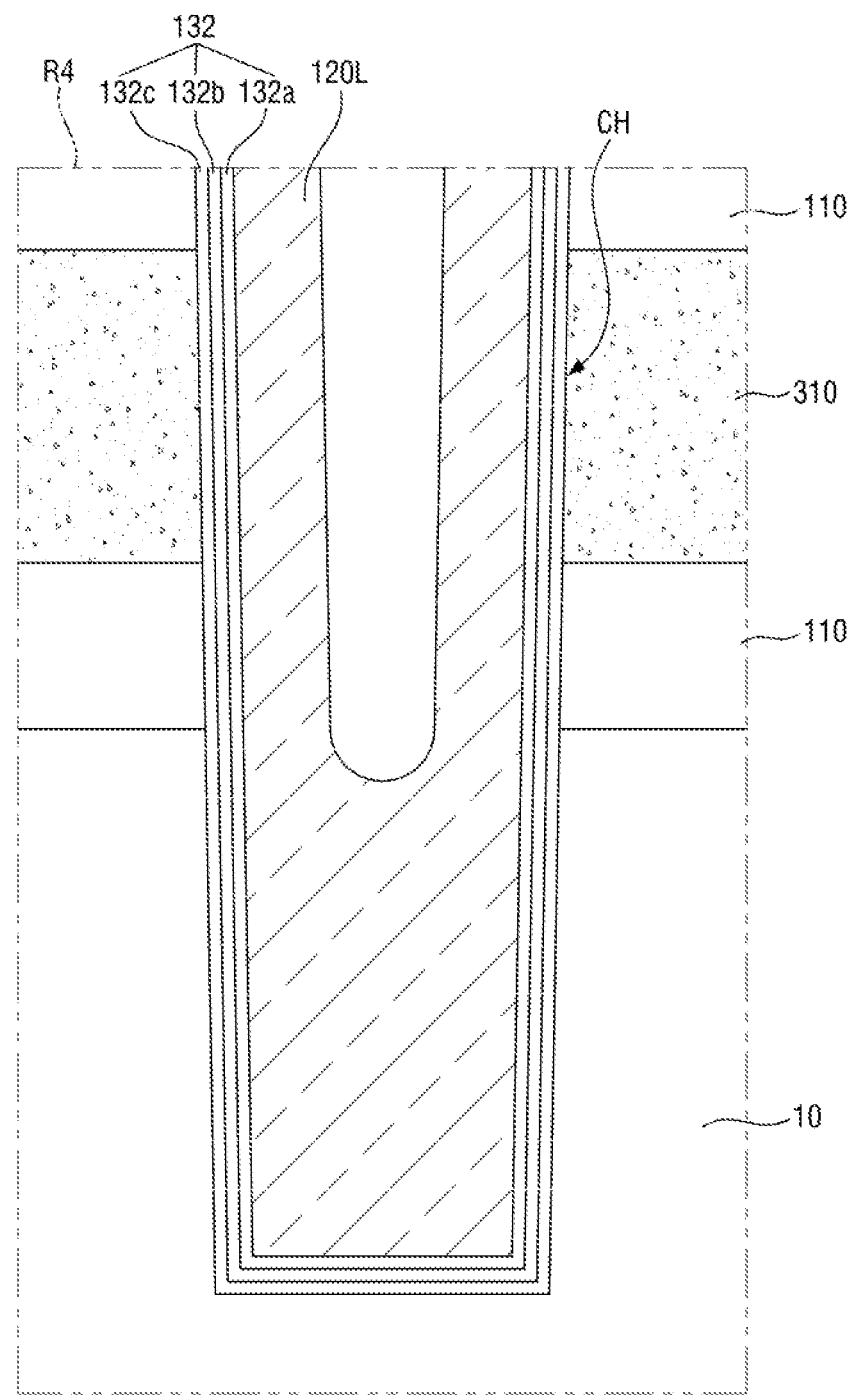
Figure 20B:
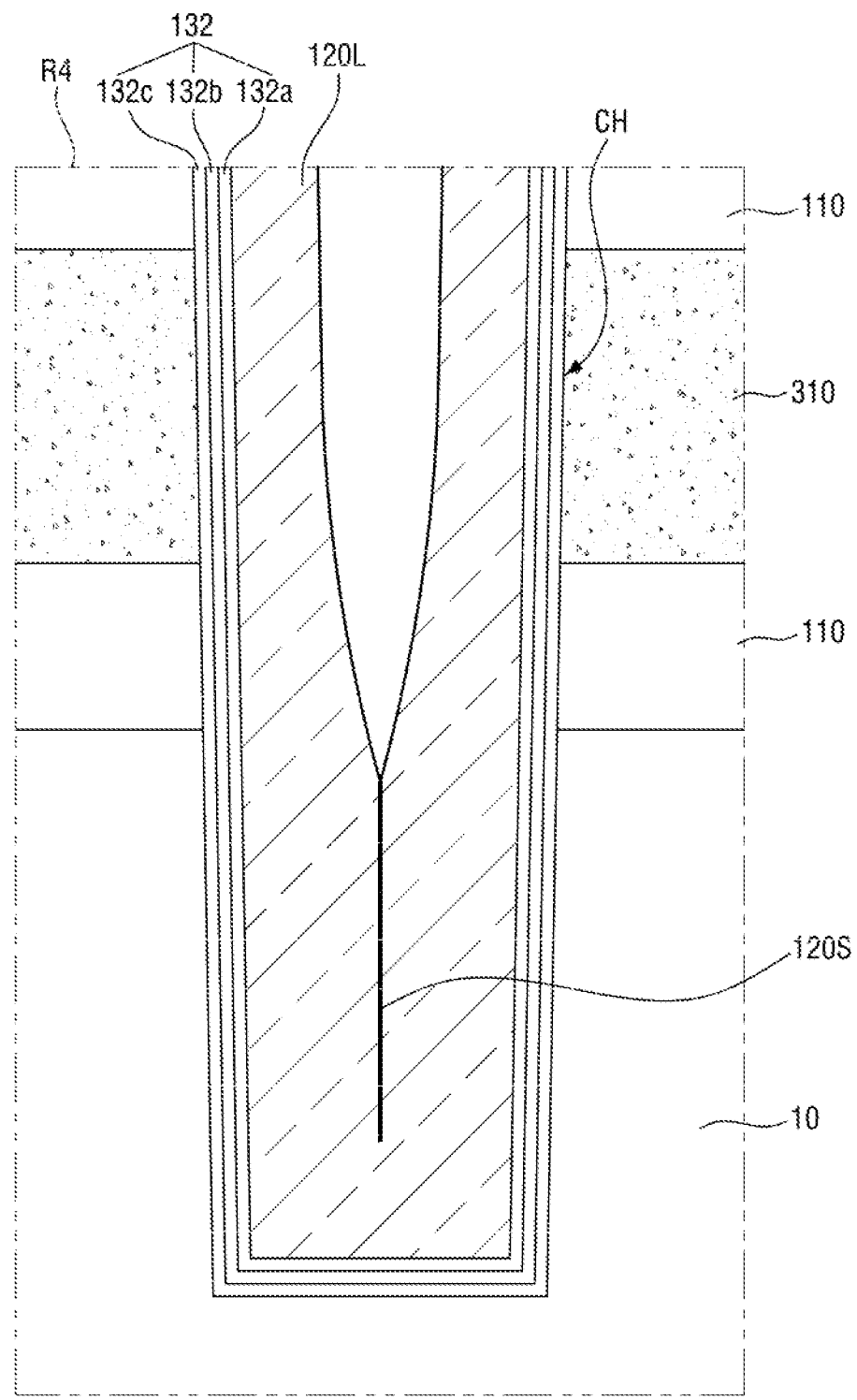

Referring to FIGS. 19 to 20B, an information storage film 132 and an impurity film 120L are formed in the channel hole CH. For reference, FIGS. 20A and 20B are various enlarged views of part R4 of FIG. 19.

The information storage film 132 may extend along the profile of the channel hole CH. In an exemplary embodiment of the present invention, the information storage film 132 may include a blocking insulation film 132c, a charge storage film 132b and a tunnel insulation film 132a that are sequentially stacked in the channel hole CH.

The impurity film 120L may be formed on the information storage film 132, and may extend along the profile of the information storage film 132. The tunnel insulation film 132a may be in contact with the impurity film 120L. The impurity film 120L may be formed by, for example, a vapor deposition process. In an exemplary embodiment of the present invention, the impurity film 120L may fill at least a part of the channel hole CH formed in the first substrate 10.

The impurity film 120L may be a semiconductor film containing impurities. The impurity film 120L may include, but is not limited to, a semiconductor material such as single crystal silicon (Si), polycrystalline silicon (Si), organic semiconductor substance, or carbon (C) nanostructure. In an exemplary embodiment of the present invention, the impurity film 120L may include n-type impurities (e.g., phosphorus (P), arsenic (As), etc.).

As shown in FIG. 20B, in an exemplary embodiment of the present invention, the impurity film 120L may include a seam 120S. The seam 120S may be attributed to, for example, the characteristics of the vapor deposition process of forming the impurity film 120L.

Figure 21:
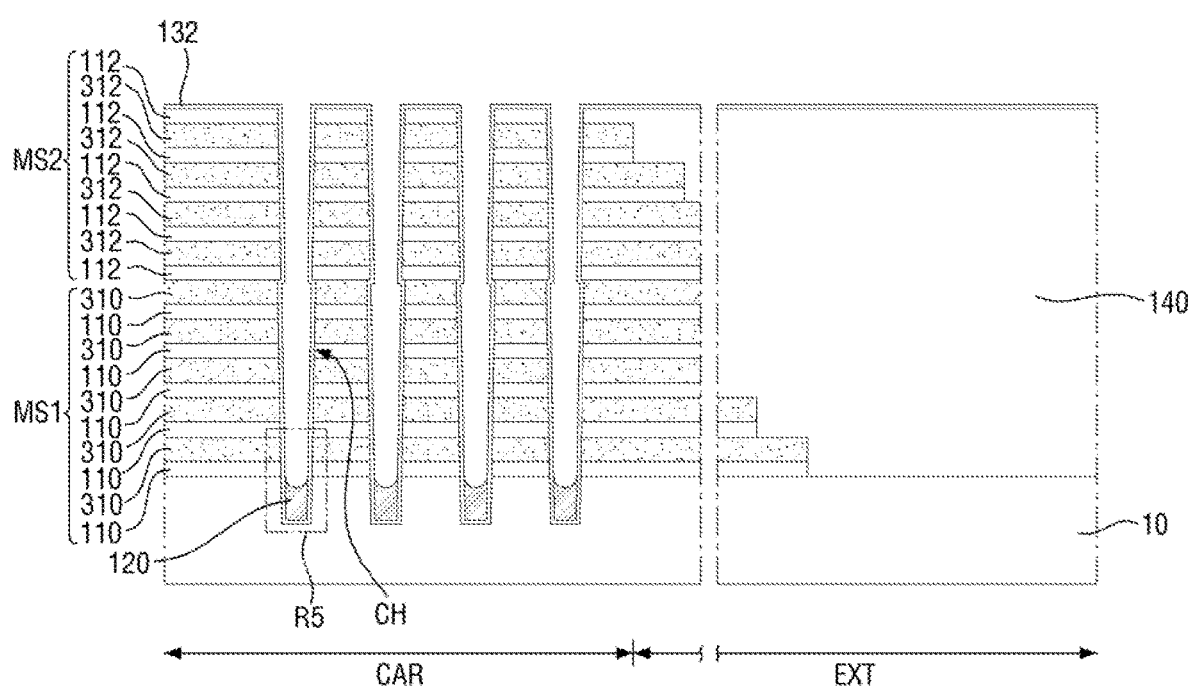
Figure 22A:
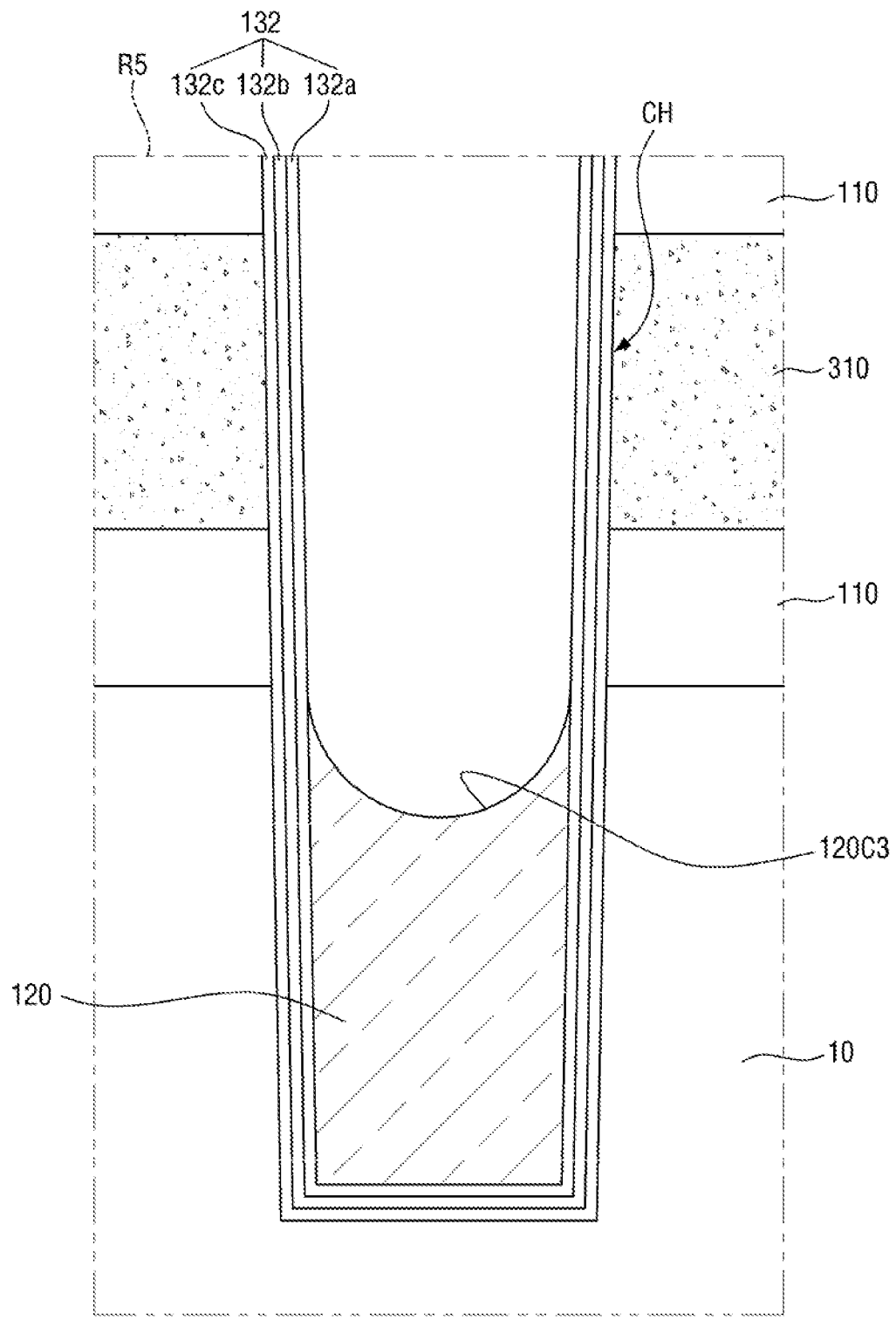
Figure 22B:
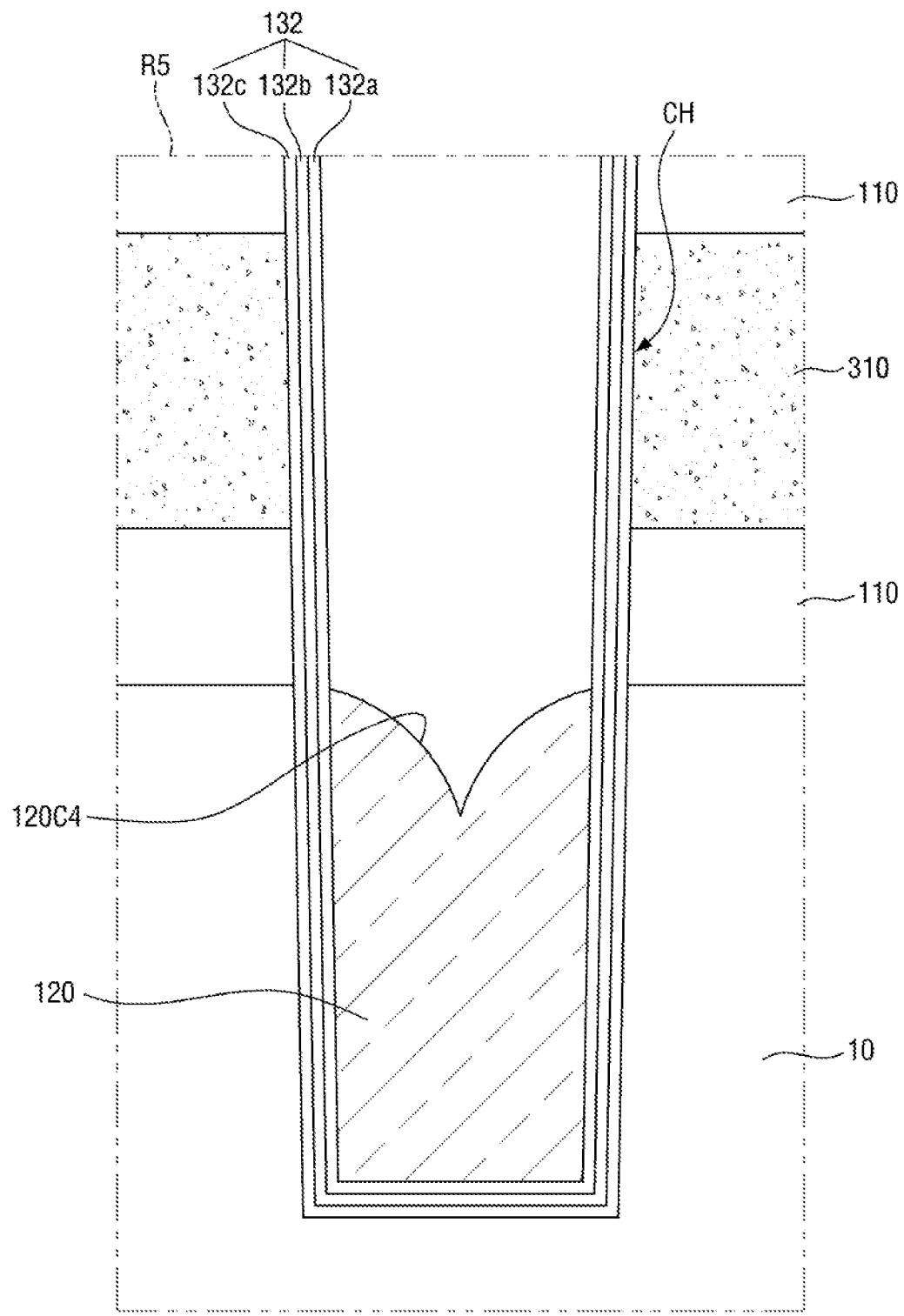

Referring to FIGS. 21 to 22B, a first impurity pattern 120 is formed. For reference, FIGS. 22A and 22B are various enlarged views of part R5 of FIG. 21.

The upper part of the impurity film 120L may be removed through the channel hole CH. Accordingly, the first impurity pattern 120 that fills at least a part of the channel hole CH formed in the first substrate 10 may be formed. The first impurity pattern 120 may be formed, for example, by a trim process. In an exemplary embodiment of the present invention, the trim process may be an isotropic etching process, and portions of the impurity film 120L formed over the second mold structure MS2 and formed along the sidewall of the channel hole CH may be removed while a portion of the impurity film 120L formed to fill a part of the channel hole CH near the bottom of the channel hole CH may remain.

As shown in FIG. 22A, in an exemplary embodiment of the present invention, the first impurity pattern 120 may include a concave third surface 120C3. The third surface 120C3 may be attributed to, for example, the characteristics of the trim process of forming the first impurity pattern 120.

As shown in FIG. 22B, in an exemplary embodiment of the present invention, the first impurity pattern 120 may include a convex fourth surface 120C4. The fourth surface 120C4 may be attributed to, for example, the characteristics of the trim process for forming the first impurity pattern 120.

Figure 23:
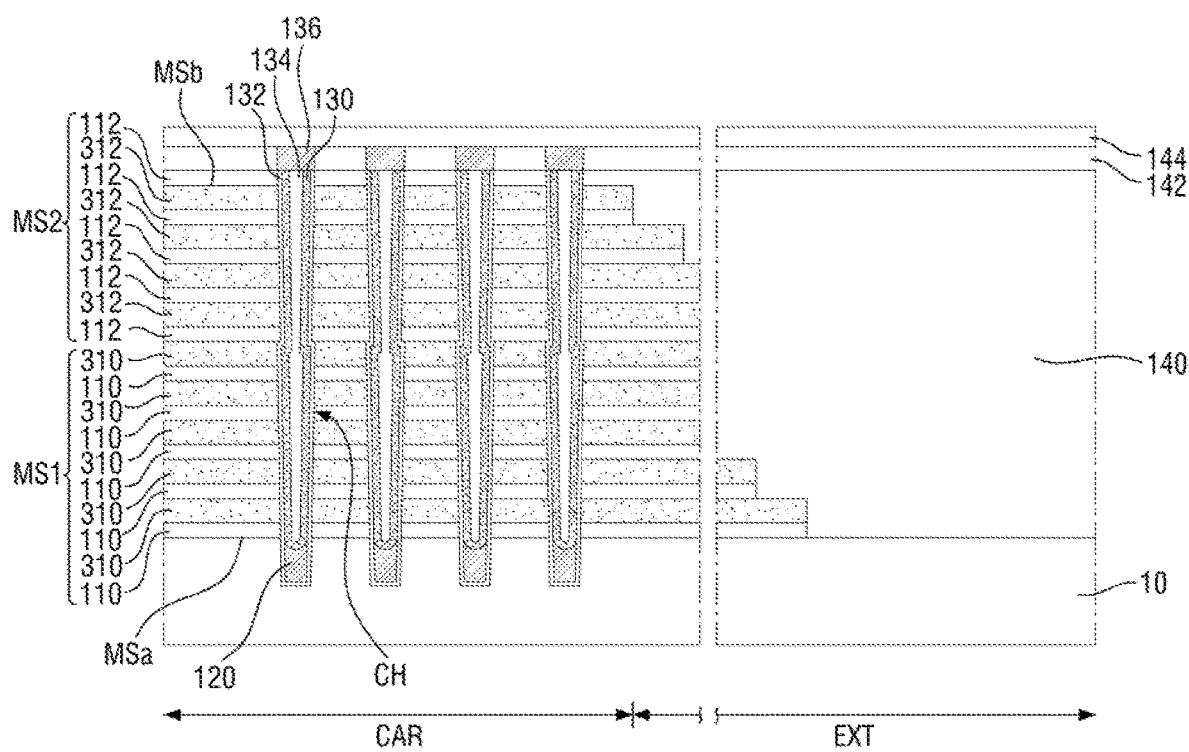

Referring to FIG. 23, the first semiconductor pattern 130 is formed in the channel hole CH.

The first semiconductor pattern 130 may be formed on the first impurity pattern 120 and the information storage film 132. For example, the first semiconductor pattern 130 may extend along the upper surface of the first impurity pattern 120 and side surfaces of the information storage film 132.

The first semiconductor pattern 130 may include, but is not limited to, a semiconductor material such as single crystal silicon (Si), polycrystalline silicon (Si), organic semiconductor substance, or carbon (C) nanostructure.

In an exemplary embodiment of the present invention, the filling insulation pattern 134 may be formed on the first semiconductor pattern 130. The filling insulation pattern 134 may be formed to fill the inside of the tubular first semiconductor pattern 130 and the inside of the tube 124 of the first impurity pattern 120. The filling insulation pattern 134 may include, for example, but is not limited to, silicon oxide ($SiO_2$).

In an exemplary embodiment of the present invention, the second impurity pattern 136 may be formed on the first semiconductor pattern 130 and the filling insulation pattern 134. The second impurity pattern 136 may be formed to be connected to the first semiconductor pattern 130. For example, the second impurity pattern 136 may be formed in the second interlayer insulation film 142 that covers the first interlayer insulation film 140. The second impurity pattern 136 may include, for example, but is not limited to, polysilicon (p-Si) doped with impurities.

Next, a third interlayer insulation film 144 that covers the second impurity pattern 136 and the second interlayer insulation film 142 may be formed.

In an exemplary embodiment of the present invention, a MIC (Metal Induced Crystallization) process or a MILC (Metal Induced Lateral Crystallization) process of the first semiconductor pattern 130 may be further performed. In such a case, the first semiconductor pattern 130 may form a plurality of vertically crystallized crystal regions (e.g., 130a to 130f of FIG. 5B). In an exemplary embodiment of the present invention, in the MIC or MILC process, the first semiconductor pattern 130 may be annealed to cause amorphous silicon (a-Si) to be transformed into polysilicon (p-Si).

Figure 24:
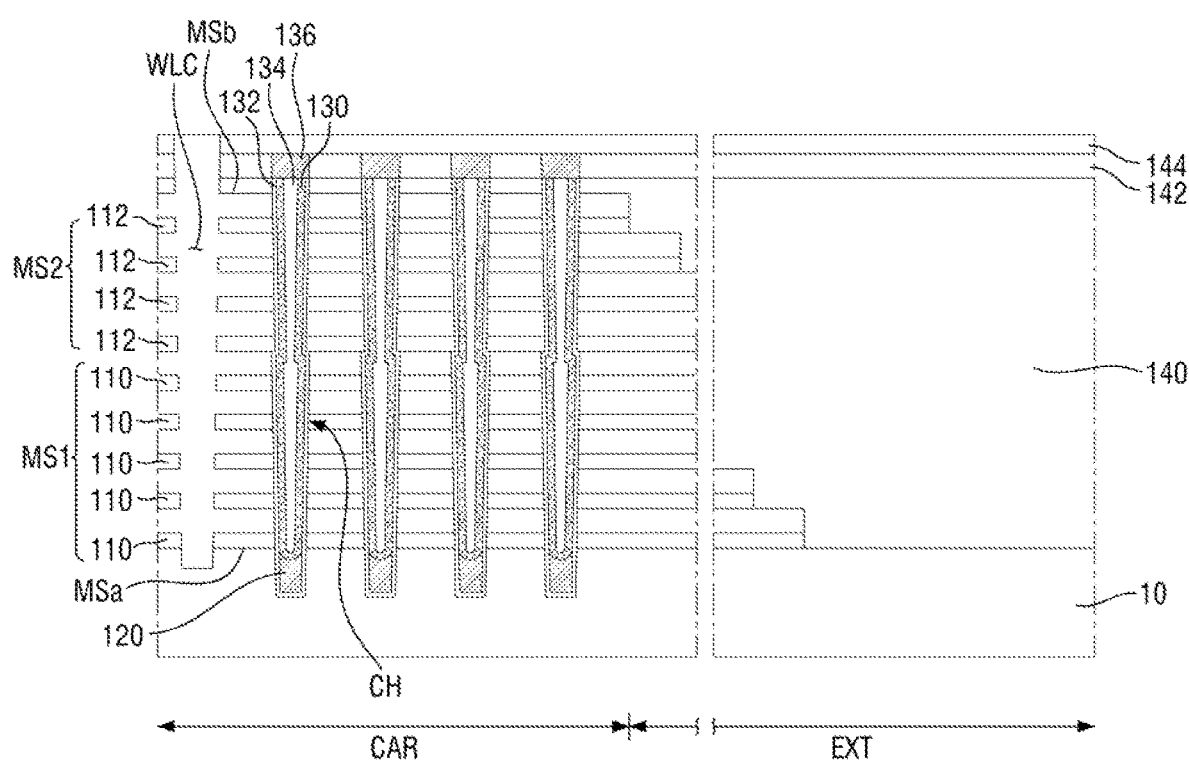

Referring to FIG. 24, the plurality of first sacrificial films 310 and the plurality of second sacrificial films 312 are removed.

For example, a word line cutting region WLC which cuts the first mold structure MS1 and the second mold structure MS2 is formed. The word line cutting region WLC extends from the second surface MSb toward the first surface MSa and may cut the first mold structure MS1 and the second mold structure MS2.

Subsequently, the plurality of first sacrificial films 310 and the plurality of second sacrificial films 312 exposed by the word line cutting regions WLC may be removed. For example, the first and second sacrificial films 310 and 312 may be selectively removed with respect to the first and second mold insulation films 110 and 112 using a wet etching process which is an isotropic etching process. For example, when the first and second sacrificial films 310 and 312 are formed of silicon nitride ($Si_3N_4$), and the first and second mold insulation films 110 and 112 are formed of silicon oxide ($SiO_2$), the etching process may be performed using an etchant including phosphoric acid ($H_3PO_4$).

Figure 25:
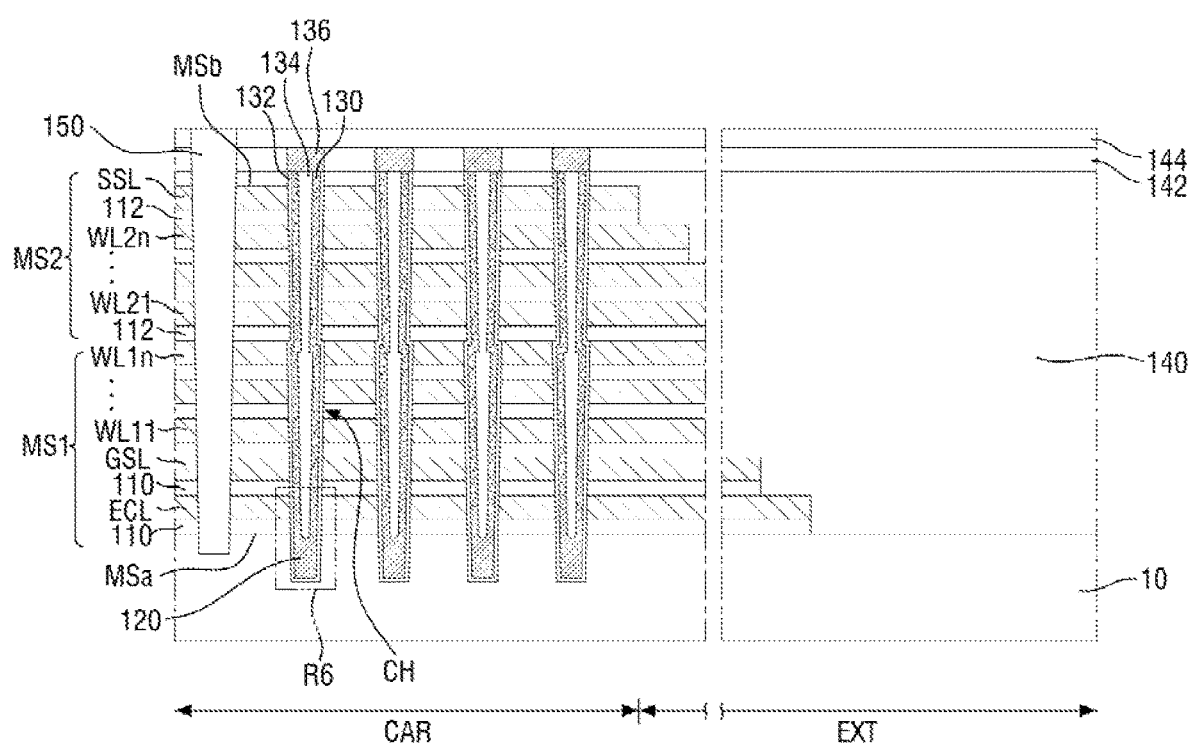
Figure 26A:
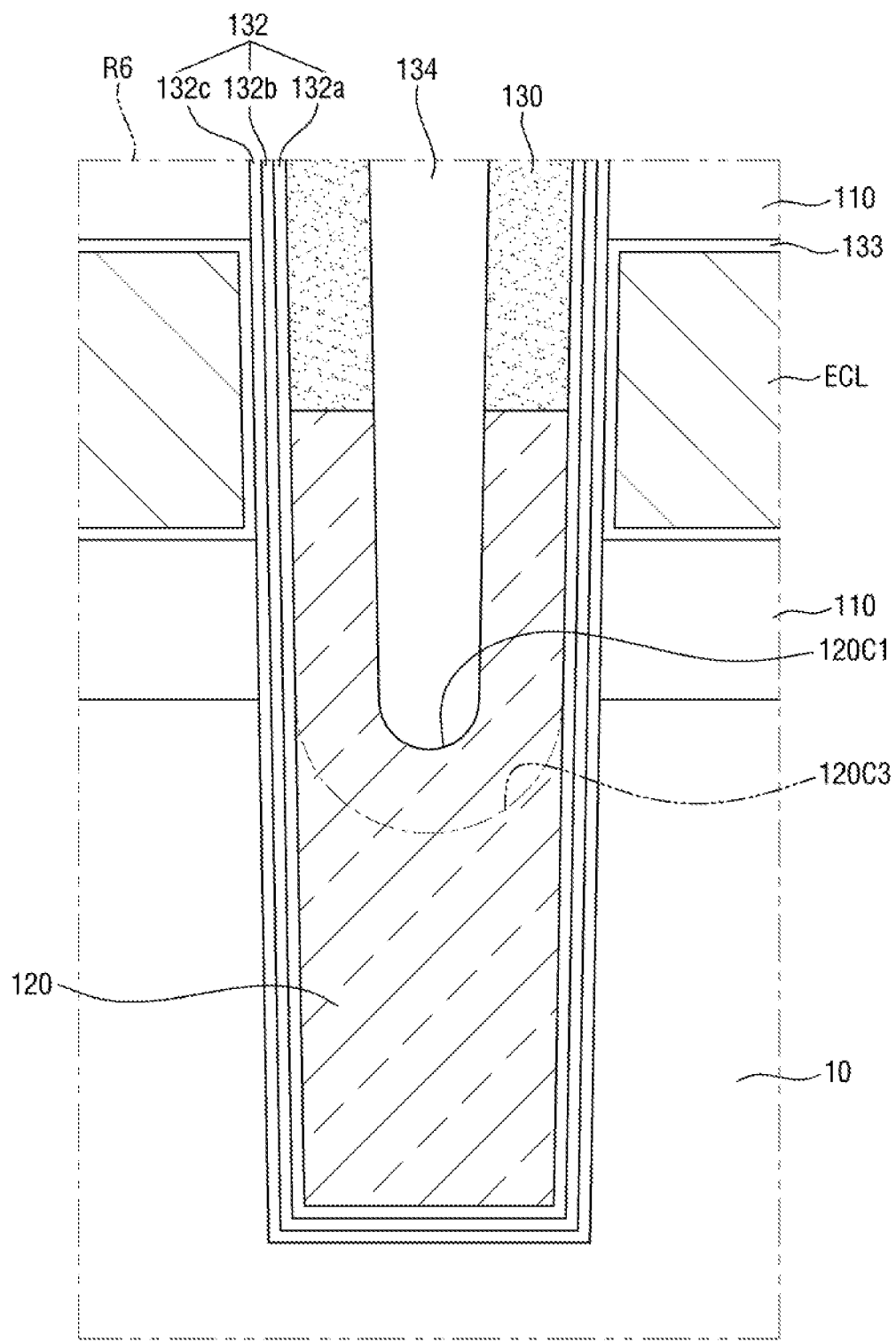
Figure 26B:
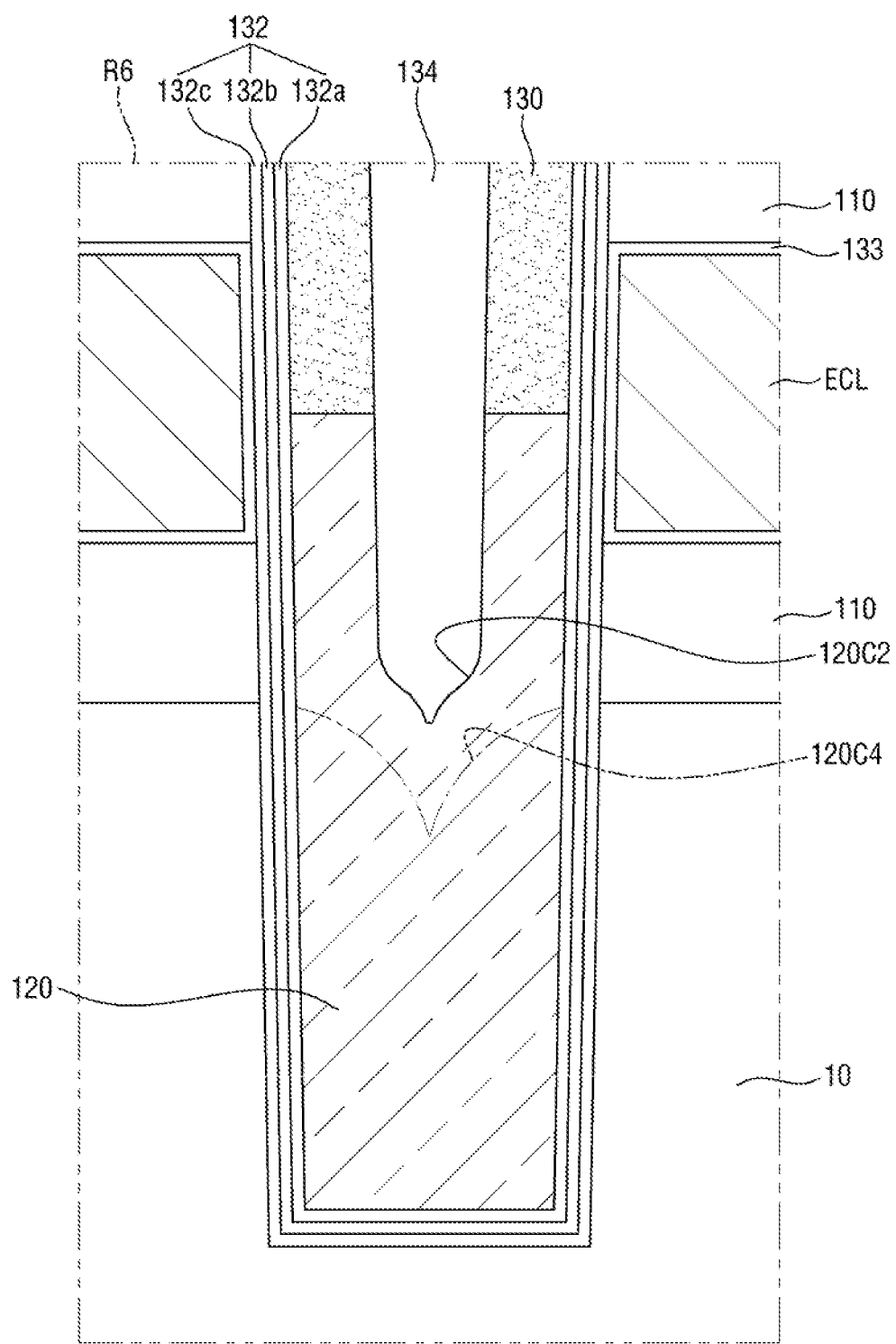

Referring to FIGS. 25 to 26B, gate electrodes ECL, GSL, WL11 to WL1n, WL21 to WL2n and SSL are formed. For reference, FIGS. 26A and 26B are various enlarged views of part R5 of FIG. 25.

The gate electrodes ECL, GSL, WL11 to WL1n, WL21 to WL2n and SSL are formed in a region from which the plurality of first sacrificial films 310 and the plurality of second sacrificial films 312 are removed. For example, the first sacrificial film 310 may be replaced with the first gate electrodes ECL, GSL and WL11 to WL1n, and the second sacrificial film 312 may be replaced with the second gate electrodes WL21 to WL2n and SSL. The gate electrodes ECL, GSL, WL11 to WL1n, WL21 to WL2n and SSL may each include, for example, a metal, a metal nitride, doped polycrystalline silicon (Si), a metal silicide, or a combination thereof.

In an exemplary embodiment of the present invention, impurities contained in the first impurity pattern 120 may be diffused into the first semiconductor pattern 130. For example, as shown in FIG. 26A, the third surface 120C3 of the first impurity pattern 120 may rise to the first surface 120C1 of the first impurity pattern 120. Alternatively, as shown in FIG. 26B, the fourth surface 120C4 of the first impurity pattern 120 may rise to the second surface 120C2 of the first impurity pattern 120.

In an exemplary embodiment of the present invention, the tube 124 of the first impurity pattern 120 may be formed by conversion of the first semiconductor pattern 130 adjacent to the first impurity pattern 120.

The diffusion of the impurities contained in the first impurity pattern 120 may be performed by, for example, but is not limited to, an annealing process.

Figure 27:
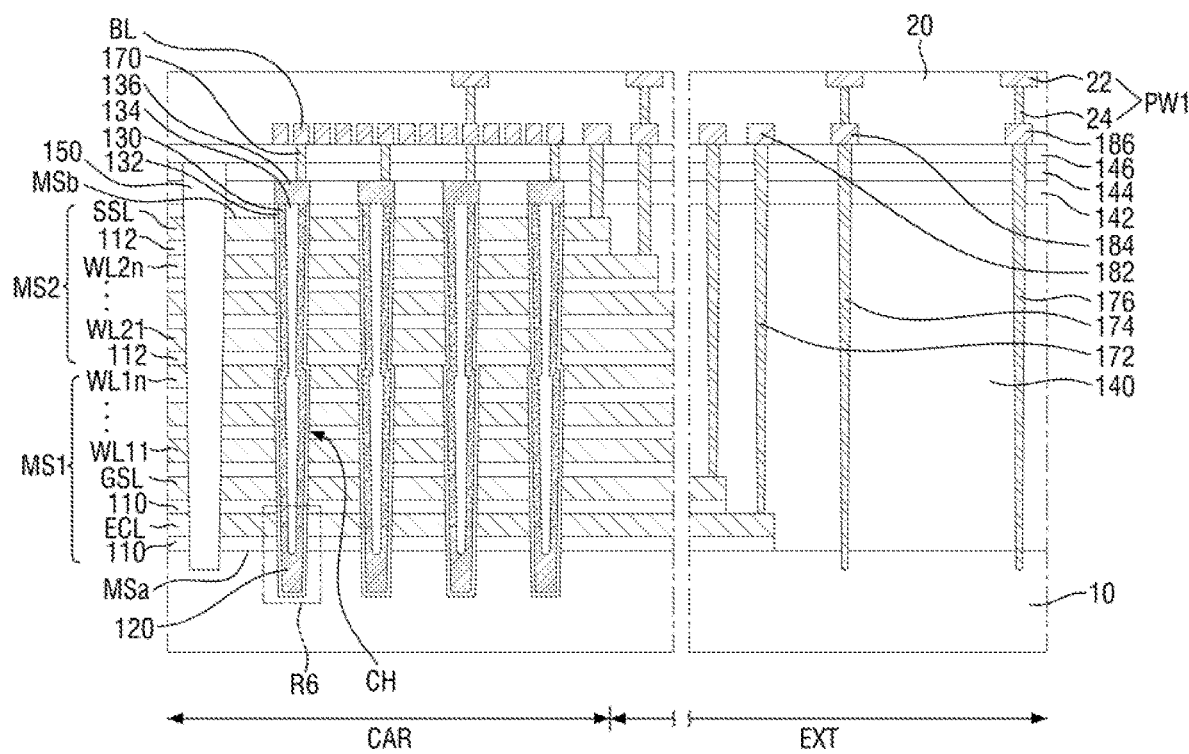

Referring to FIG. 27, the bit line BL and the first wiring structure PW1 are formed on the second surface MSb of the mold structures MS1 and MS2.

The bit lines BL may be formed on the fourth interlayer insulation film 146 that covers the third interlayer insulation film 144. In an exemplary embodiment of the present invention, the bit line BL may be connected to each of the plurality of first semiconductor patterns 130 through the first bit line contact 170.

In an exemplary embodiment of the present invention, a gate contact 172 and a third wiring 182 connected to the respective gate electrodes ECL, GSL, WL11 to WL1n, WL21 to WL2n and SSL may be formed in the extension region EXT. In addition, a source contact 174 and a fourth wiring 184 connected to the first source structure 190 may be formed in the extension region EXT. Also, an input/output contact 176 and a fifth wiring 186 connected to the input/output pad 195 may be formed in the extension region EXT.

Subsequently, a first wiring structure PW1 connected to the bit line BL, the third wiring 182, the fourth wiring 184 and the fifth wiring 186 may be formed. For example, a second inter-wiring insulation film 20 that covers the bit line BL, the third wiring 182, the fourth wiring 184 and the fifth wiring 186 may be formed. The first wiring structure PW1 may include a first wiring 22 and a first via 24 which are formed in the second inter-wiring insulation film 20 and are electrically connected to the bit line BL, the third wiring 182, the fourth wiring 184 and the fifth wiring 186.

Figure 28:
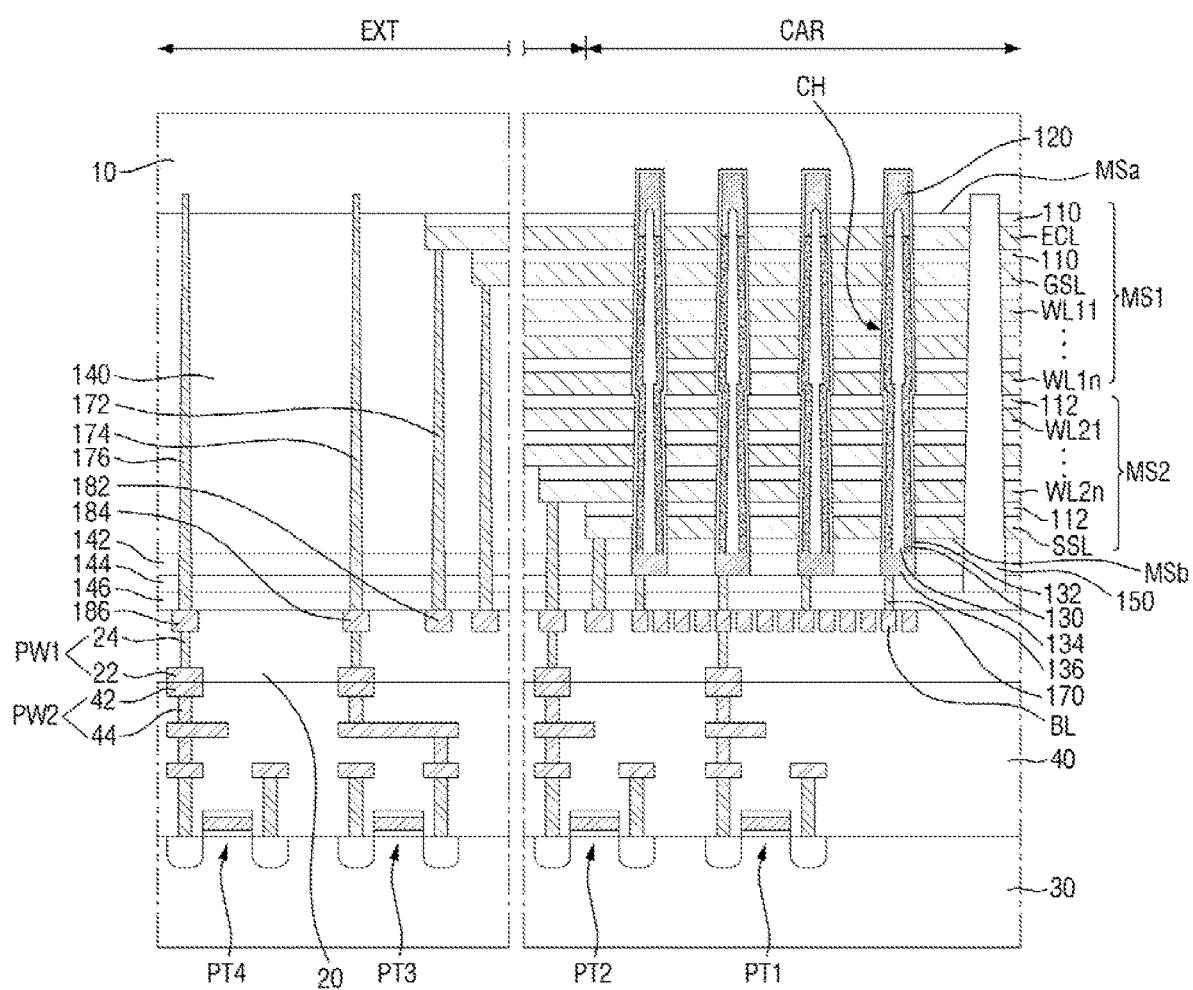

Referring to FIG. 28, the second inter-wiring insulation film 20 is attached onto the third inter-wiring insulation film 40.

For example, a second substrate 30 may be provided. The second substrate 30 may be provided to face the second surface MSb of the mold structures MS1 and MS2.

In an exemplary embodiment of the present invention, the first to fourth peripheral circuit elements PT1, PT2, PT3 and PT4 may be formed on the second substrate 30. The first to fourth peripheral circuit elements PT1, PT2, PT3 and PT4 may form peripheral circuits (e.g., a page buffer, a row decoder, control logic, etc.) that control the operation of each memory cell.

Next, the second wiring structure PW2 may be formed on the second substrate 30. For example, a third inter-wiring insulation film 40 that covers the first to fourth peripheral circuit elements PT1, PT2, PT3 and PT4 may be formed. The second wiring structure PW2 may include a second wiring 42 and a second via 44 that are formed in the third inter-wiring insulation film 40 and are electrically connected to the first to fourth peripheral circuit elements PT1, PT2, PT3 and PT4.

Subsequently, the first wiring 22 may be provided on the second wiring 42, the second inter-wiring insulation film 20 may be provided on the third inter-wiring insulation film 40, and then the second inter-wiring insulation film 20 and the third inter-wiring insulation film 40 may be attached. The first wiring structure PW1 and the second wiring structure PW2 may be electrically connected to each other. For example, the first wiring 22 exposed from the second inter-wiring insulation film 20 may be in contact with the second wiring 42 exposed from the third inter-wiring insulation film 40. The first wiring 22 and the second wiring 42 may be electrically connected to each other by, for example, but is not limited to, a copper-copper bonding (Cu to Cu bonding) process.

Figure 29:
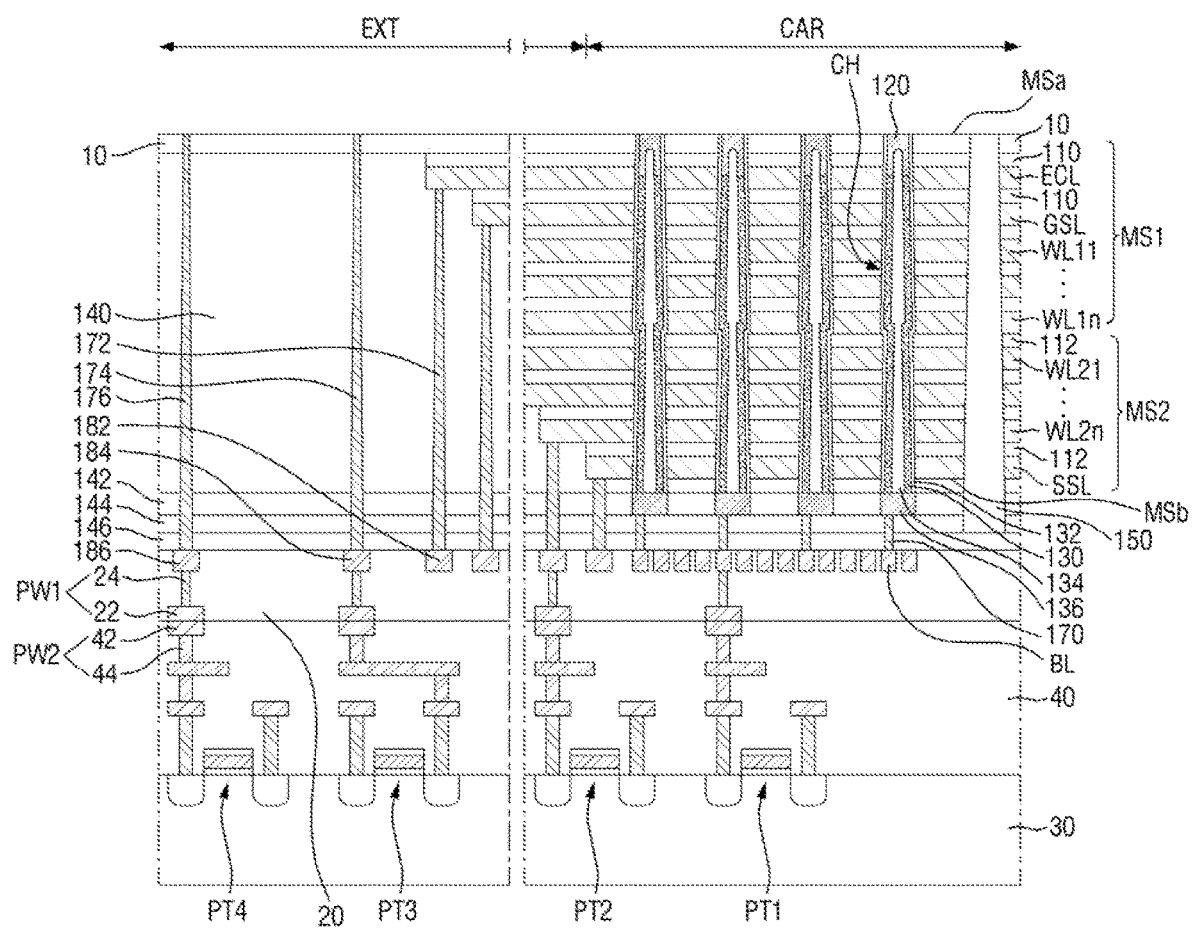

Referring to FIG. 29, at least a part of the first substrate 10 is removed to expose the first impurity pattern 120.

The removal of at least a part of the first substrate 10 may be performed by, for example, a planarization process. The planarization process may include, for example, but is not limited to, a chemical mechanical polishing (CMP) process.

In an exemplary embodiment of the present invention, as the first impurity pattern 120 is exposed, the information storage film 132 may also be exposed.

Figure 30:
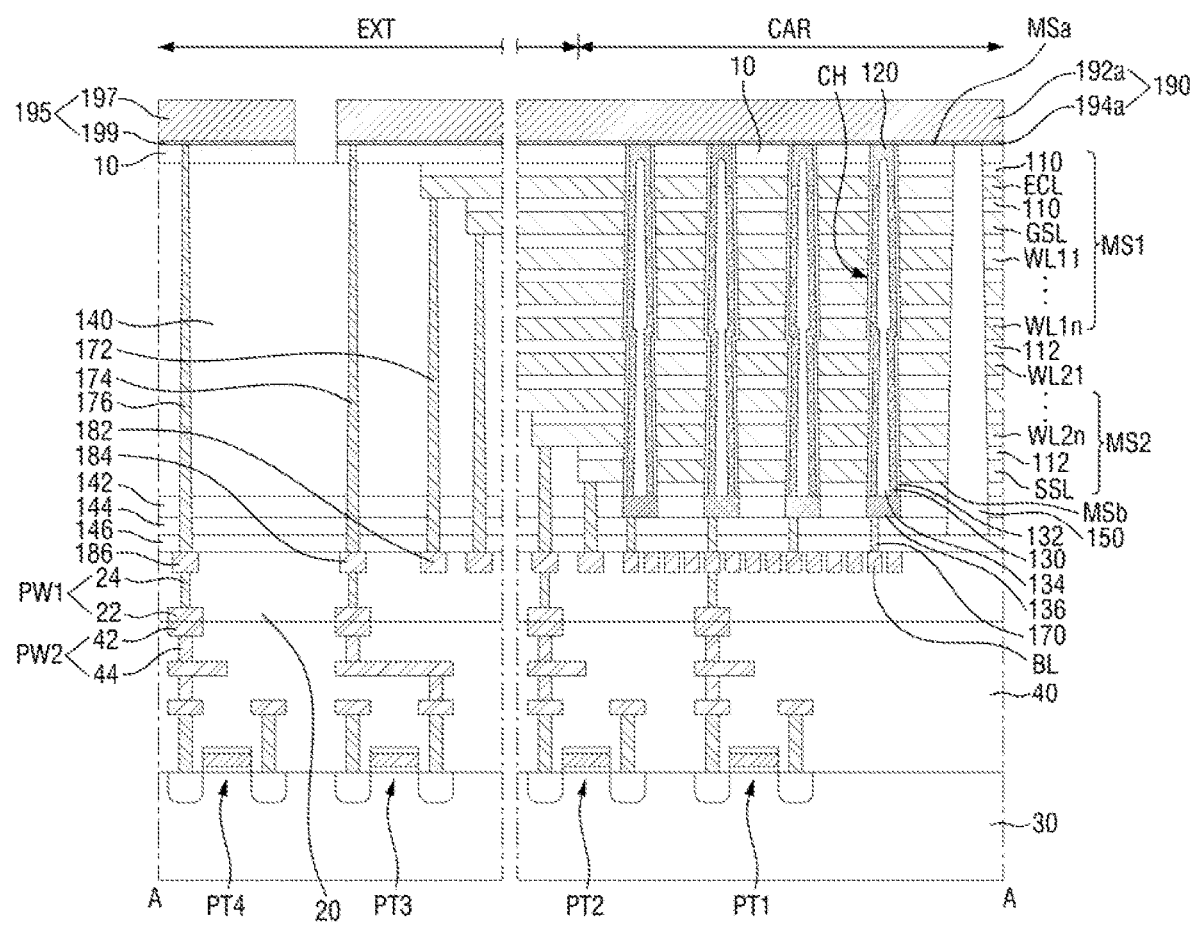

Referring to FIG. 30, a first source structure 190 is formed on the first surface MSa of the mold structures MS1 and MS2.

The first source structure 190 may be formed to be in contact with the exposed first impurity pattern 120. For example, the first source structure 190 may extend along the first substrate 10.

In an exemplary embodiment of the present invention, the first source structure 190 may include a first barrier conductive film 194*a* and a first conductive plate 192*a*. The first barrier conductive film 194*a* may be formed, for example, on the first substrate 10 and be in contact with the first impurity pattern 120. The first conductive plate 192*a* may be formed on the first barrier conductive film 194*a*.

In an exemplary embodiment of the present invention, the first barrier conductive film 194*a* may include titanium nitride (TiN), and the first conductive plate 192*a* may include tungsten (W) and/or aluminum (Al).

In an exemplary embodiment of the present invention, the first source structure 190 may be formed to be in contact with the source contact 174.

In an exemplary embodiment of the present invention, the input/output pad 195 may be formed on the first interlayer insulation film 140. For example, the first source structure 190 may extend along the first substrate 10. In an exemplary embodiment of the present invention, the input/output pad 195 and the first source structure 190 may be formed at the same level. For example, the input/output pad 195 may include a second barrier conductive film 199 including a material the same as that of the first barrier conductive film 194*a*, and a second conductive plate 197 including a material the same as that of the first conductive plate 192*a*.

In an exemplary embodiment of the present invention, the input/output pad 195 may be formed to be in contact with the input/output contact 176.

Subsequently, referring to FIG. 3, a first inter-wiring insulation film 50 and a passivation film 60 may be formed on the first surface MSa of the mold structures MS1 and MS2. In an exemplary embodiment of the present invention, the first inter-wiring insulation film 50 and the passivation film 60 may include an opening OP which exposes at least a part of the input/output pad 195.

The impurity pattern connected to the source structure may require a high-temperature (e.g., about 400° C. or higher) annealing process for activation of impurities (e.g., phosphorus (P), arsenic (As), etc.). However, the annealing process performed after the copper-copper bonding process has a problem that it may not be performed at high temperature due to the heat resistance of copper (Cu).

In the method for fabricating a nonvolatile memory device according to an exemplary embodiment of the present invention, the first semiconductor pattern 130 may be formed (e.g., the step described above with reference to FIG. 23) before the copper-copper bonding process (e.g., the step described above with reference to FIG. 28). Accordingly, the annealing process of the first semiconductor pattern 130 (e.g., the steps described above with reference to FIGS. 26A and 26B) may be performed before the copper-copper bonding process, and the impurities may be effectively activated to provide a nonvolatile memory device with the enhanced product reliability and performance.

To enhance the performance of the nonvolatile memory device, a MIC process or a MILC process of the semiconductor pattern may be performed (e.g., the step described above with reference to FIG. 23). However, the MIC process or the MILC process has a problem that a by-product (e.g., nickel silicide ($NiSi_2$)) remains in the lower part of the channel hole (e.g., the channel hole CH adjacent to the first substrate 10).

In the method for fabricating a nonvolatile memory device according to an exemplary embodiment of the present invention, by removing at least a part of the first substrate 10 (for example, the step described above with reference to FIG. 29), at least a part of the first impurity pattern 120 adjacent to the first substrate 10 may be removed. This may effectively remove the by-products of the MIC process or the MILC process, and it is possible to provide a nonvolatile memory device with enhanced product reliability and performance.

Figure 31:
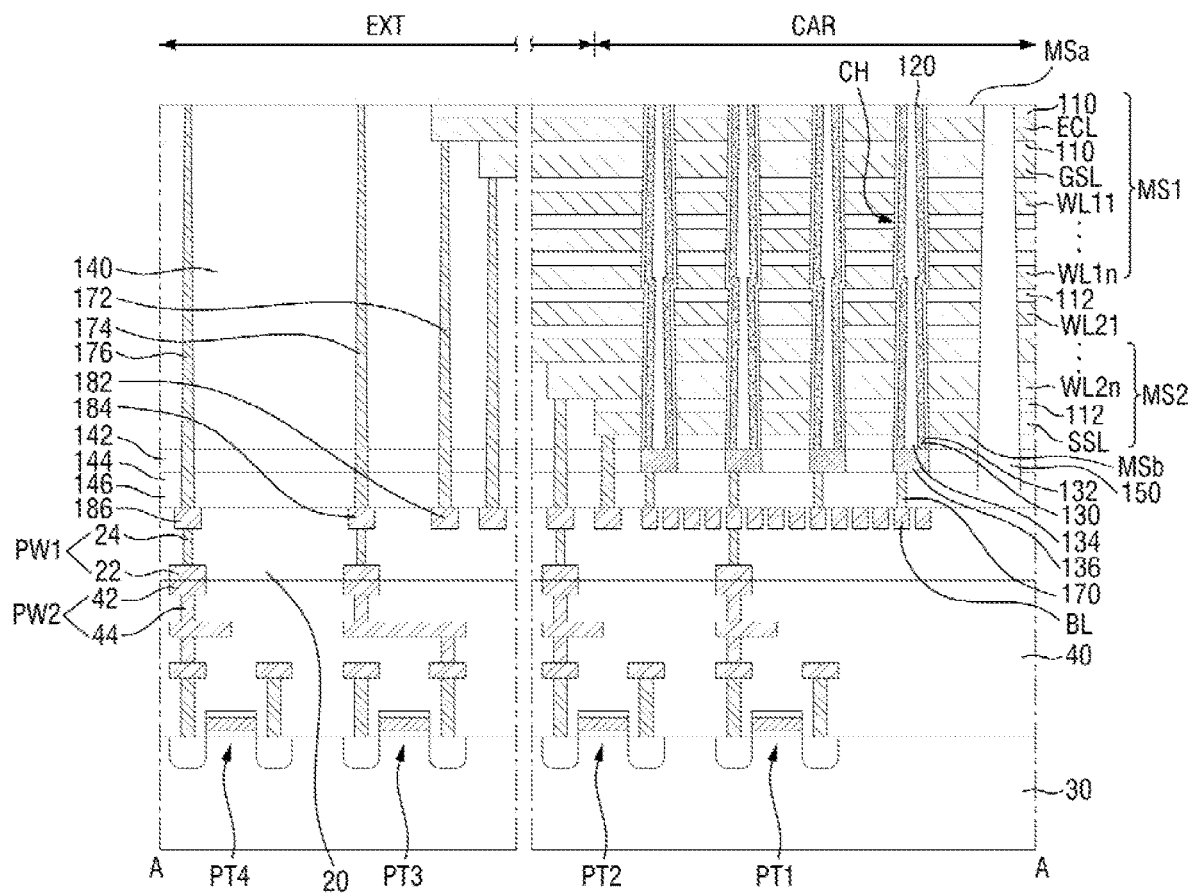
FIG. 31 is an intermediate stage diagram for explaining the method for fabricating a nonvolatile memory device according to an exemplary embodiment of the present invention.

FIG. 31 is an intermediate stage diagram for explaining the method for fabricating a nonvolatile memory device according to an exemplary embodiment of the present invention. For reference, FIG. 31 is a diagram for explaining steps after FIG. 28.

Referring to FIG. 31, the first substrate 10 is completely removed to expose the first impurity pattern 120.

The first substrate 10 may be removed until the first surface MSa of the mold structures MS1 and MS2 is exposed. Since the removal of the first substrate 10 is similar to that described above with reference to FIG. 29, detailed description thereof will not be provided below.

Subsequently, referring to FIG. 10, the first inter-wiring insulation film 50 and the passivation film 60 may be formed on the first surface MSa of the mold structures MS1 and MS2.

In concluding the detailed description, those skilled in the art will appreciate that many variations and modifications may be made to the exemplary embodiments without departing from the spirit and scope of the present invention as defined in the appended claims. Therefore, the disclosed exemplary embodiments of the present invention are used in a generic and descriptive sense only and not for purposes of limitation.

What is claimed is:

1. A nonvolatile memory device comprising:
a source structure including a conductive plate;
a barrier conductive film extending along a surface of the conductive plate;
a mold structure including a plurality of gate electrodes sequentially stacked on the barrier conductive film;
a channel hole penetrating the mold structure to expose the barrier conductive film;
an impurity pattern being in contact with the barrier conductive film, and formed in the channel hole; and
a semiconductor pattern formed in the channel hole, extending from the impurity pattern along a side surface of the channel hole, and intersecting the plurality of gate electrodes.

2. The nonvolatile memory device of claim 1, further comprising:
an information storage film extending along the side surface of the channel hole, interposed between the mold structure and the impurity pattern, and interposed between the mold structure and the semiconductor pattern.

3. The nonvolatile memory device of claim 2, wherein the impurity pattern extends along a part of a side surface of the information storage film, and
the semiconductor pattern extends along another part of the side surface of the information storage film.

4. The nonvolatile memory device of claim 2, wherein the information storage film is in contact with the barrier conductive film.

5. The nonvolatile memory device of claim 2, wherein the information storage film includes a tunnel insulation film, a charge storage film, and a blocking insulation film which are sequentially stacked on the impurity pattern and the semiconductor pattern.

6. The nonvolatile memory device of claim 1, wherein an impurity concentration of the impurity pattern increases as the impurity pattern goes away from the semiconductor pattern.

7. The nonvolatile memory device of claim 1, wherein the impurity pattern includes n-type impurities.

8. The nonvolatile memory device of claim 1, wherein the impurity pattern includes:
a filling part which covers the barrier conductive film exposed by the channel hole; and
a tube protruding from the filling part toward the semiconductor pattern.

9. The nonvolatile memory device of claim 8, wherein a thickness of the tube of the impurity pattern is the same as a thickness of the semiconductor pattern.

10. The nonvolatile memory device of claim 1, further comprising:
a filling insulation pattern, which penetrates the impurity pattern and is in contact with the barrier conductive film, formed in the channel hole.

11. The nonvolatile memory device of claim 10, wherein a thickness of the impurity pattern is the same as a thickness of the semiconductor pattern.

12. The nonvolatile memory device of claim 1, wherein the plurality of gate electrodes includes an erasing control line adjacent to the barrier conductive film, and
an interface between the impurity pattern and the semiconductor pattern overlaps the erasing control line.

13. The nonvolatile memory device of claim 1, wherein the conductive plate includes tungsten (W), aluminum (Al), or a combination thereof, and
the barrier conductive film includes titanium nitride (TiN).

14. The nonvolatile memory device of claim 1, wherein a thickness of the conductive plate is in a range from about 500 Å to about 3000 Å.

15. A nonvolatile memory device comprising:
a mold structure including a first surface and a second surface opposite to each other, the mold structure including a plurality of mold insulation films and a plurality of gate electrodes alternately stacked from the first surface toward the second surface;
a first conductive plate extending along the first surface of the mold structure, and formed on the first surface of the mold structure;
a first barrier conductive film extending along the first surface of the mold structure, and interposed between the mold structure and the first conductive plate;
a channel hole extending from the second surface toward the first surface and penetrating the mold structure;
a first impurity pattern being in contact with the first barrier conductive film, and formed in the channel hole;
a semiconductor pattern extending from the first impurity pattern toward the second surface of the mold structure, and formed in the channel hole; and
a bit line connected to the semiconductor pattern, and formed on the second surface of the mold structure.

16. The nonvolatile memory device of claim 15, wherein a width of the channel hole decreases from the second surface toward the first surface.

17. The nonvolatile memory device of claim 15, further comprising:
a second conductive plate which extends along the first surface of the mold structure, is interposed between the first conductive plate and the first barrier conductive film, and includes a material different from that of the first conductive plate.

18. The nonvolatile memory device of claim 17, further comprising:
a second barrier conductive film extending along the first surface of the mold structure, and interposed between the first conductive plate and the second conductive plate.

19. The nonvolatile memory device of claim 17, further comprising:
a slit which exposes the second conductive plate, and is formed in the first conductive plate.

20. The nonvolatile memory device of claim 19, wherein the first conductive plate includes aluminum (Al), and the second conductive plate includes tungsten (W).

21. The nonvolatile memory device of claim 15, further comprising:
a substrate extending along the first surface of the mold structure, and interposed between the first barrier conductive film and the mold structure,
wherein the first impurity pattern penetrates the substrate, and is in contact with the first barrier conductive film.

22. The nonvolatile memory device of claim 15, wherein the first surface of the mold structure is in contact with the first barrier conductive film.

23. The nonvolatile memory device of claim 15, further comprising:
a second impurity pattern which connects the semiconductor pattern and the bit line, and is formed on the second surface of the mold structure.

24. A nonvolatile memory device comprising:
a mold structure including a first surface and a second surface opposite to each other, the mold structure including a plurality of gate electrodes stacked sequentially from the first surface toward the second surface;
a source structure extending along the first surface of the mold structure, and formed on the first surface of the mold structure;
a channel hole extending from the second surface toward the first surface, and penetrating the mold structure;
an impurity pattern connected to the source structure, and formed in the channel hole;
a semiconductor pattern extending from the impurity pattern toward the second surface of the mold structure, and formed in the channel hole;
a bit line connected to the semiconductor pattern, and formed on the second surface of the mold structure;
a first inter-wiring insulation film which covers the bit line, and is formed on the second surface of the mold structure;
a substrate facing the second surface of the mold structure;
a peripheral circuit element formed on the substrate; and
a second inter-wiring insulation film which covers the peripheral circuit element, and is interposed between the substrate and the first inter-wiring insulation film.

25. The nonvolatile memory device of claim 24, wherein the source structure includes:
a conductive plate extending along the first surface of the mold structure, and formed on the first surface of the mold structure; and
a barrier conductive film extending along the first surface of the mold structure, and
interposed between the mold structure and the conductive plate.

26. The nonvolatile memory device of claim 24, further comprising:
a word line cutting region which extends from the second surface toward the first surface, and cuts the mold structure,
wherein the word line cutting region extends in a first direction, and
the bit line extends in a second direction intersecting the first direction.

* * * * *